United States Patent [19]

Yamakawa

[11] Patent Number: 5,017,817
[45] Date of Patent: May 21, 1991

[54] BASIC CIRCUITRY PARTICULARLY FOR CONSTRUCTION OF MULTIVALUED LOGIC SYSTEMS

[75] Inventor: Takeshi Yamakawa, Kumamoto, Japan

[73] Assignee: Omron Tateisi Electronics Co., Kyoto, Japan

[21] Appl. No.: 297,034

[22] Filed: Jan. 13, 1989

Related U.S. Application Data

[62] Division of Ser. No. 821,289, Jan. 22, 1986, Pat. No. 4,814,644.

[30] Foreign Application Priority Data

Jan. 29, 1985 [JP] Japan .............................. 60-15987
Jan. 30, 1985 [JP] Japan .............................. 60-16897
Jan. 31, 1985 [JP] Japan .............................. 60-17988
Jan. 31, 1985 [JP] Japan .............................. 60-17989

[51] Int. Cl.$^5$ ............... H03K 17/687; H03K 5/22; H03K 3/01
[52] U.S. Cl. .................................. 307/571; 307/584; 307/355; 307/270; 364/715.01
[58] Field of Search ............... 307/571, 575, 577, 583, 307/584, 355, 356, 360, 362, 364, 473, 270; 364/715.01

[56] References Cited

U.S. PATENT DOCUMENTS

| | | | |
|---|---|---|---|
| 4,204,131 | 5/1980 | Dozier | 307/585 |
| 4,682,061 | 7/1987 | Donovan | 307/571 |
| 4,814,644 | 3/1989 | Yamakawa | 307/571 |

*Primary Examiner*—Stanley D. Miller
*Assistant Examiner*—Trong Quang Phan
*Attorney, Agent, or Firm*—Dickstein, Shapiro and Morin

[57] ABSTRACT

Disclosed are basic circuits operable in a current mode in multivalued logic circuit systems, analog circuit systems and the like. Examples of the basic circuits are a successor, quantizer, adder, subtractor, divider, multiplier, decoder, literal circuit, equivalence circuit, bilateral T-gate, complement literal circuit and h operator circuit. These basic circuits are realized by using floating threshold switching circuits, floating window switching circuits, threshold SPDT switching circuits, and the like.

2 Claims, 32 Drawing Sheets

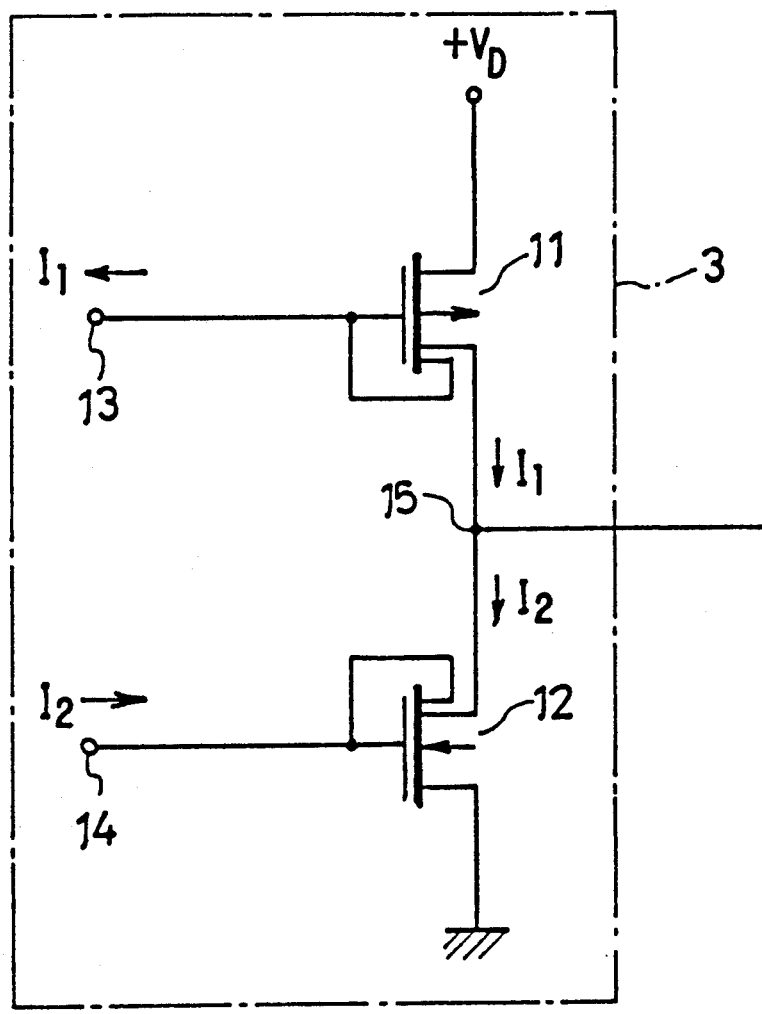
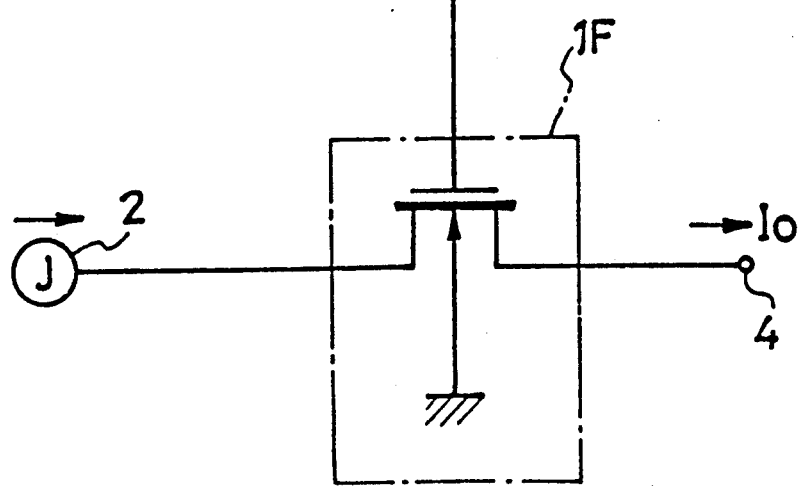
FIG. 3

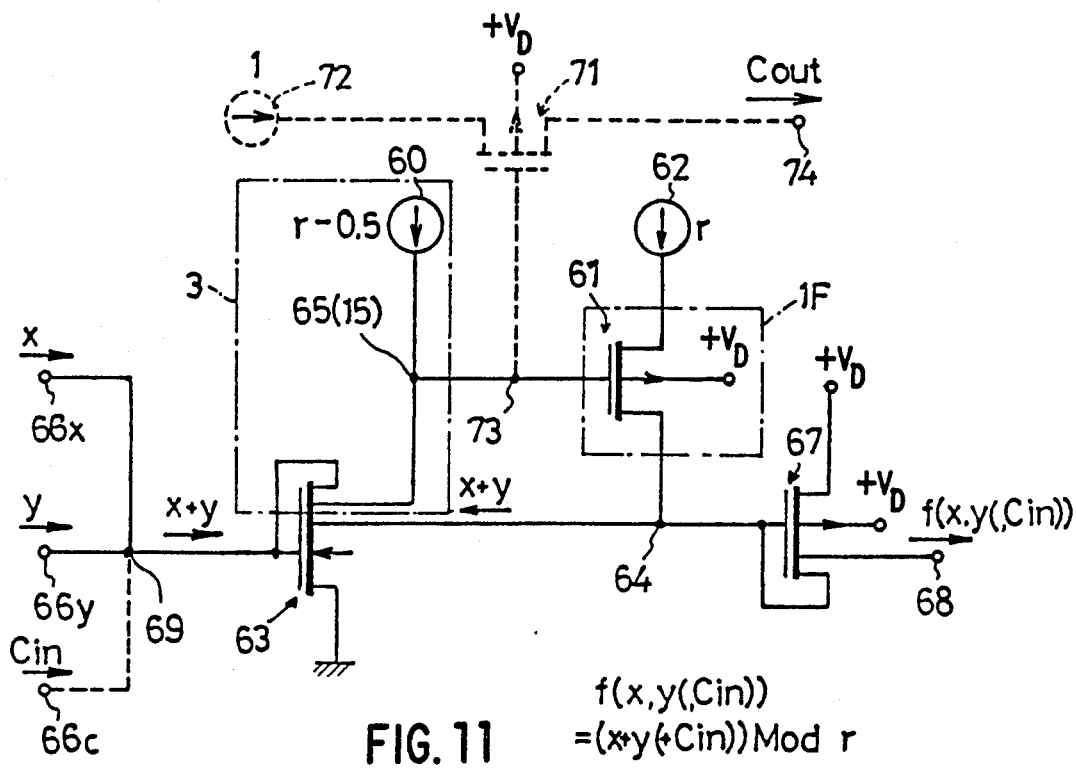
FIG. 11   $f(x,y(,Cin)) = (x+y(+Cin)) \text{Mod } r$
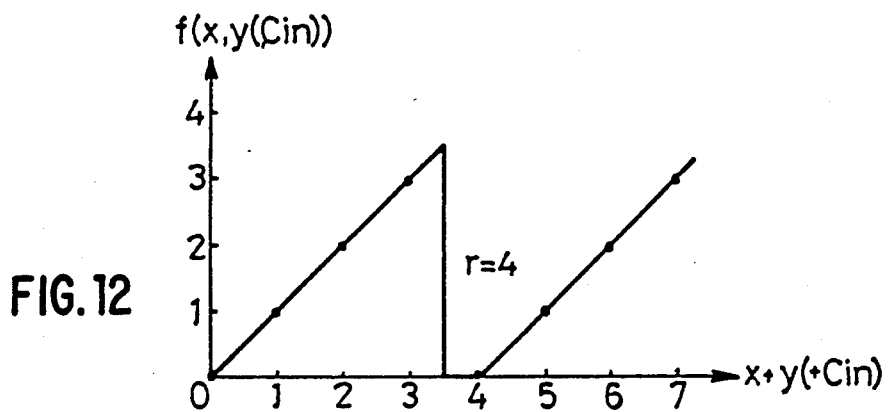
FIG. 12
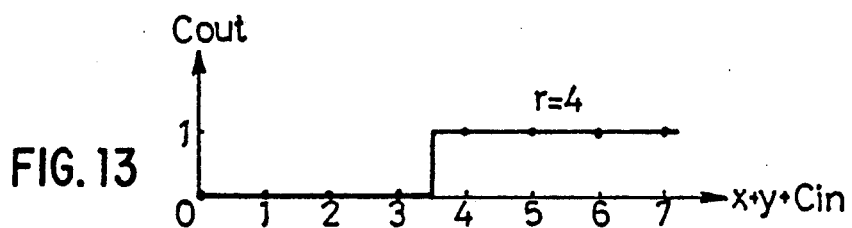
FIG. 13

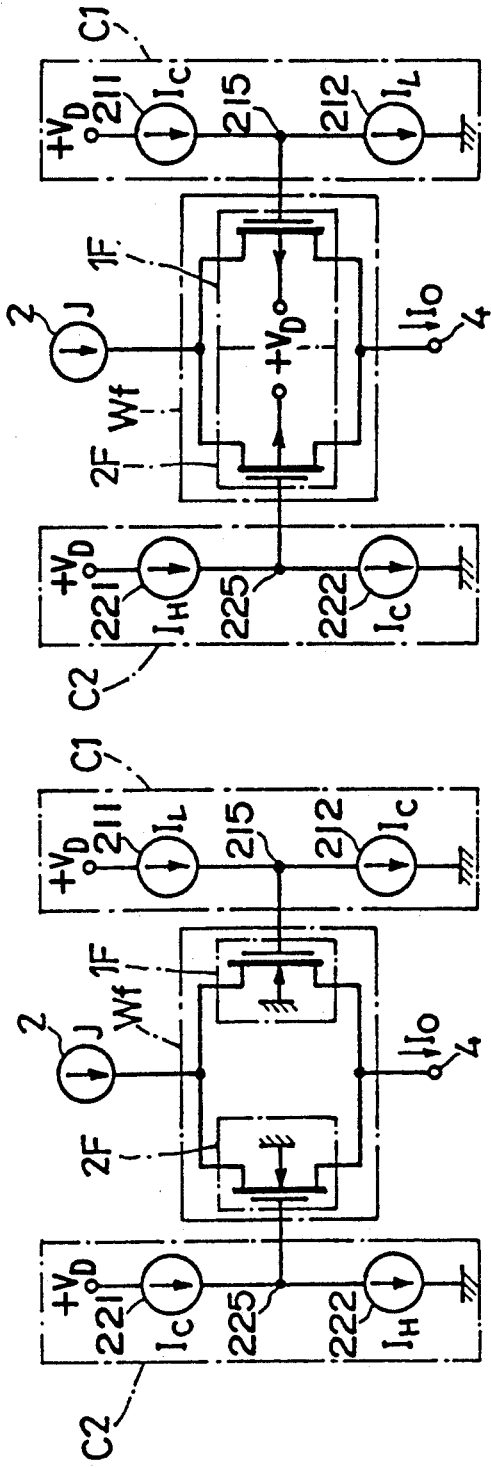
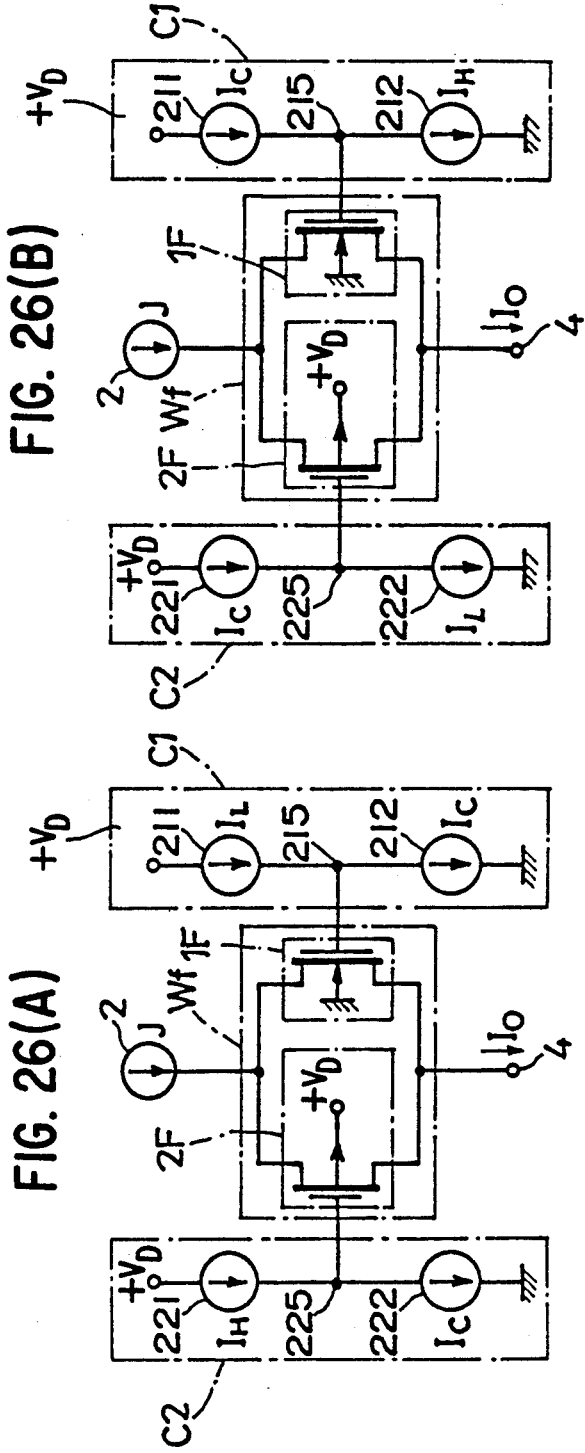
FIG. 26(A)  FIG. 26(B)  FIG. 26(C)  FIG. 26(D)

r=4
k=2

| S | b₃ | b₂ | b₁ |
|---|---|---|---|
| 7 | H | H | ⬜-2.0 H ⊙0.5 |
| 6 | H | H ⊙1.5 | L |
| 5 | H | ⬜-4.0 L | H ⊙0.5 |
| 4 | H ⊙3.5 | L | L |
| 3 | L | H | ⬜-2.0 H ⊙0.5 |
| 2 | L | H ⊙1.5 | L |
| 1 | L | L | H ⊙0.5 |
| 0 | L | L | L |

FIG. 45

BASIC CIRCUITRY PARTICULARLY FOR CONSTRUCTION OF MULTIVALUED LOGIC SYSTEMS

This is a division of application Ser. No. 821,289 filed Jan. 22, 1986, now U.S. Pat. No. 4,814,644 issued Mar. 21, 1989.

BACKGROUND OF THE INVENTION

1. Field of the Invention

This invention relates to basic circuits in a multivalued logic circuit system, analog circuit system or the like, examples being subtracting circuits, adding circuits, literal circuits and T gates. The invention further relates to switching circuits for constructing these basic circuits, such as, for example, floating threshold switching circuits, floating window switching circuits and threshold SPDT switching circuits.

2. Description of the Prior Art

Extensive research in the field of multivalued logic and associated arithmetic circuits is underway with the aim of compensating for or overcoming the several limitations of two-valued (binary) logic, which is the foundation of many digital circuit systems, the foremost of which is the computer. Whereas two-valued logic deals with the two values 0 and 1 and the signals employed by a two-valued logic circuit system have two levels corresponding to these two values, multivalued logic deals with three or more values and the signals used by a multivalued logic circuit system have three or more levels.

Multivalued logic (and a multivalued logic circuit system) has the following advantages over two-valued logic (and a two-valued logic circuit system):

1) It is possible to describe an indeterminate state between 0 and 1 (as by employing three values).

2) The wiring area on an IC substrate and the number of pins can be reduced to enable a higher degree of effective integration. In the case of 64 values, for instance, one sixth the wiring area of a two-valued logic circuit is sufficient.

3) The realization of a ten-valued (decimal) machine would make it possible to employ logic the same as that used by human beings, so that the encoders and decoders required by two-valued machines would be unnecessary.

The conventional circuit systems can be broken down into two categories from the viewpoint of the circuit modes used by an information processing system, rather than from the viewpoint of whether two or multiple values are employed. The first of these two categories is a voltage mode circuit system, in which information is expressed by the magnitude and polarity of signal voltage. Almost all of the conventional two-valued digital circuits make use of the voltage mode and several voltage-mode multivalued logic circuits have been reported. The other category of circuit system is a current mode circuit system, in which information is expressed by the magnitude and direction of signal current. For example, an I$^2$L circuit belongs to the current mode circuit category and possesses the advantages of a low supply voltage, a small delay-power product and suitability for VLSI owing to the feasibility of high-density integration. The application of I$^2$L circuits to multi-valued logic systems has been reported. For example, see "Threshold I$^2$L and its Application of Binary Symmetric Functions and Multivalued Logic" by T. Tich Dao in the *IEEE Journal of Solid-State Circuits*, vol. SC-12, No. 5, pp. 463–472 (October, 1977) and "Multi-valued Integrated Injection Logic" by T. Tich Dao, Edward J. MacCluskey and Lewis K. Russell in *IEEE Transactions on Computers*, vol. C-26, No,. 12, pp. 1233–1241 (December, 1977).

However, since an I$^2$L circuit is constituted by bipolar transistors, the appearance of an error in the multi-output current mirror used in this circuit is unavoidable. The error becomes quite conspicuous particularly at saturation of one or more collectors of the multi-output current mirror. Accordingly, even though there may no problem when an I$^2$L circuit is applied to a two-valued logic circuit system, great difficulties are encountered when an I$^2$L circuit is employed in a multivalued logic circuit system of ten or more values. Further, the switching circuits used in the I$^2$L circuits reported so far are grounded switches. The disadvantage here is that diodes for preventing a reverse current are required when circuits which include the grounded switches, and which consume electric power regardless of whether the switches are on or off, are connected in parallel.

SUMMARY OF THE INVENTION

An object of the present invention is to provide various circuits which serve as the basic building blocks of a multivalued logic circuit system or analog circuit system and which, even when used for a multivalued logic circuit system, eliminate the occurrence of errors to make feasible a multivalued logic circuit system of ten or more values, and which overcome the disadvantages of the grounded switches by making use of floating switches.

The present invention begins with the provision of a floating threshold switching circuit. The floating threshold switching circuit comprises a current comparator constructed by serially connecting two non-linear current sources for generating respective currents that are to be compared, wherein the series circuit composed of these non-linear current sources is driven by a constant supply voltage, and a floating switch comprising a MOSFET the on/off action of which is controlled by the potential at a node of the two non-linear current sources of the current comparator.

The floating threshold switching circuit utilizes a signal of the voltage mode-type for controlling the floating switch, and a signal of the current-mode type switched by the floating switch. For this reason, the floating threshold switching circuit shall be referred to as a "hybrid mode circuit".

The floating switch is connected between a current source or the output side of a circuit of an earlier stage and an output terminal or the input side of a circuit of a latter stage and is used to turn the current flowing between these two points on and off. The two non-linear current sources are each composed of a current mirror comprising, e.g., a MOSFET.

As will be described in detail later, the floating threshold switching circuit according to the present invention serves as a basic constituent of a basic arithmetic circuit for multivalued logic, such as a successor, quantizer, adder, subtracter, divider, multiplier or decoder, and using this switching circuit makes it possible to realize many arithmetic circuits. Since use is made of a MOSFET, errors are almost non-existent and even a multivalued logic circuit of ten or more values can be constructed with ease. The switching circuit of the present invention can also be applied to a circuit system for analog computations. Moreover, owing to the use of a floating switch, little power is consumed and diodes for preventing a reverse current in a parallel connection are unnecessary. These are some of the many advantages possessed by the present invention.

The present invention further provides a floating window switching circuit. The floating window switching circuit according to the present invention comprises a first current comparator constructed by serially connecting a non-linear current source for generating a control current and a non-linear current source for generating a current representing a first threshold value, wherein the series circuit composed of these non-linear current sources is driven by a constant supply voltage, a second current comparator constructed by serially connecting a non-linear current source for generating a control current and a non-linear current source for generating a current representing a second threshold value, wherein the series circuit composed of these non-linear current sources is driven by a constant supply voltage, a first floating switch comprising a MOSFET the on/off action of which is controlled by the potential at a node of the two non-linear current sources of the first current comparator, and a second floating switch comprising a MOSFET the on/off action of which is controlled by the potential at a node of the two non-linear current sources of the second current comparator.

A floating window-ON switching circuit is realized when the first and second floating switches are connected in series, and a floating window-OFF switching circuit is realized when the first and second floating switches are connected in parallel. The floating window switching circuits are used for constructing a literal circuit, equivalence circuit, bilateral T-gate, compliment literal circuit, h operator circuit and the like.

The present invention also provides a threshold SPDT switching circuit. The threshold SPDT switching circuit comprises a current comparator constructed by serially connecting a non-linear current source for generating a control current and a non-linear current source for generating a current representing a threshold value, wherein the series circuit composed of these non-linear current sources is driven by a constant supply voltage, two switches comprising respective C-MOSFETs the on/off action whereof is controlled by the potential at a node of the two non-linear current sources in the current comparator and which are switched to mutually opposing states, and a node alternately connected to a terminal of either of these two switches. The two switches construct a SPDT switch.

The present invention further provides exemplary applications of the SPDT switching circuit, a switched current mirror and exemplary applications of a switched current mirror.

These and other characterizing features of the present invention will become clear from a description of preferred embodiments with reference to the accompanying drawings.

BRIEF DESCRIPTION OF THE DRAWINGS

FIG. 1 illustrates two types of switch, in which

FIG. 3 is a view illustrating an embodiment of a floating threshold switching circuit;

FIG. 11 is a circuit diagram illustrating an embodiment of an adder circuit which includes a clockwise cycling circuit and a full adder;

FIGS. 12 and 13 are graphs illustrating input/output characteristics of these circuits;

FIGS. 26(A) through 26(D) are circuit diagrams showing window-OFF switches in various forms;

FIG. 45 is a view showing the principle of an eight-value/three-bit binary conversion;

DETAILED DESCRIPTION OF THE PREFERRED EMBODIMENTS

The embodiments of the present invention will be described in detail in accordance with the following Table of Contents:

TABLE OF CONTENTS (1) Grounded Switches and Floating Switches
(2) Floating Threshold Switching Circuits
(3) Successors
(4) Quantizer Circuits
(5) Adder Circuits
   (5.1) Clockwise Cycling Circuit
(6) Subtracter Circuits
   (6.1) Counter Cycling Circuit
   (6.2) Full Subtracter Circuit
(7) Divider Circuits
(8) Multiplier Circuits
(9) Floating Window Switching Circuits
   (9.1) Window-On Switching Circuits
   (9.2) Window-Off Switching Circuits
(10) Literal and Closed Interval Circuits
(11) Coincidence (Delta Literal J-function) Circuits and Delta Interval Circuits
(12) Bilateral T-gates
(13) Complement Literal Circuits
(14) h-operator Circuits
(15) Threshold SPDT Switching Circuits
(16) Decoders
(17) Multivalued Logic Circuits
   (17.1) $\overline{\text{MAX}}$ Circuit
   (17.2) $\overline{\text{MAX}}$ Circuit
   (17.3) $\overline{\text{MIN}}$ Circuit
   (17.4) MIN Circuit
(18) Examples of Decoder Applications to Multivalued Logic Multi-function Circuits
(19) Switched Current Mirrors
(20) Quantizer/Bilateral T-gate

(1) Grounded switches and floating switches

In circuit systems which operate in the current mode or voltage mode, the switches used by these circuit systems can be classified into two categories, namely grounded and floating, depending how they are connected. A grounded switch and a floating switch used in a current mode circuit system are illustrated FIGS. 1(A) and (B), respectively.

Figure 1A:
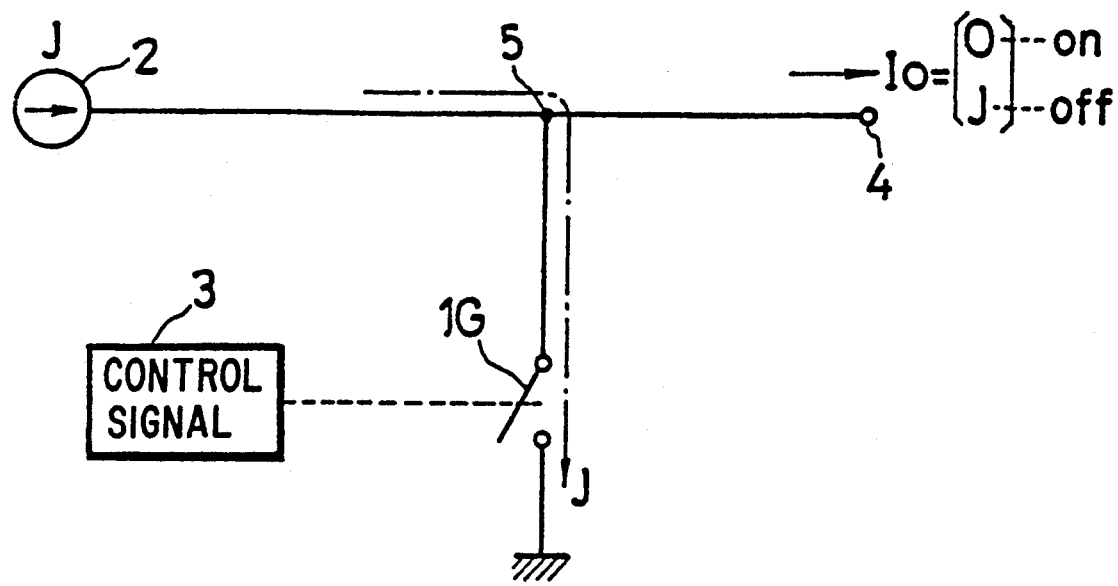
FIG. 1(A) is a view of a grounded switch and FIG. 1(B) is a view of a floating switch.

In FIG. 1(A), a line connecting a current source 2 supplying a current J and an output terminal 4 is provided with a node 5 at a point along its length. A switch 1G is connected between the node 5 and ground (or an output terminal of a power supply). This arrangement constitutes a grounded switch. The switch 1G is turned on and off by a control signal produced as an output by a control signal generating circuit 3. When the switch 1G is in the on (closed) state, the current J produced by the current source 2 flows to ground through the switch 1G, as indicated by the broken line. As a result, an output current $I_0$ at output terminal 4 is zero. When the switch 1G is in the off (open) state, the output current from the current source 2 appears intact at the output terminal 4, so that the output current $I_0$ is J.

Figure 1B:
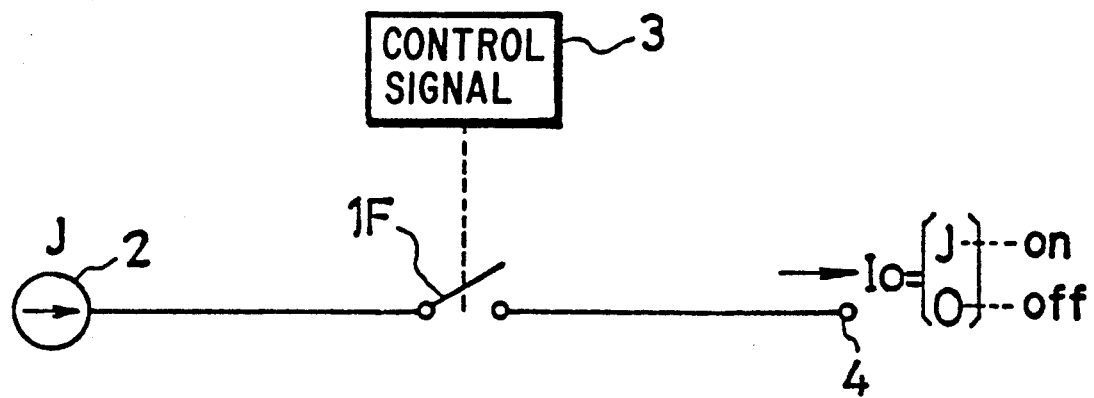

In FIG. 1(B), a switch 1F is connected between the current source 2 and the output terminal 4. Since the switch 1F floats free of ground, the switch is referred to as a floating switch. When the switch 1F is in the on state, the output J of current source 2 appears at the output terminal 4, so that the output current $I_0$ is J. When the switch 1F is in the off state, the output current of current source 2 is cut off by the switch 1F, as a result of which the output current $I_0$ is zero.

A circuit using such a grounded switch has two major disadvantages in comparison with a circuit employing a floating switch.

The first disadvantage is that a circuit including a grounded switch constantly consumes electric power regardless of whether the switch is in the on or off state. When the switch 1G in FIG. 1(A) is in the ON state, the current J flows to ground through the switch 1G; when off, the current J is delivered as the output current $I_0$. By contrast, when the switch 1F is on in a circuit including the floating switch of FIG. 1(B), the current J is delivered as the output current $I_0$ but, when the switch 1F is in the off state, the current has nowhere to flow and no power is consumed.

Figure 2:
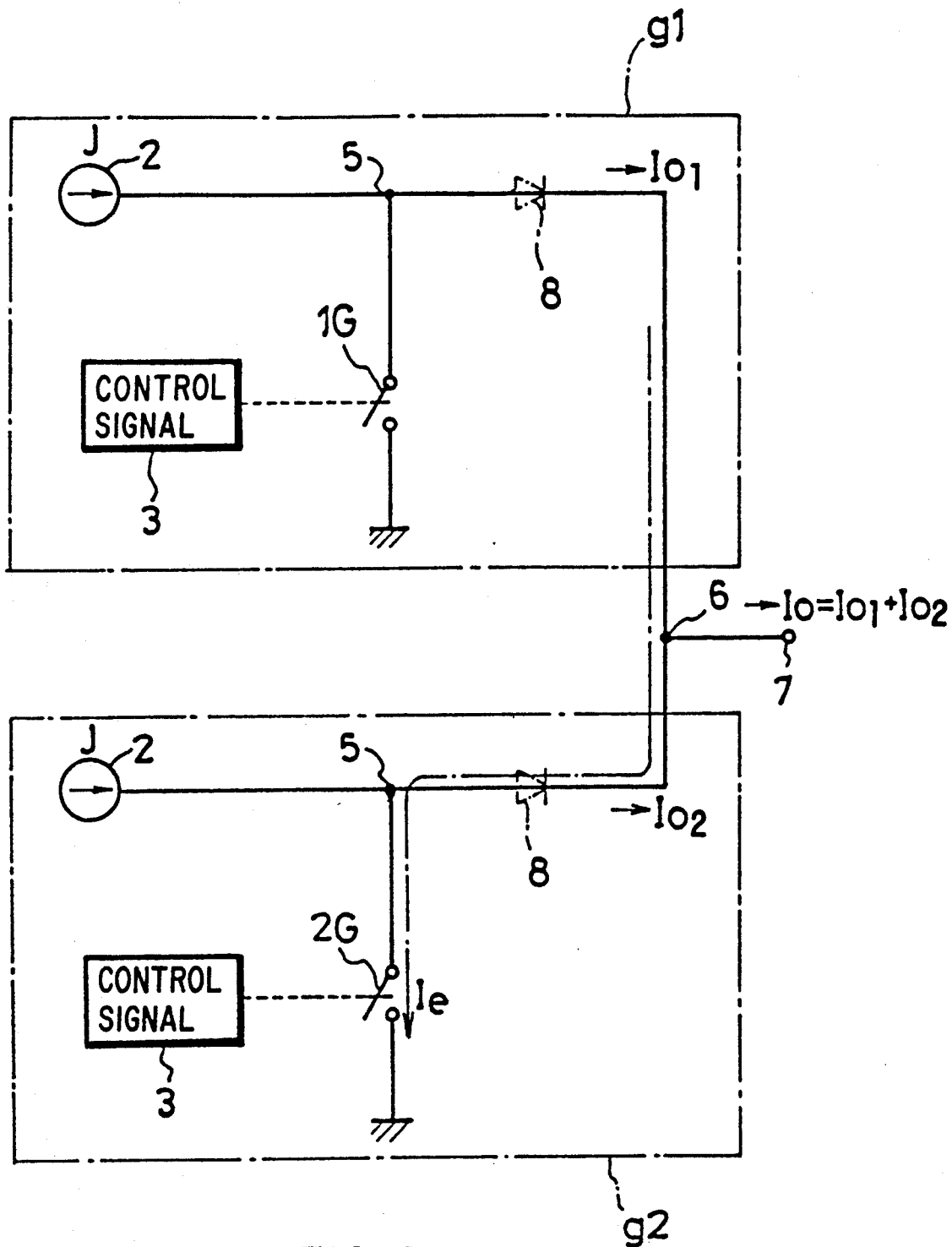
FIG. 2 is a view for describing a drawback of a grounded switch and illustrates a parallel connection between two circuits each including a grounded switch.

The other disadvantage of a circuit which includes the grounded switch manifests itself profoundly when such circuits are connected in parallel. In FIG. 2, two circuits designated $g_1$ and $g_2$ each having the same construction as that of the circuit shown in FIG. 1(A) are connected in parallel, their respective output terminals are connected at a node 6, and the node 6 is connected to an output terminal 7. The circuit $g_1$ is provided with the grounded switch 1G, and the other circuit $g_2$ is provided with a grounded switch 2G. Let us consider a state in which the switch 1G of circuit $g_1$ is off and the switch 2G of circuit $g_2$ is on. In such case the output current $I_{01}$ of circuit $g_1$ will be J and the output current $I_0$ of circuit $g_2$ will be zero. The output current $I_{01}$ of circuit $g_1$ does not flow from the node 6 to the output terminal 7. Instead, most of this current flows from node 6 to ground through the node 5 and the switch 2G, which is in the on state, as indicated by the broken line $I_e$. Accordingly, the output current $I_0$ exiting from the terminal 7 does not equal $I_{01}+I_{02}$. In order to establish the relation $I_0=I_{01}+I_{02}$, it is necessary to provide the output side of each of the circuits $g_1$, $g_2$ with a reverse current preventing diode, as illustrated by the broken lines 8.

In contrast to the foregoing, a parallel connection between circuits including a floating switch of the kind shown in FIG. 1(B) does not result in the above-described difficulty and a diode for preventing a reverse current need not be connected to the output sides.

Since a circuit including a floating switch has the aforementioned advantage over a circuit containing a grounded switch, floating switches are employed in circuits of a type to be described below.

A floating switch can be constituted by a bipolar transistor or MOS-type FET (field-effect transistor). Whereas a certain amount of power consumption is required to control the on/off action of a bipolar transistor, almost no power is required to control a MOSFET. From this point of view, a MOSFET excels as a floating switch. In the description that follows, floating switches comprising MOSFETs are in used in various circuits.

(2) Floating threshold switching circuits

FIG. 3 illustrates an embodiment of a floating threshold switching circuit. An N-channel MOS-type FET (N-MOSFET) is used as the floating switch 1F and has a drain connected to the current source 2, a source connected to the output terminal 4, and a substrate which is grounded. The control voltage produced by the control signal generating circuit 3 is applied to the gate of the MOSFET.

The control signal generating circuit 3 is a current comparator circuit constituted by a current mirror 11 comprising a P-channel MOS-type FET (P-MOSFET), and a current mirror 12 comprising an N-channel MOS-type FET (N-MOSFET). The current mirrors illustrated here are each equivalent to a current mirror comprising two MOSFETs and constructed by interconnecting the gates of these MOSFETs and connecting the gates to the drain of one of the MOSFETs, as will be described in detail in section 19 entitled "Switched Current Mirrors". Naturally, fabrication can be achieved by commonly connecting the source and gate to readily form the two MOSFETs on the same substrate by integration. When an out-flow current (a current in the direction of out-flow) $I_1$ is applied to the gate of the current mirror 11 by an input terminal 13, the current mirror acts so that a current $I_1$ of the same value flows out from the drain on the output side. When an in-flow current (a current in the direction of in-flow) $I_2$ is applied to the gate of the current mirror 12 by an input terminal 14, the current mirror acts so that a current $I_2$ of the same value flows into the drain on the output side.

The source of the current mirror 11 is connected to a positive power supply of $+V_D$, and the source of the current mirror 12 is connected to ground. The drains on the output sides of these two current mirrors are connected to each other by a node 15. The node 15 is connected to the gate of the MOSFET constituting the floating switch.

If the current $I_1$ is larger in magnitude than the current $I_2$, then the current mirror 11 turns on and the current mirror 12 generates the in-flow output current $I_2$. The potential at the node 15 therefore attains a high level (which is approximately equal to the supply voltage $+V_D$). Since this high-level voltage is applied to the gate of the N-MOSFET constituting the floating switch 1F, the MOSFET turns on. Accordingly, the current J from current source 2 flows out of the terminal 4 as the output current $I_0$.

Conversely, if the current $I_1$ is smaller than the current $I_2$, then the current mirror 12 turns on and the current mirror 12 generates the out-flow output current $I_1$. The potential at the node 15 therefore attains a low level (approximately zero). As a result, the MOSFET of the floating switch 1F is held in the off state and the output current $I_0$ is zero.

If the current $I_2$ is fixed at a constant value and the current $I_1$ is varied, the floating switch 1F will turn on and the output current $I_0$ will attain the value J at the moment the current $I_1$ exceeds the current I2. When the current $I_1$ becomes smaller than the current $I_2$, the floating switch 1F will turn off and the output current $I_0$ will become zero. The circuit shown in FIG. 3 converts the output current $I_0$ into a signal having the two levels J and 0 depending upon the value of the current $I_1$, with the current $I_2$ serving as a threshold value. The circuit of FIG. 3 also employs the floating switch. Accordingly, a circuit of this type shall be referred to as a "floating threshold switching circuit".

Note that if a case in considered in which the current $I_1$ is fixed at a constant value and the current $I_2$ is varied, then the current $I_1$ will serve as the threshold value.

The circuit shown in FIG. 3 possess significant features. Specifically, the signal for controlling the on/off action of the floating switch 1F is a "voltage" signal, namely a voltage mode signal, which is the potential at the node 15. On the other hand, the signal switched by the floating switch 1F (the signal that flows through the floating switch) is a "current" signal, namely a current mode signal. The circuit which thus acts in the combined voltage and current modes shall be referred to as a "hybrid mode circuit". A hybrid mode circuit of this type can possess the circuit which operates in the voltage mode as a control circuit, and it is also possible to connect the circuit which operates in the current mode as the controlled circuit or control circuit. The hybrid mode circuit therefore is extremely versatile and has a wide range of applicability.

In passing, note that the signals compared by the control signal generating circuit (current comparator circuit) are signals in the current mode. Accordingly, the circuit shown in FIG. 3 in effect performs a current-/voltage/current mode conversion.

FIG. 4 illustrates floating threshold switching circuits in model form.

Figure 4A:
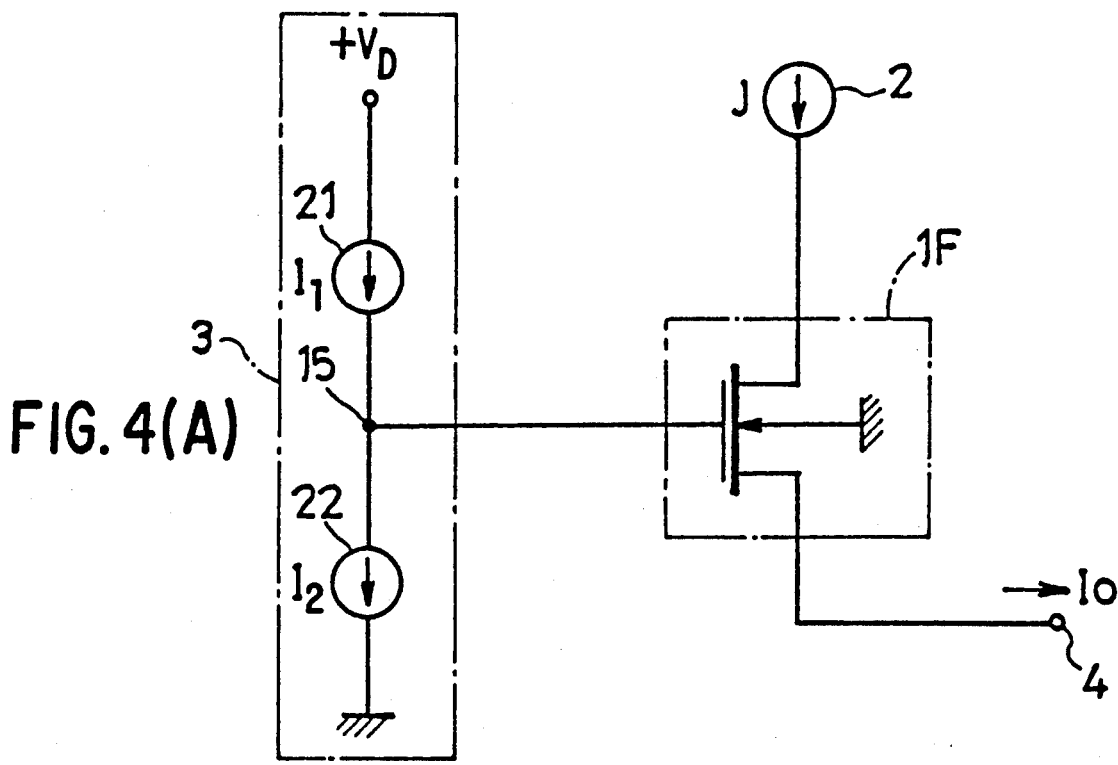
FIGS. 4(A), 4(B) are views showing two types of floating threshold switching circuit in model form.

In FIG. 4(A), the current mirror 11 and input terminal 13 of FIG. 3 are replaced by a current source 21, and the current mirror 12 and input terminal 14 of FIG. 3 are replaced by a current source 22. The current comparator 3 generally is characterized by a serial connection between two non-linear current sources and by being driven by a constant supply voltage.

Figure 4B:
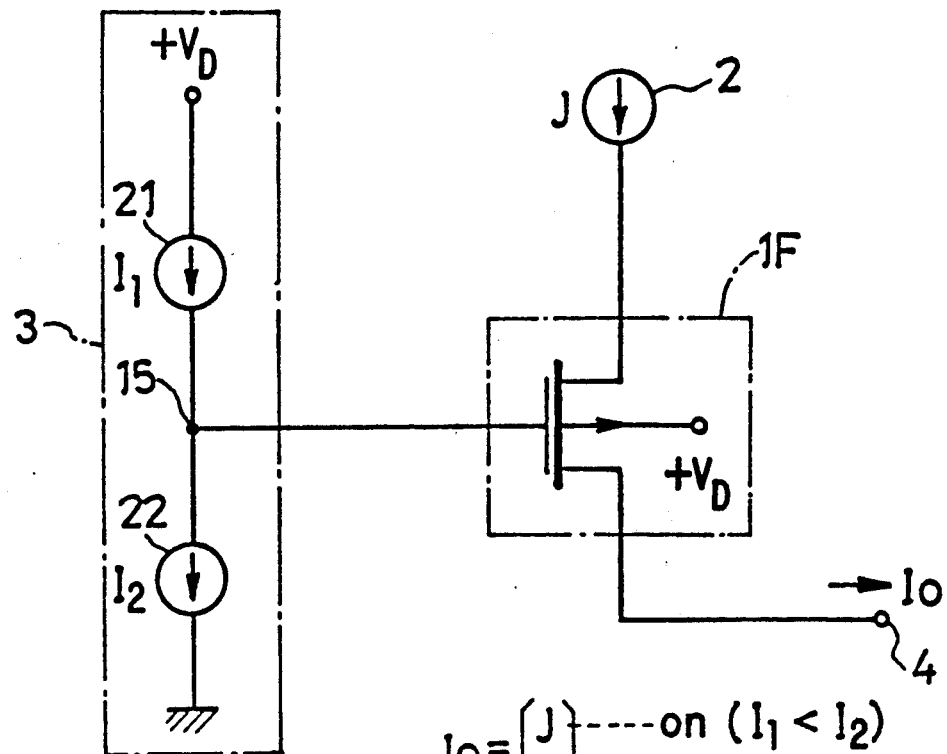

FIG. 4(B) illustrates a circuit in which a P-MOSFET is used as the floating switch 1F. This MOSFET has its source connected to the current source 2 and its drain connected to the output terminal 4. The substrate of the MOSFET is connected to the supply voltage $+V_D$. In the circuit of FIG. 4(B), the potential at the node 15 assumes the low level at $I_1<I_2$, at which time the MOSFET (floating switch 1F) turns on so that J is obtained as the output current $I_0$. When the potential at node 15 attains the high level at $I_1>I_2$, the MOSFET turns off and the output current $I_0$ becomes zero.

Let us now discuss several applications of floating threshold circuits.

(3) Successors

The operation of a successor in analog or multivalued logic of radix or base r is expressed by the following:

$$f(x) \equiv (x + 1) \, Mod \, r \qquad (1)$$

$$= \begin{cases} x + 1 & (x + 1 < r) \\ 0 & (x + 1 \geq r) \end{cases} \qquad (1\text{-}1)$$

$$= \begin{cases} x + 1 & (x + 1 < r - 0.5) \\ 0 & (x + 1 \geq r - 0.5) \end{cases} \qquad (1\text{-}2)$$

$$= \begin{cases} x + 1 & (x < r - 1.5) \\ 0 & (x \geq r - 1.5) \end{cases} \qquad (1\text{-}3)$$

In Eq. (1), Mod is a symbol representing modulo in modulo algebra. Further, (1-1) is a general expression commonly used in both analog operations and multivalued logic operations, (1-2) is an expression for a case where a noise margin of ±0.5 is taken into account in multivalued logic, and (1-3) is an expression obtained by transforming (1-2).

It will be understood from these expressions that a successor acts to produce an output obtained by adding 1 to an input (variable) x and to restore the output to 0 once the output has attained the radix r.

Figure 5:
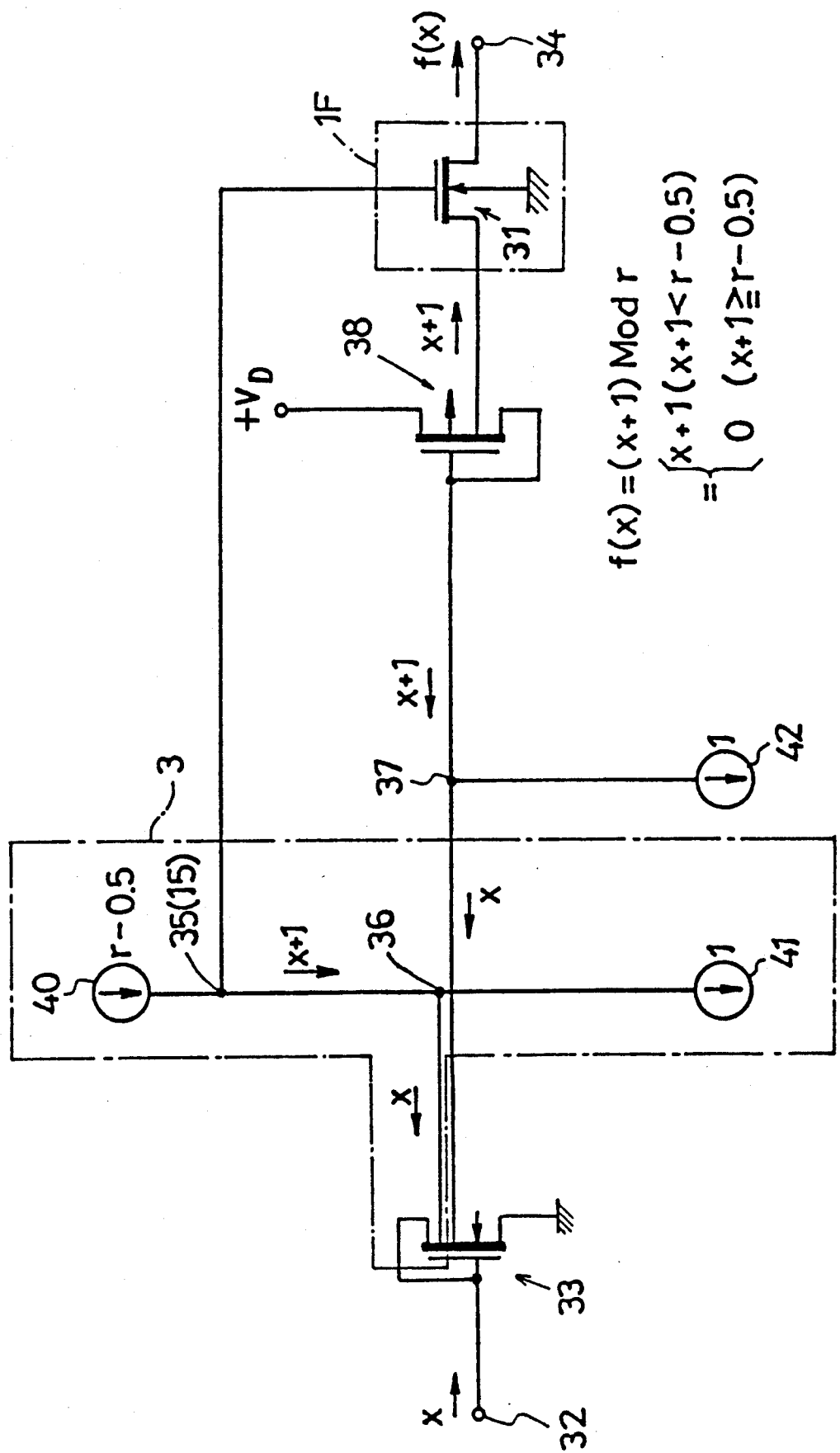
FIG. 5 is a circuit diagram illustrating an embodiment of a successor.

An embodiment of a successor in which the noise margin expressed by (1-2) is taken into account is illustrated in FIG. 5. The input x is applied to an input terminal 32 as an in-flow input current representing the value x. The input terminal 32 is connected to the gate of a two-output current mirror (or current distributor) 33. The two drains of the two-output current mirror 33 each produces an in-flow current of value x.

One output drain of the two-output current mirror 33 is connected to a node 36 between a current source 41, which provides an out-flow input current of value 1, and a current source 40, which provides an in-flow input current of value r−0.5. Provided between the node 36 and the current source 40 is another node 35 connected to the gate of a floating switch 31, which corresponds to the floating switch 1F of FIG. 3(A) or FIG. 4(A). A current of value x+1 flows from the node 35 toward the node 36. A portion of the two-output current mirror 33, the current sources 40, 41 and the nodes 35, 36 correspond to the aforementioned control signal generating circuit 3, and the node 35 corresponds to the node 15. Accordingly, when the relation (r−0.5)>(x+1) is established, the potential at the node 35 attains the high level and the floating switch 31 turns on; otherwise, the switch 31 is held in the off state.

The other output drain of the two-output current mirror 33 is connected to a current mirror 38, and a node 37 located between the current mirrors 33, 38 is connected to a current source 42 for applying an out-flow input current of value 1. Since the arithmetic operation x+1 is performed at the node 37, a current of value x+1 flows out of the current mirror 38 from its output side. The output side of current mirror 38 is connected to an output terminal 34 through the floating switch 31. Accordingly, when the floating switch 31 turns on [i.e., when (r−0.5)>(x+1) holds], an out-flow output current of value x+1 appears at the output terminal 34. When the switch 31 turns off [i.e., when (r−0.5)<(x+1) holds], the current becomes zero.

Figure 6:
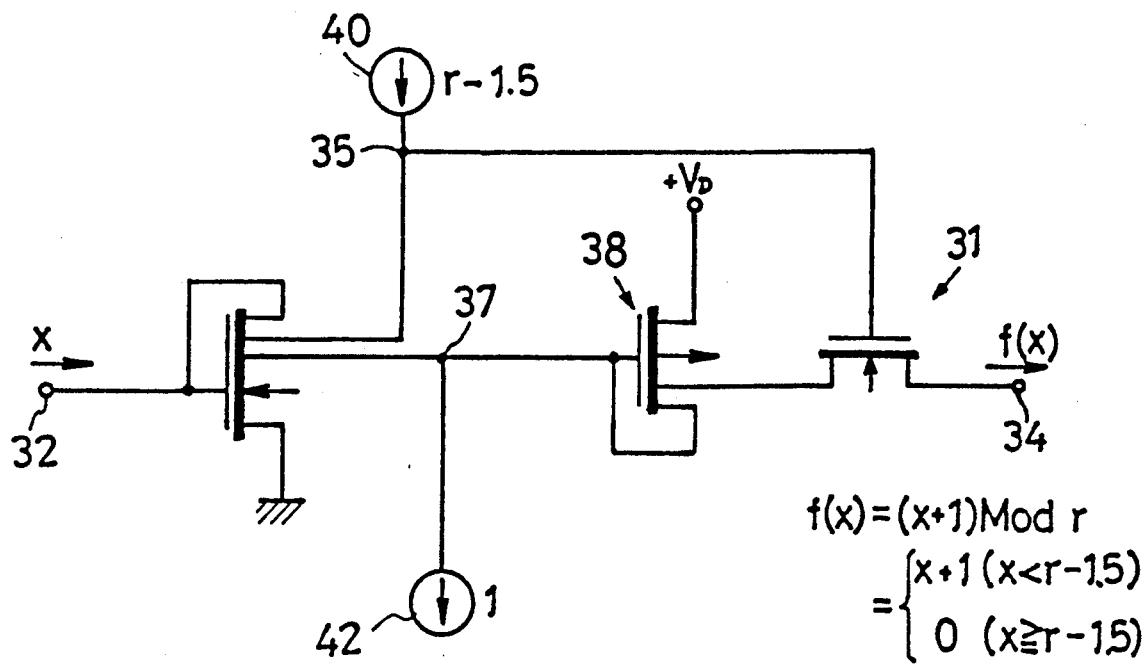
FIG. 6 is a circuit diagram illustrating a modification of a successor.

FIG. 6 illustrates a successor which performs the operation of expression (1-3). A comparison with the arrangement of FIG. 5 shows that the current source 41 is deleted and that the current source 40 applies an in-flow input current of value r−1.5. It will readily be appreciated that the circuit of FIG. 6 will operate in the same manner as that of FIG. 5.

If the value of the radix r which decides the value of the output current of a current source, particularly the output current of the current source 40, is treated as being variable, then it will be possible to apply the circuits of FIGS. 5 and 6 to multivalued logic of any radix. Further, if the output current value of the current source 40 in FIG. 5 is taken to be r and that of the current source 40 in FIG. 6 is taken to be r+1, then these circuits will constitute successors in which noise margin is not taken into account.

Figure 7:
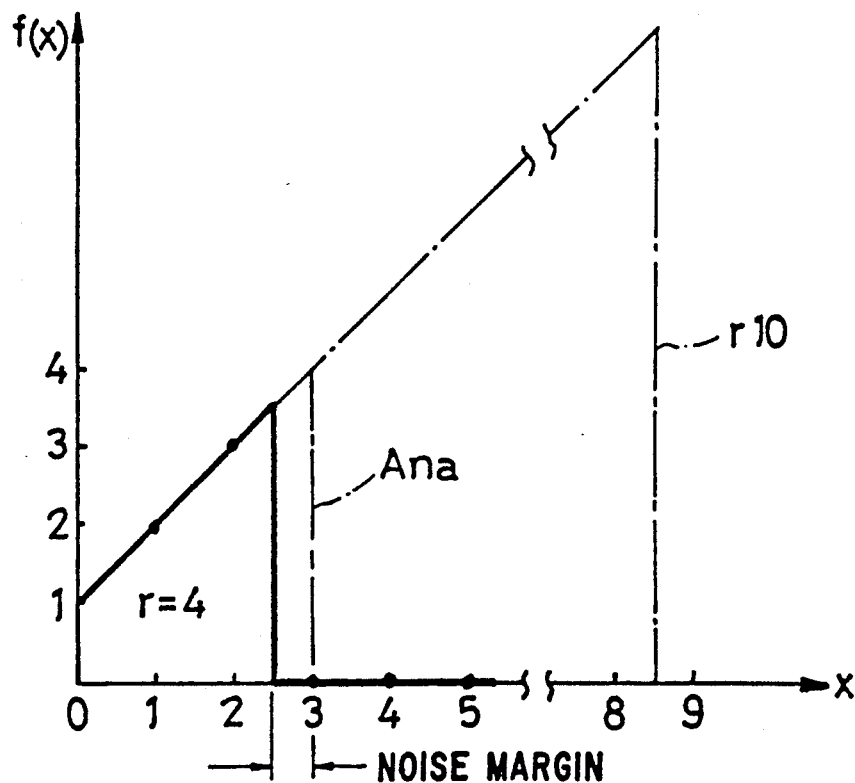
FIG. 7 is a graph illustrating an example of an input/output characteristic of a successor.

FIG. 7 illustrates an example of an input/output characteristic of a successor, in which the characteristic indicated by the solid line represents a case where r=4, with a noise margin of 0.5 being taken into account. The broken line Ana represents a characteristic for a case where r=4 and the noise margin is neglected, while the broken line $r_{10}$ represents a characteristic for a case where r=10 and the noise margin is taken into account.

(4) Quantizer circuits

The operation of a quantizer in r-valued logic (where r is the radix), or of an analog/multivalue converter circuit, is defined by $$f(x) = \begin{cases} 0 & (x < 0.5) \\ 1 & (0.5 \leq x < 1.5) \\ 2 & (1.5 \leq x < 2.5) \\ \cdot & \cdot \\ \cdot & \cdot \\ \cdot & \cdot \\ i & (i - 0.5 \leq x < i + 0.5) \\ \cdot & \cdot \\ \cdot & \cdot \\ \cdot & \cdot \\ r - 1 & (r - 1.5 \leq x) \end{cases} \qquad (2)$$

where i is 0 or a positive integer; i.e., $0 \leq i \leq r-1$.

In Eq. (2), +0.5 in (i-0.5≤x≤i+0.5) is taken to be an intermediate value of integers to be quantized. Of course, any value of less than 1 can be employed in place of the value 0.5.

Figure 8:
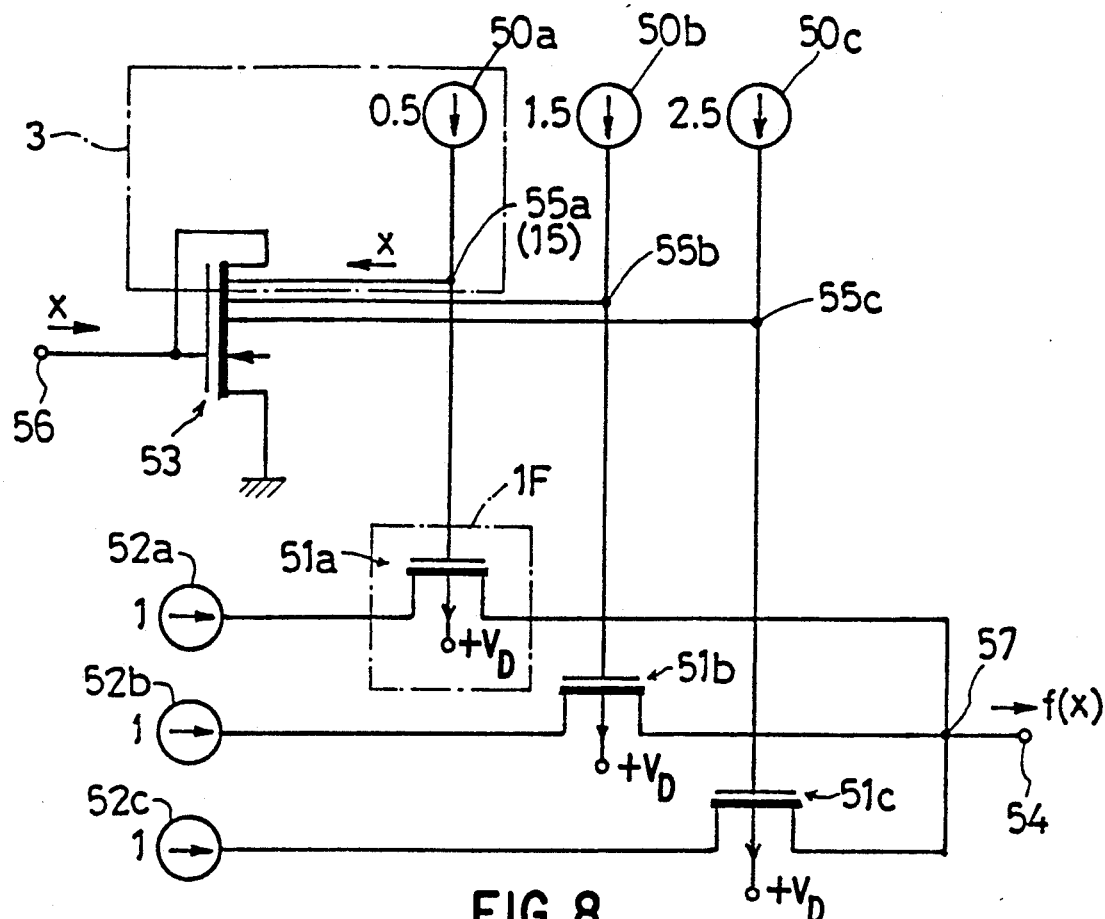
FIG. 8 is a circuit diagram illustrating an embodiment of a quantizer circuit.

An embodiment of a quantizer for a case where r=4 holds is illustrated in FIG. 8.

Three current sources 52a, 52b, 52c each for applying an in-flow input current of value 1 are provided and connected to a node 57 through respective floating switches 51a, 51b, 51c, each of which corresponds to the floating switch 1F of FIG. 4(B). An output terminal 54 is connected to the node 57.

An input (variable) x to be quantized is applied to an input terminal 56 as an in-flow input current representing the value x. The input terminal 56 is connected to a three-output current mirror (or current distributor) 53. An in-flow output current is obtained from each of the three output drains of the three-output current mirror 53.

One output drain of the three-output current mirror 53 is connected at a node 55a to a current source 50a for applying an in-flow input current of value 0.5, and the node 55a is connected to the gate of the floating switch 51a. A portion of the three-output current mirror 53, the current source 50a and the node 55a correspond to the aforementioned control signal generating circuit 3, and the node 55a corresponds to the node 15. Accordingly, when the relation $0.5 \leq x$ is established, the potential at the node 55a attains the low level and the floating switch 51a turns on.

Likewise, another portion of the three-output current mirror 53, a current source 50b for applying an in-flow input current of value 1.5, a node 55b and the floating switch 51b construct another floating threshold switching circuit. When the relation $1.5 \leq x$ is established, the switch 51b turns on.

Further, still another portion of the three-output current mirror 53, a current source 50c for applying an in-flow input current of value 2.5, a node 55c and the floating switch 51c construct another floating threshold switching circuit. When the relation $2.5 \leq x$ is established, the switch 51c turns on.

Accordingly, when $x < 0.5$ holds, all of the floating gates 51a through 51c turn off and the output current at the output terminal 54 is 0. When $1.5 \leq x \leq 1.5$ holds, only the switch 51a turns on and the output current represents a value of 1. When $1.5 \leq x \leq 2.5$ holds, switches 51a, 51b turn on, so that two currents each of value 1 are added at the node 57 to give an output current of value 2. When the condition $2.5 \leq x$ is established, all of the switches 51a through 51c turn on, thereby providing an output current of value 3.

Figure 10:
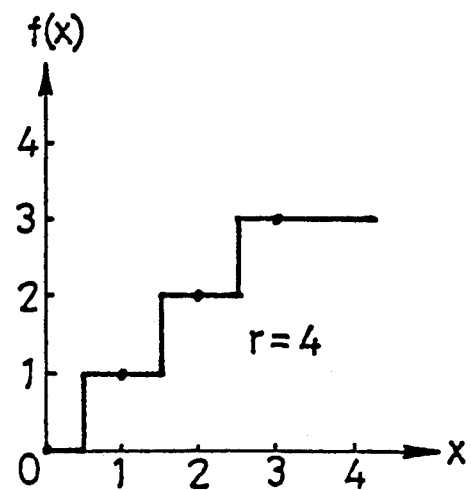
FIG. 10 is a graph illustrating an example of an input/output characteristic of a quantizer circuit.

FIG. 10 illustrates an input/output characteristic of a quantizer where $r = 4$.

Figure 9:
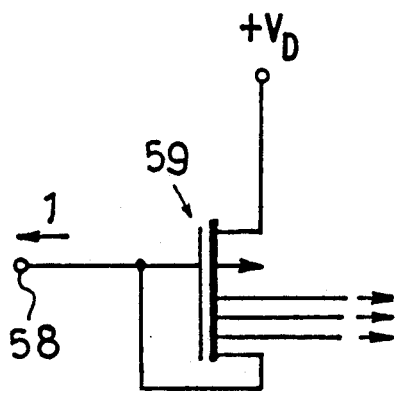
FIG. 9 is a view is a view showing another example of a current source.

As shown in FIG. 9, the three current sources 52a through 52c can be replaced by a three-output current mirror 59, in which case an out-flow input current of value 1 is applied to an input terminal 58.

It should be appreciated that in a case where the value of radix r is raised, it will suffice to increase the number of circuits comprising the combination of a 1-value current source and floating threshold switching circuit and to connect the output sides of these combined circuits to the node 57.

Though currents are added at the node 57, it is possible to adopt an arrangement in which the currents are subtracted. To achieve current subtraction at the node, all that need be done is to change the current direction. As an example, assume that the current source 52a applies an in-flow input current of value 3 and that each of the current sources 52b, 52c applies an out-flow input current of value 1. Then, if the switch 51a turns on and the other switches 51b, 51c turn off, the output current will be an out-flow current of value 2. When all of the switches 51a through 51c turn on, the output current will be of value 1; when all turn off, the output current will be 0.

(5) Full adder circuits

An adder circuit includes a clockwise cycling circuit and a full adder.

(5.1) Clockwise cycling circuit

The operation of a clockwise cycling circuit in r-valued logic of radix r is expressed by the following:

$$f(x,y) \equiv (x + y) \text{ Mod } r \tag{3}$$

$$= \begin{cases} x + y & (x + y < r - 0.5) \\ 0 & (r - 0.5 \leq x + y < r) \\ x + y - r & (r \leq x + y) \end{cases} \tag{3-1}$$

In (3-1), the value 0.5 is the noise margin taken into account in a multivalued logic circuit. Where noise margin is taken into account, the value adopted can be any value less than 1.

The solid lines in FIG. 11 indicate an embodiment of a clockwise cycling circuit for executing the operation of (3-1).

Two input (variables) x y are applied to respective input terminals 66x, 66y as in-flow input currents representing these values. These inputs are added at a node 69, which is connected to the gate of a two-output current mirror (or current distributor) 63. Since a current of value $x + y$ is applied to the two-output current mirror 63, an in-flow current of value $x + y$ is produced as an output from each of the two output drains.

On output drain of the two-output mirror 63 is connected at a node 65 to a current source 60 for applying an in-flow input current of value $r - 0.5$. The node 65 is connected to the gate of a floating switch 61, which corresponds to the floating switch 1F of FIG. 4(B). A portion of the two-output current mirror 63, the current source 60 and the node 65 correspond to the aforementioned control signal generating circuit 3, and the node 65 corresponds to the node 15. Accordingly, when the relation $(r - 0.5) > (x + y)$ is established, the potential at the node 65 attains the high level and the floating switch 61 is held in the off state. When the relation $(r - 0.5) \leq (x + y)$ is established, the potential at the node 65 attains the low level and the floating switch 61 turns on.

The other output drain of the two-output current mirror 63 is connected to the gate of a current mirror 67, the output side whereof is connected to an output terminal 68. A node 64 is provided between the two current mirrors 63, 67, and the abovementioned floating switch 61 is connected between the node 64 and a current source 62 for applying an in-flow input current of value r.

As set forth above, the floating switch 61 turns off when the relation $(x + y) < (r - 0.5)$ holds. Accordingly, the current mirror 67 is driven directly by the output current $x + y$ of the aforementioned other drain of the two-output current mirror 63, and the current mirror 67 outputs an out-flow current of value $x + y$. Thus, the output current from the output terminal 68 is $x + y$.

When the relation $(r - 0.5) \leq (x + y)$ is established, the floating switch 61 turns on and, hence, an in-flow current of value r flows from the current source 62 into the node 64 via the switch 61. The non-linear current source 62, a portion of the two-output current mirror 63, and the node 64 construct a current comparator circuit (the abovementioned control signal generating circuit 3). The current mirror 67 can be considered to a floating switch controlled by this current comparator circuit.

If $(x+y) < r$ holds, the node 64 attains the high level and, hence, the current mirror 67 turns off and the output current from output terminal 68 becomes 0. If $r \leq (x+y)$ holds (at which time the floating switch 61 is in the on state), the operation $(x+y)-r$ is performed at the node 64 and a differential current $(x+y)-r$ is supplied to the current mirror 67 as an out-flow input current. Accordingly, the output current becomes $x+y-r$.

Thus, the operation expressed by (3-1) is executed by the circuit indicated by the solid lines in FIG. 11.

FIG. 12 shows an input/output characteristic of such a clockwise cycling circuit for a case where $r=4$. Note that $(+C_{in})$ along the horizontal axis and $(,C_{in})$ along the vertical axis are omitted.

The clockwise cycling circuit can be applied to multivalued logic of any radix r by changing the output current values (particularly the value of r) of the current sources 60, 62. A desired noise margin can be set by freely changing the noise margin (the value of 0.5 in FIG. 11) included in the output current value of the current source 60. If the noise margin is made sufficiently close to 0, the circuit of FIG. 11 will take on the form of a clockwise cycling circuit for an analog operation.

(5.2) Full adder circuit

The operation of a full adder circuit in r-valued logic of radix r is expressed by the following:

Sum: $f(x, y, C_{in}) - (x+y+C_{in})$ Mod r   (4-1)

where Sum indicates the value of a relevant digit in the result of the addition operation and $C_{in}$ represents a carry input (carry-in) from the next lower digit place. Specifically, (4-1) represents the result of replacing $(x+y)$ in (3-1) by $(x+y+C_{in})$.

$$\text{Carry: } C_{out} = \begin{cases} 0 & (x+y+C_{in} < r - 0.5) \\ 1 & (x+y+C_{in} \geq r - 0.5) \end{cases} \quad (4\text{-}2)$$

Carry (carry-out) refers to a value or signal added to the next higher digit place.

A full adder circuit is readily obtained by a minor modification of the above-described clockwise cycling circuit. The overall circuit of FIG. 11 inclusive of the circuit indicated by the dashed lines is a full adder circuit.

An input terminal 66c is provided for the carry input $C_{in}$ and is connected to the node 69. An in-flow input current having the value of the carry input $C_{in}$ (1 or 0) is applied to the input terminal 6c. Accordingly, a current of value $x+y+C_{in}$ flows into the two-output current mirror 63. It will be readily understood from the foregoing discussion of operation regarding the clockwise cycling circuit that the operation of (4-1) will be carried out. A current representing the sum is outputted from the output terminal 68.

A current source 72 applying an in-flow input current of value 1 and an output terminal 74 for the carry output $C_{out}$ are provided for this carry output and a floating switch 71 (P-MOSFET) is connected between them. The gate of the floating switch 71 is provided by a node 73 with a control voltage equivalent to the potential at the node 65. It is particularly noteworthy that since a floating switch is controlled by a signal in the voltage mode, it is possible for the two floating switches 61, 71 to share the same control signal.

When $(x+y+C_{in}) < (r-0.5)$ holds, the gate of the floating switch 71 is at the high level and the switch 71 is held in the off state, so that the carry output $C_{out}$ is 0. When the relation $(x+y+C_{in}) \geq (r-0.5)$ is established, the gate of the floating switch 71 falls to the low level and the switch 71 turns on, whereby the current from the current source 72 flows through the switch 71 and appears at the output terminal 74. The carry output $C_{out}$ becomes an out-flow current of value 1.

The input/sum output characteristic and the input/carry output characteristic of the full adder circuit $(r=4)$ are illustrated in FIGS. 12 and 13, respectively.

(6) Subtracter circuits

A subtracter circuit includes a counter cycling circuit and a full subtracter.

(5.1) Counter cycling circuit

The operation of a counter cycling circuit in r-valued logic of radix r is expressed by the following:

$$f(x,y) \equiv (x - y) \text{ Mod } r \quad (5)$$

$$= \begin{cases} x - y + r & (x - y < -0.5) \\ 0 & (-0.5 \leq x - y < 0) \\ x - y & (0 \leq x - y) \end{cases} \quad (5\text{-}1)$$

Figure 14:
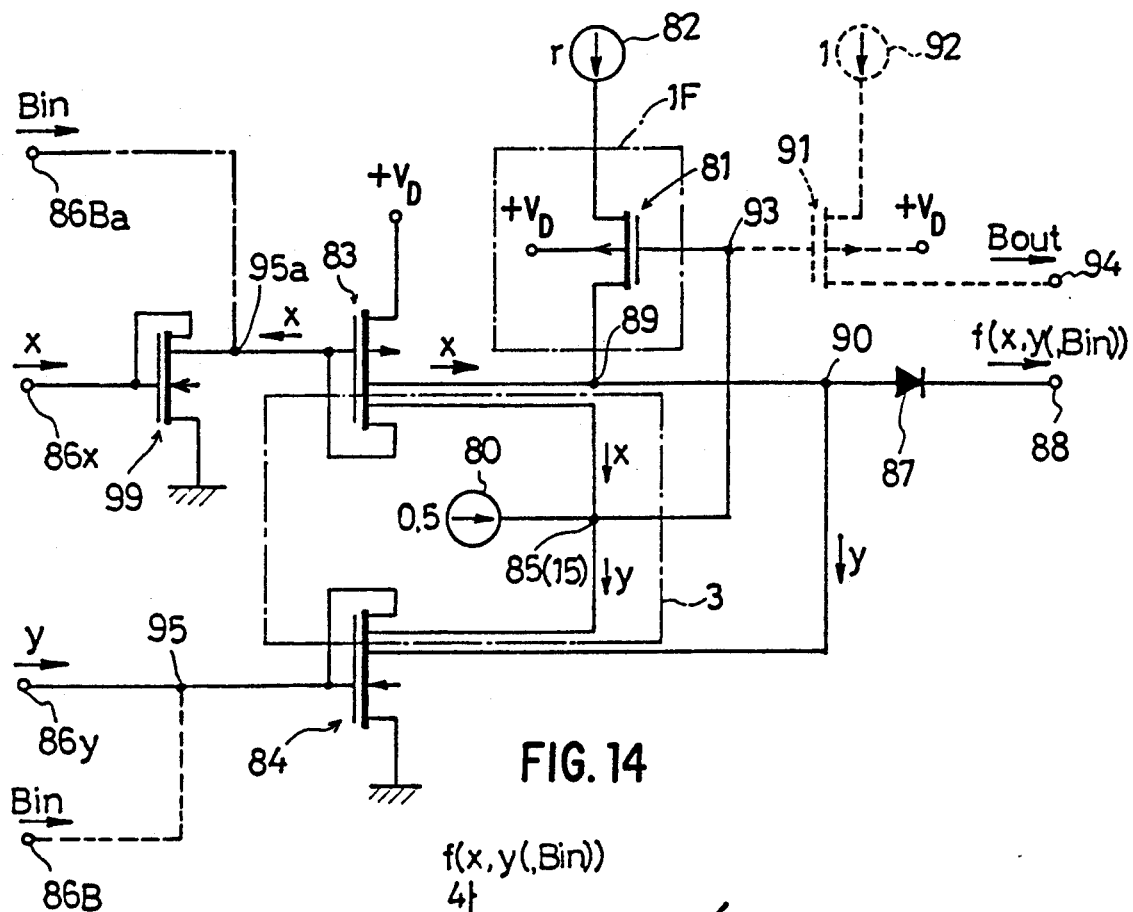
FIG. 14 is a circuit diagram illustrating an embodiment of an subtracter circuit which includes a clockwise cycling circuit and a full subtracter.

The solid lines in FIG. 14 indicate an embodiment of a counter cycling circuit for executing the operation of (5-1).

Two input (variables) x, y are applied to respective input terminals 86x, 86y as in-flow input currents representing these values. The current representing the input x has its direction reversed by a current mirror 99 and is then applied to a two-output current mirror (or current distributor) 83. Accordingly, an out-flow current of value x is produced as an output from each of the two output drains of the two-output current mirror 83. The current mirror 99 can be deleted by applying an out-flow input current to the input terminal 86x and connecting the input terminal 86x directly to the input side of the two-output curent mirror 83. The current representing the input y is applied to a two-output current mirror 84 and an in-flow current of value y is produced as an output from each of the two output drains of the two-output current mirror 84.

One output drain of the two-output current mirror 83 and one output drain of the two-output current mirror 84 are connected to each other at a node 85. A current source 80 for applying an in-flow input current of value 0.5 is connected to the node 85. The node 85 is further connected to the gate of a floating switch 81, which corresponds to the floating switch 1F in FIG. 4(B). A portion of the two-output current mirror 83, a portion of the two-output current mirror 84, the node 85 and the current source 80 correspond to the aforementioned control signal generating circuit 3, and the node 85 corresponds to the node 15. Accordingly, when the relation $(x-y) < -0.5$ is established, the potential at the node 85 attains the low level and the floating switch 81 turns on. When the condition $-0.5 \leq (x-y)$ is established, the potential at the node 85 attains the high level and the floating switch 81 turns off.

The other output drain of the two-output current mirror 83 is connected to an output terminal 88 via a diode 87, which is connected in a forward direction with respect to the current flowing out of this output drain. Connected between this output drain and the diode 87 are nodes 89, 90, the node 89 being located ahead of the node 90 with respect to the drain. The abovementioned floating switch 81 is connected between a current source 82, which applies an in-flow input current of value r, and the node 89. The other output drain of the two-output current mirror 84 is connected to the node 90.

When $(x-y) < -0.5$ holds, the floating switch 81 is in the on state so that a current of value r flows into the node 89. Accordingly, the addition operation $x+r$ is performed at the node 89 and a current representing the result of the addition operation flows from the node 89 toward the node 90. Since a current of value y flows out of the node 90, the subtraction operation $(x+r)-r$ is performed at this node and a current representing the result of this subtraction operation appears at the output terminal 88 through the intermediary of diode 87. The output current is indicative of a value of $x-y+r$.

When the relation $-0.5 \leq (x-y)$ is established, the floating gate 81 turns off and, hence, the current which flows from node 89 to node 90 is x.

If $-0.5 \leq (x-y) < 0$ holds, namely if $(x+0.5) \geq y$ and $x < y$ hold, the direction of the current representing the result $x-y$ of the subtraction performed at node 90 is reversed with respect to the diode 87. In consequence, the current is blocked by the diode 87 and the output current at output terminal 88 becomes 0.

If $0 \leq (x-y) < 0$ holds, namely if $x \geq y$ holds, the current representing the result $x-y$ of the subtraction performed at node 90 appears as an out-flow output current at the output terminal 88 through the diode 87.

The operation expressed by (5-1) is performed in the above-described manner by the circuit indicated by the solid lines in FIG. 14.

Figure 15:
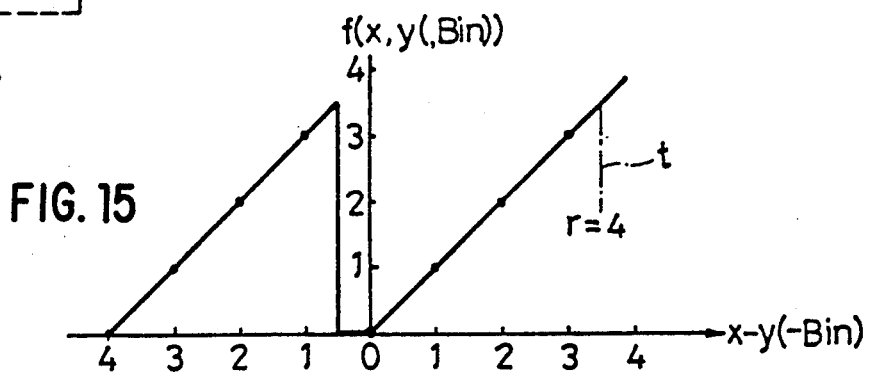
FIGS. 15 and 16 are graphs illustrating input/output characteristics of these circuits.

The input/output characteristic of such a counter cycling circuit in a case where $r=4$ is illustrated in FIG. 15. Note, however, that $-B_{in}$ along the horizontal axis and $(,B_{in})$ along the vertical axis are omitted. In FIG. 15, the graph preferably declines at the position $(x-y)=3.5$, as indicated by the broken line t. In actual practice, no problem is encounted in accomplishing this.

The counter cycling circuit can be applied to multi-valued logic of any radix r by changing the output current value (particularly the value of r) of the current source 82. A desired noise margin can be set by freely changing the noise margin (a value of 0.5) represented by the output current value of the current source 80. If the noise margin is made sufficiently close to 0, the circuit indicated by the solid lines in FIG. 14 will take on the form of a counter cycling circuit for an analog operation.

(6.2) Full subtracter circuit

The operation of a full subtracter circuit in r-valued logic of radix r is expressed by the following:

$$\text{Diff: } f(x, y, B_{in}) = (x - y - B_{in}) \text{ Mod } r \quad (6\text{-}1)$$

-continued
$$= [x - (y + B_{in})] \text{ Mod } r$$

where Diff (difference) indicates the value of a relevant digit in the result of the subtraction operation, x is a minuend, $(Y+B_{in})$ is a subtrahend and $B_{in}$ represents a borrow input (borrow-in) with respect to the next lower digit place. Specifically, (6-1) represents the result of replacing $(x-y)$ in (5-1) by $(x-y-B_{in})$.

$$\text{Borrow output: } B_{out} = \begin{cases} 1 & (x - y - B_{in} < -0.5) \\ 0 & (x - y - B_{in} \geq -0.5) \end{cases} \quad (6\text{-}2)$$

Borrow output (borrow-out) represents a borrow with respect to the next higher digit place and is a value or signal subtracted from the next higher digit place.

A full subtracter is readily obtained by a minor modification of the above-described counter cycling circuit. The overall circuit of FIG. 14 inclusive of the circuit indicated by the dashed lines is a full subtracter.

An input terminal 86B is provided for the borrow input $B_{in}$ and is connected to the node 95. An in-flow input current having the value of the borrow input $B_{in}$ (1 or 0) is applied to the input terminal 86B. Accordingly, the input current of the two-output current mirror 84 is $y+B_{in}$. It will be readily understood that the operation of (6-1) will be carried out merely by substituting the subtrahend y for $y+B_{in}$ in the operation performed by the above-described counter cycling circuit. A current representing the difference is outputted from the output terminal 88.

A current source 92 applying an in-flow input current of value 1 and an output terminal 94 for the borrow output $B_{out}$ are provided for this borrow output and a floating switch 91 (P-MOSFET) is connected between them. The gate of the floating switch 91 is provided by a node 85 with a control voltage equivalent to the potential at the node 85.

When $(x-y-B_{in}) < -0.5$ holds, namely when $(x-Bin+0.5) < y$ holds, the gate of the floating switch 91 is at the low level and the switch 91 is held in the on state. Accordingly, the current from the current source 92 appears at the output terminal 84 through the switch 91, so that the borrow output $B_{out}$ becomes 1. When the relation $(x-y-B_{in}) > -0.5$ is established, namely when $(x-Bin+0.5) \geq y$ holds, the gate of the floating switch 91 assumes the high level, the switch 91 turns off and the borrow output $B_{out}$ becomes 0.

Figure 16:
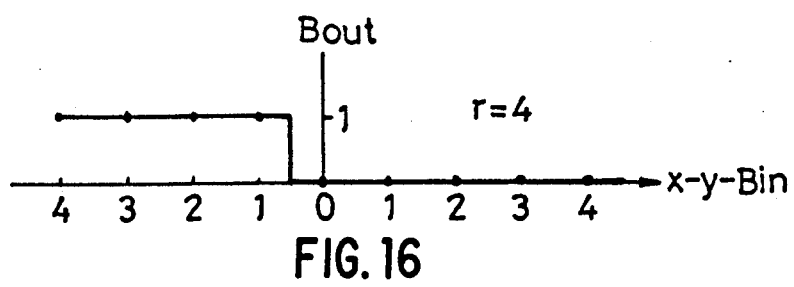

The input/difference output characteristic and the input/borrow output characteristic of the full subtracter ($r=4$) are illustrated in FIGS. 15 and 16, respectively.

Note that it can be arranged to substract the borrow input $B_{in}$ from the minuend x, as indicated by an input terminal 86Ba and a node 95a. However, the circuit cannot be used when $x=0$, $B_{in}=1$ hold.

(7) Divider circuits

The operation of a divider circuit in r-valued logic of radix r is expressed by the following:

$$\text{Quotient: } Q = 1 \quad (7\text{-}1)$$

$$\text{Remainder: } R = (x + r \cdot B_{in}) \text{ mod } y \quad (7\text{-}2)$$

where $r > i > 0$ (i is a positive integer)

$$i\cdot y - 0.5 \leq r\cdot B_{in} + x < (i+1)\cdot y - 0.5$$

In the above, $x + r\, B_{in}$ is a dividend, y is a divisor and $B_{in}$ represents a borrow from the next higher digit place.

In a case where r=4 holds, (7-1) and (7-2) may be written more concretely as follows:

$$\begin{cases} Q = 0 \\ R = x + r \cdot B_{in} \end{cases} \quad (7\text{-}3)$$
for $(x + r \cdot B_{in}) < (y - 0.5)$;

$$\begin{cases} Q = 1 \\ R = 0 \end{cases} \quad (7\text{-}4)$$
for $(y - 0.5) \leq (x + r \cdot B_{in}) < y$;

$$\begin{cases} Q = 1 \\ R = x + r \cdot B_{in} - y \end{cases} \quad (7\text{-}5)$$
for $y \leq (x + r \cdot B_{in}) < (2y - 0.5)$;

$$\begin{cases} Q = 2 \\ R = 0 \end{cases} \quad (7\text{-}6)$$
for $(2y - 0.5) \leq (x + r \cdot B_{in}) < 2y$;

$$\begin{cases} Q = 2 \\ R = x + r \cdot B_{in} - 2y \end{cases} \quad (7\text{-}7)$$
for $2y \leq (x + r \cdot B_{in}) < (3y - 0.5)$;

$$\begin{cases} Q = 3 \\ R = 0 \end{cases} \quad (7\text{-}8)$$
for $(3y - 0.5) \leq (x + r \cdot B_{in}) < 3y$; and $$\begin{cases} Q = 3 \\ R = x + r \cdot B_{in} - 3y \end{cases} \quad (7\text{-}9)$$
for $3y \leq (x + r \cdot B_{in})$.

Figure 17:
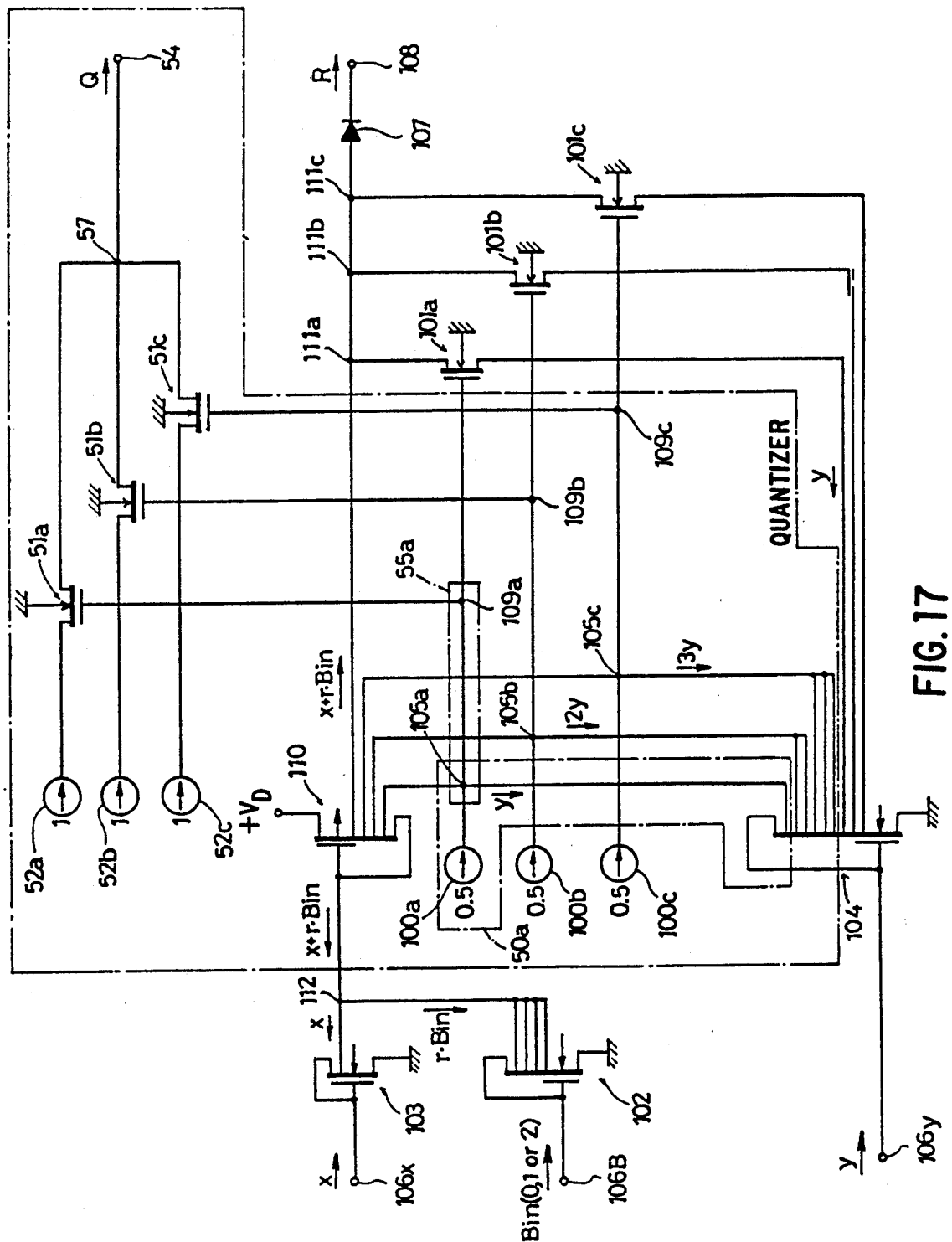
FIG. 17 is a circuit diagram illustrating an embodiment of a divider circuit.

FIG. 17 illustrates an embodiment of a divider circuit where r=4. This circuit is constructed by combining the aforementioned quantizer and floating threshold switching circuits. Accordingly, portions corresponding to the elements constituting the quantizer of FIG. 8 are designated by like reference characters. However, whereas the floating switches 51a through 51c are constituted by P-MOSFETs in FIG. 8, N-MOSFETs constitute these switches in FIG. 17. Consequently, in FIG. 17 the current direction in the current comparators which generate the control signals for controlling these floating switches is opposite to that in FIG. 8.

The divider of FIG. 17 can also be considered to be modification of the full subtracter described above.

One input (variable) x is applied to the input terminal 106x as a in-flow input current. The input terminal 106x is connected to a current mirror 103 to obtain an in-flow output current of value x from the current mirror 103. The latter can be deleted by changing the direction of the current x applied to the terminal 106x.

An input current representing a borrow input $B_{in}$ (having a value of 0,1 or 2 if r=4) is applied to a four-output current mirror 102 from an input terminal 106B. The four (a number equal to the radix r) output drains of the four-output current mirror 102 are connected to one another and to the output side of the current mirror 103 by a node 112. Accordingly, an out-flow input current of value $r\cdot B_{in}$ is applied to the node 112 by the four-output current mirror 102.

An addition operation $x + r\cdot B_{in}$ is performed at the node 112, this quantity serving as a dividend. An out-flow input current representing the dividend $x + r\cdot B_{in}$ is applied to a four-output current mirror 110. The latter has three output drains forming a portion of the quantizer. In other words, these correspond to the current mirror 53 of FIG. 8. The other output drain of the four-output current mirror 110 is connected to an output terminal 108 for the remainder R through a diode 107. The diode 107 in the forward direction with respect to the current flowing out of this output drain.

An input (variable) y is applied as an in-flow input current to a nine-output current mirror 104 via an input terminal 106y. One output drain of the nine-output current mirror 104 is connected to one output drain of the four-output current mirror 110 at a node 105a. The node 105a is connected to the gate of the floating switch 51a via a node 109a. The nodes 105a, 109a correspond to the node 55a of FIG. 8. A current source 100a for applying an in-flow input current of value 0.5 is connected to the node 105a. The combination of the current source 100a and one output drain of the nine-output current mirror 104 corresponds to the current source 50a of FIG. 8. The node 105a is supplied by the current mirror 110 with an in-flow current of value $x + r\cdot B_i$, by the current source 100a with an in-flow input current of value 0.5, and by the current mirror 104 with an out-flow input current of value y.

Another two output drains of the nine-output current mirror 104 are connected to each other and to one other output drain of the four-output current mirror 110 via a node 105b. The current mirror 104 supplies the node 105b with an out-flow input current of value 2y. Connected to the node 105b are a current source 100b (current value: 0.5) and, via a node 109b, the floating switch 51b. These correspond to the current source 50b and node 55b of FIG. 8.

Likewise, another two output drains of the nine-output current mirror 104 are connected to each other and to one other output drain of the four-output current mirror 110 via a node 105c. The current mirror 104 supplies the node 105c with an out-flow input current of value 3y. Connected to the node 105c are a current source 100c (current value: 0.5) and, via a node 109c, the floating switch 51c. These correspond to the current source 50c and node 55c of FIG. 8.

The remaining three output drains of the nine-output current mirror 104 are connected to the input side of the diode 107 by nodes 111a, 111b, 111c via floating switches 101a, 101b, 101c, respectively. The on/off action of these floating switches 101a, 101b, 101c is controlled by the potentials at the nodes 109a, 109b, 109c (namely the nodes 105a, 105b, 105c), respectively.

In a case where $(x + r\cdot B_{in}) < (y - 0.5)$ [(expression 7-3)] holds, namely if $(x + r\cdot B_{in} + 0.5) < y$ holds, the potentials at all nodes 105a through 105c are at the low level and all of the floating switches 51a through 51c and 101a through 101c are in the off state. The quotient output Q, therefore, is 0. Further, since the output current of the current mirror 110 remains intact at the remainder output terminal 108, the remainder output R becomes $x + r\cdot B_{in}$.

In a case where $(y - 0.5) \leq (x + r\, B_{in}) < y$ [(expression 7-4)] holds, namely if $y < (x + r\cdot B_{in} + 0.5) < (y + 0.5)$ ($<2y$) holds, only the potential at node 105a attains the high level and floating switches 51a, 101a turn on. Accordingly, an out-flow output current of value 1 appears at the output terminal 54 for quotient Q. Since an out-flow input-current of value y is applied to the node 111a by virtue of the floating switch 101a attaining the on state, the operation $(x+r \cdot B_{in}) - y$ is performed at the node 111a. Though the result of the subtraction operation is negative, a current in the reverse direction is blocked by the diode 107, so that the remainder output R at the terminal 108 becomes 0.

In a case where $y \leq (x+r \cdot B_{in}) < (2y-0.5)$ [(expression 7-5)] holds, namely if $(y<)$ $(y+0.5) \leq (x+r \cdot Bin+0.5) < 2y$ holds, only the potential at node 105a attains the high level and floating switches 51a, 101a turn on. The quotient Q, therefore, has a value of 1. Since the result $x+r \cdot B_{in} - y$ of the subtraction operation at the node 111a does not take on a negative value, a current representing the result of this subtraction operation flows out in the form of the remainder output R at the output terminal 108 via the diode 107.

As the value of $x+r \cdot B_{in}$ increases, the potentials at the nodes 105b, 105c successively attain the high level, so that the floating switches 51b, 101b and 51c, 101c turn on in succession. It may readily be understood that the quotient outputs Q and remainder outputs R of the type expressed by (7-6) through (7-9) are obtained as a result.

Figure 18A:
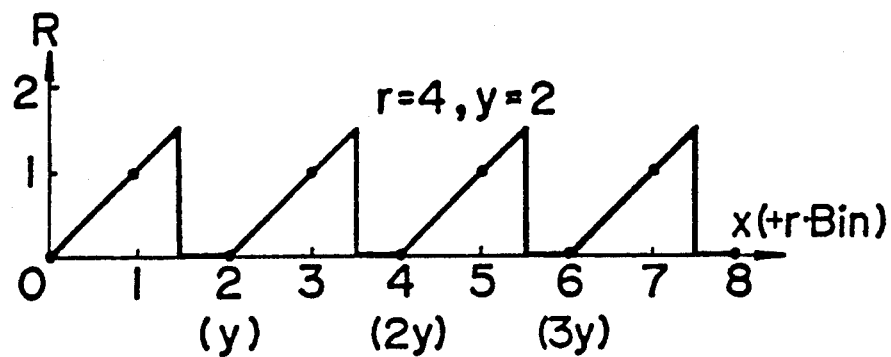
FIG. 18 is a graph illustrating an input/output characteristic of the divider circuit.
Figure 18B:
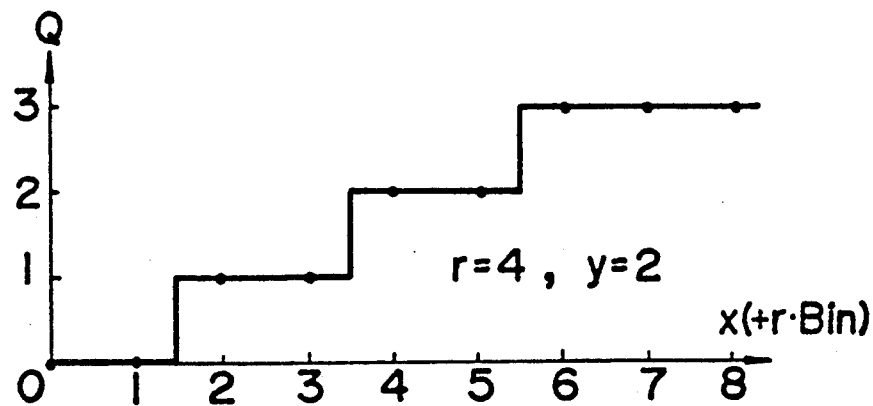

FIG. 18 shows the input/output characteristic, namely the relation between input $(x+r \cdot B_{in})$ and outputs R, Q, of the circuit shown in FIG. 17 for a case where r=4, y=2. In the graph, the borrow input $B_{in}$ is restricted to 0 and 1.

It goes without saying that the divider circuit of FIG. 17 can be applied to multivalued logic of any radix r by changing the number of output drains of the multi-output current mirrors (multiple fan-out circuits) 102, 104 and 110, the number of current sources and floating switches in the quantizer, and the number of floating switches 101a through 101c and nodes 111a through 111c. A desired noise margin can be set by freely changing the the noise margin (a value of 0.5) represented by the output current values of the current sources 100a through 100c. The circuit of FIG. 17 will take on the form of a divider for an analog operation if the noise margin is made sufficiently close to 0.

(8) Multiplier circuits

The operation of a multiplier circuit in r-valued logic of radix r is expressed by the following:

Carry: $C_{out} = i$      (8-1)

Product: $P = (x \cdot y) \bmod r$      (8-2)

where $r > i \geq 0$ (i is a positive integer)

$i \cdot r \leq x \cdot y \leq (i+1) \cdot r - 0.5$

In the above, carry $C_{out}$ represents a carry to the next higher digit place, and the product P represents the value of a relevant digit among numerical values indicating the results of multiplication. The noise margin is 0.5.

Figure 19:
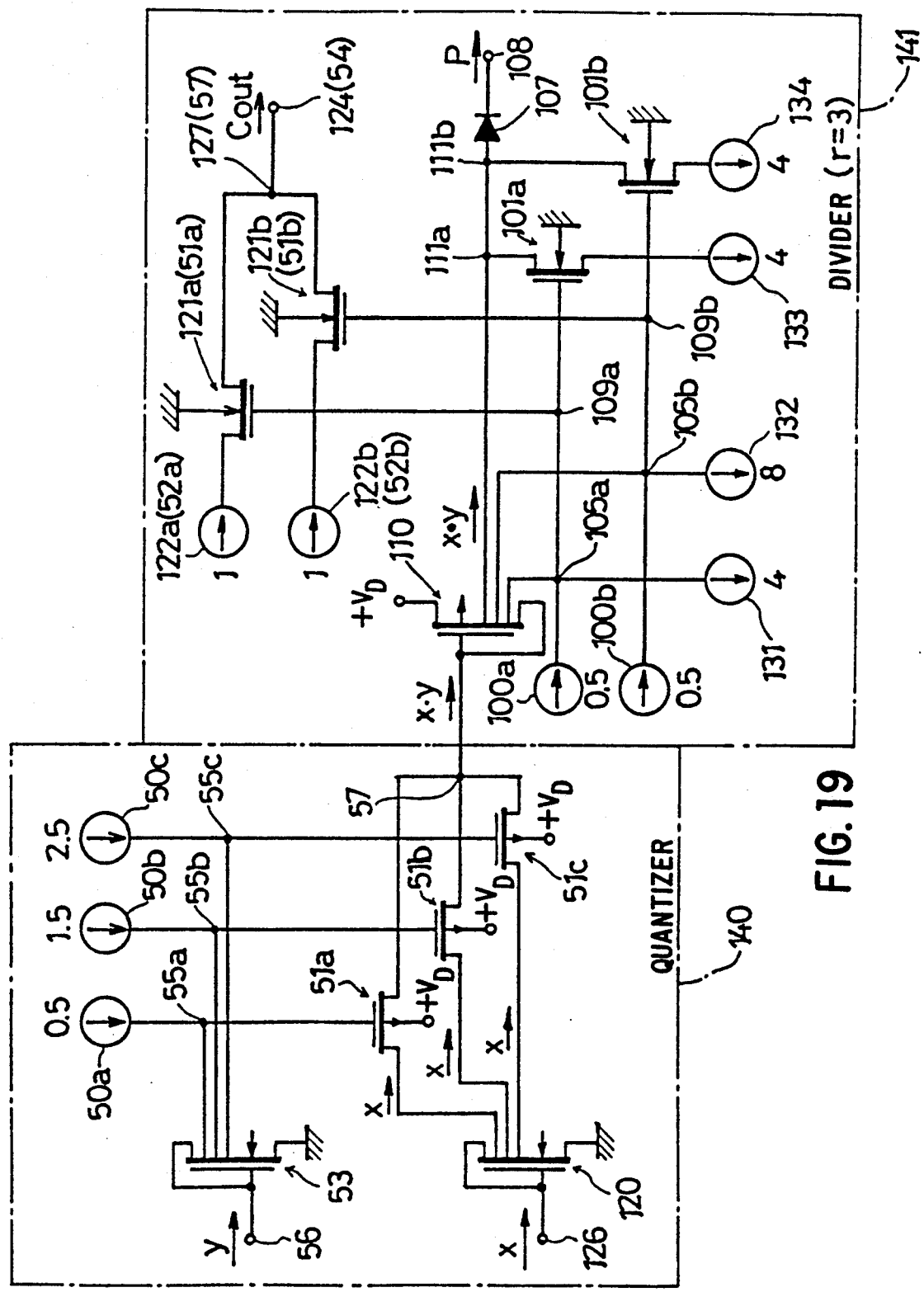
FIG. 19 is a circuit diagram illustrating an embodiment of a multiplier circuit.

An embodiment of a multiplier circuit for a case where r=4 is illustrated in FIG. 19. It will be appreciated from the drawing that the multiplier circuit is constituted by the above-described quantizer and divider.

In the quantizer 140 constituting the circuit of FIG. 19, elements the same as those shown in FIG. 8 are designated by like reference characters. An input terminal 126 and a three-output current mirror 120 are provided instead of the current sources 52a through 52c of value 1 in FIG. 8. An in-flow input current representing the value of x, which is one of the inputs, is applied to the input terminal 126, and three currents representing the value of x are produced by the three-output current mirror 120. A current representing the value of y, which the other input, is applied by the input terminal 56. The on/off action of the floating switches 51a through 51c is controlled in dependence upon the value of y. If the value of y grows larger, the number of floating switches that turn on increases. Accordingly, a current representing the value of x·y flows out of the node 57 and is fed to the divider 141, which is the next stage.

In r-valued logic, the maximum value resulting from a multiplication operation is $(r-1) \times (r-1)$. This may be transformed in the following manner:

$$(r-1) \times (r-1) = r^2 - 2r + 1 = r \times (r-2) + 1 \quad (8-3)$$

Accordingly, the maximum value of the carry output $C_{out}$ is $r-2$. Consequently, $(r-2)$-number of current comparators are required in the divider portion of the multiplier circuit. It will suffice if a divider of value $r-1$ is provided.

The divider 141 in

FIG. 19 is constructed as if it were a divider of value $(r-1)$. Portions the same as those in the divider of FIG. 17 are designated by like reference characters. However, these like reference characters are enclosed in parentheses at the current sources 122a, 122b, floating switches 121a, 121b and the like, which constitute a portion of the quantizer in the multiplier 141, in order to avoid confusion with the elements of the quantizer 140 of the preceding stage.

The terminal 54 for the quotient Q in FIG. 17 corresponds to the output terminal 124 of the carry output $C_{out}$. The product output P appears at the output terminal 108. It will readily be understood that the multiple output current mirror 104 of FIG. 17 is written as current sources 131, 132, 133 and 134 in FIG. 19.

It will readily be appreciated from the operation of the divider described above that the circuit shown in FIG. 19 performs a multiplication operation expressed by (8-1) and (8-2). The noise margin in this multiplier obviously can be set a will.

Figure 20A:
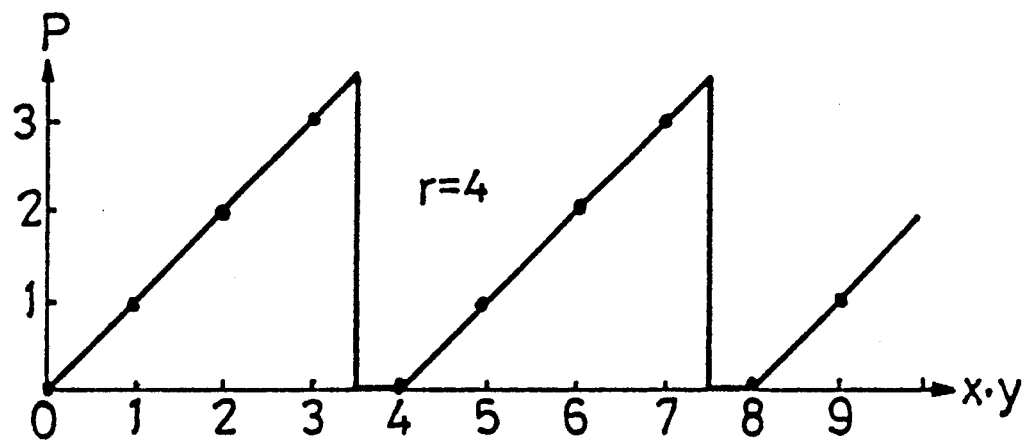
FIG. 20 is a graph illustrating an input/output characteristic of the multiplier circuit.
Figure 20B:
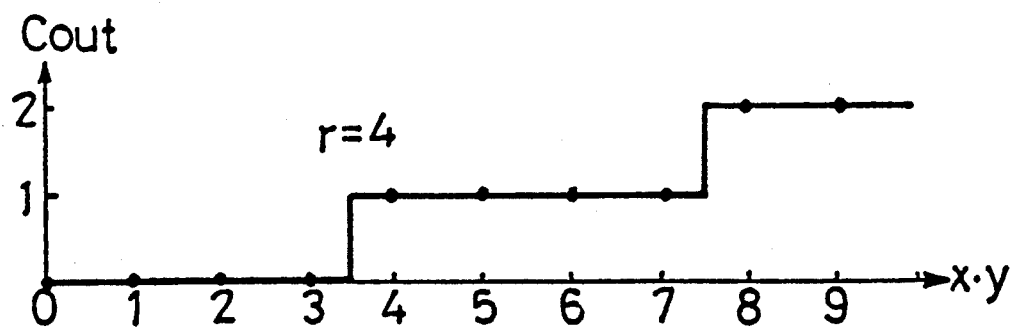

FIG. 20 illustrates the input/output characteristic of the multiplier for r=4. A comparison with FIG. 18 shows that the input/output characteristic of FIG. 20 resembles that of the divider.

(9) Floating window switching circuits

A window switch has two different threshold values and switches from the on to the off state when the value indicated by a control signal attains one of the threshold values and from the off to the on state when the value attains the other threshold value; A window switch is referred to as a "window-ON switch" if it attains the on state when the value indicated by the control signal lies between the two threshold values, and as a "window-OFF switch" if it assumes the off state when the value indicated by the control signal lies between the two threshold values.

A circuit which contains a window switch of this kind in the form of a floating switch is referred to as a "floating window switching circuit". The control signal, which is in the form of a electric current, is compared with currents indicating the two different threshold values. A floating window switching circuit is realized by combining two of the floating threshold switching circuits described earlier.

(9-1) Window-ON switching circuits

Figure 21:
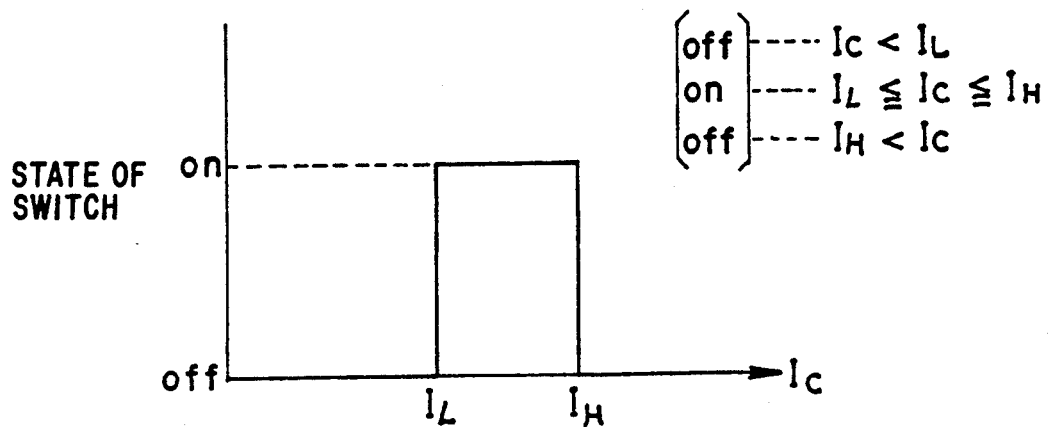
FIG. 21 is a graph illustrating the function of a window-ON switch.

FIG. 21 illustrates the function of a window-ON switch. There are two different threshold values, the lower of which is represented by a current denoted $I_L$, the higher of which is represented by a current denoted $I_H$. Let $I_C$ denote the control current. The window-ON switch turns on only when $I_L \leq I_C \leq I_H$ holds and is in the off state at all other times.

Figure 22:
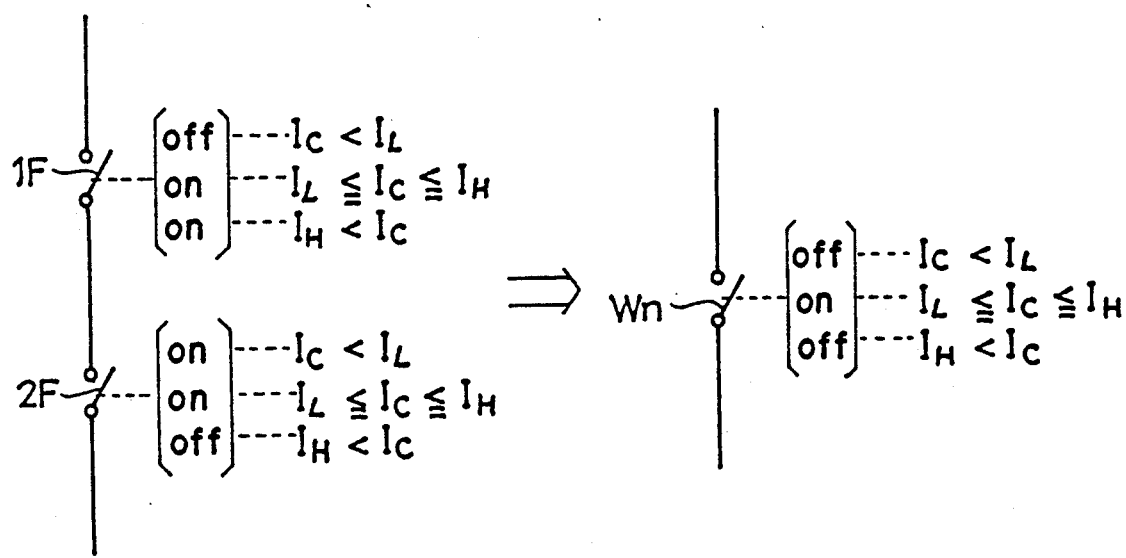
FIG. 22 is an explanatory view showing the manner in which a window-ON switch is realized by serially connecting two floating switches.

FIG. 22 illustrates the manner in which a window-ON switch $W_n$ having the foregoing function is realized by serially connecting two floating threshold switches 1F, 2F. The floating switch 1F is held in the off state when $I_C < I_L$ holds and turns on when the condition $I_L \leq I_C$ is established. The floating switch 2F turns on when $I_C \leq I_H$ holds and turns off when the condition $I_H < I_C$ is established. It may be understood that a window-ON switch $W_n$ which turns on only when $I_L \leq I_C \leq I_H$ holds is realized by connecting the switches 1F, 2F in series, that is, by adopting a connection for AND logic.

FIG. 23 illustrates floating window-ON switching circuits of various forms.

Figure 23A:
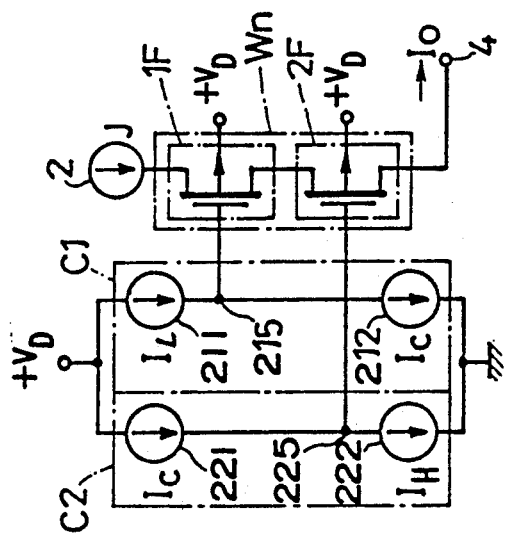
FIGS. 23(A) through 23(D) are circuit diagrams showing various forms of window-ON switching circuits.

FIG. 23(A) illustrates a circuit in which N-MOSFETs are used as the two floating switches 1F, 2F constructing the window-ON switch $W_n$. The floating switches 1F, 2F are connected in series between the current source 2 and output terminal 4. The floating switch 1F is controlled by a current comparator $C_1$ and the floating switch 2F is controlled by a current comparator $C_2$. For the sake of convenience, the non-linear current sources in the current comparators $C_1$ and $C_2$ are designated 211, 212 and 221, 222, respectively, and the nodes at the connections between these current sources are designated 215, 225, respectively.

The floating switch 1F and the current comparator $C_1$ construct a first floating threshold switching circuit, and the floating switch 2F and current comparator $C_2$ construct a second floating threshold switching circuit. These floating threshold switching circuits are the same as the circuit shown in FIG. 3 or FIG. 4(A). In the current comparator $C_1$, the control current $I_C$ from the current source 211 and the current $I_L$ from the current source 212 and indicative of the lower threshold value are delivered as outputs. When $I_L \leq I_C$ holds, therefore, the potential at the node 215 attains the high level and the floating switch 1F turns on. In the current comparator $C_2$, the current $I_H$ from the current source 221 and indicative of the higher threshold value and the control current $I_C$ from the current source 222 are delivered as outputs. When $I_C \leq I_H$ holds, therefore, the potential at the node 225 attains the high level and the floating switch 2F turns on. Accordingly, the window-ON switch $W_n$ turns on only when $I_L \leq I_C \leq I_H$ holds, so that the current J generated by the current source 2 appears at the output terminal 4 as the output current $I_0$.

Figure 23B:
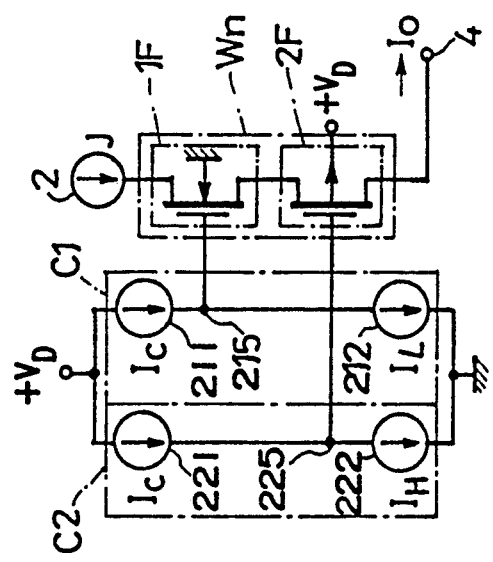

FIG. 23(B) illustrates an embodiment in which P-MOSFETs are used as the two floating switches 1F, 2F constructing the window-ON switch $W_n$. The two floating threshold switching circuits constituting this floating window-ON switching circuit correspond to the circuit shown in FIG. 4(B). The currents generated by the current sources 211, 212 and 221, 222 in the current comparators $C_1$ and $C_2$, respectively, are illustrated alongside the corresponding current sources. It will be understood that the function of the window-ON switch shown in FIG. 21 is implemented by the circuit of FIG. 23(B).

Figure 23C:
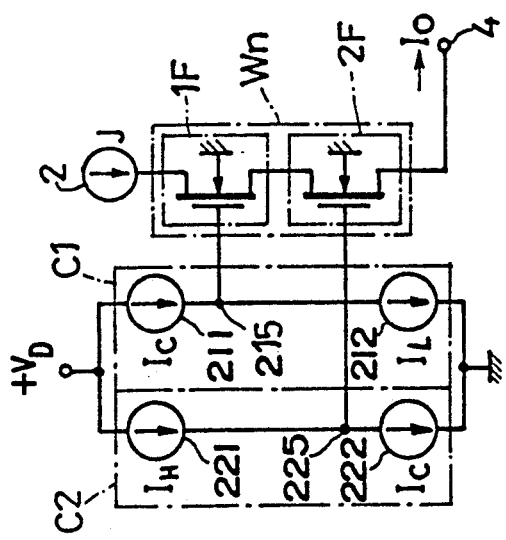
Figure 23D:
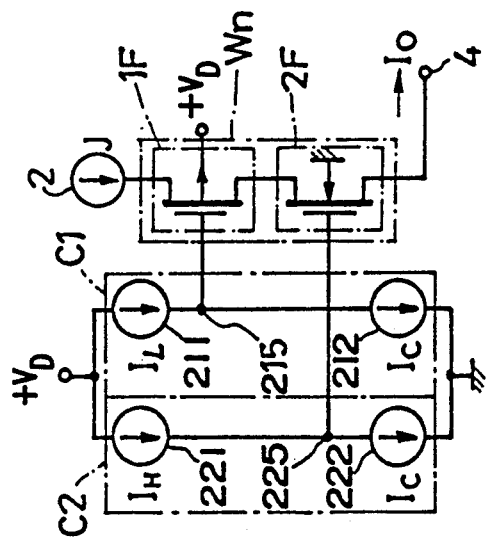

FIGS. 23(C) and 23(D) illustrate floating window-ON switching circuits in which the window-ON switch $W_n$ is constituted by complementary MOS (C-MOS) FETs. Comparing these circuits with the circuits of FIGS. 23(A) and 23(B) will make it apparent that they implement the desired function.

(9.2) Window-OFF switching circuits

Figure 24:
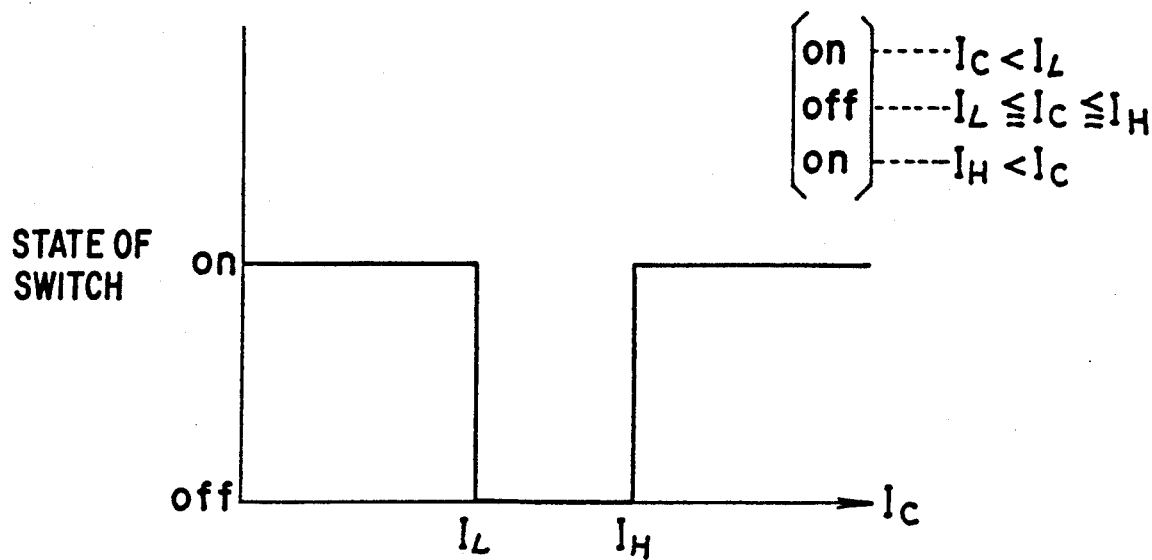
FIG. 24 is a graph showing the function of a window-OFF switch.

FIG. 24 illustrates the function of a window-OFF switch. The window-OFF switch turns off only when $I_L \leq I_C \leq I_H$ holds and is in the on state at all other times.

Figure 25:
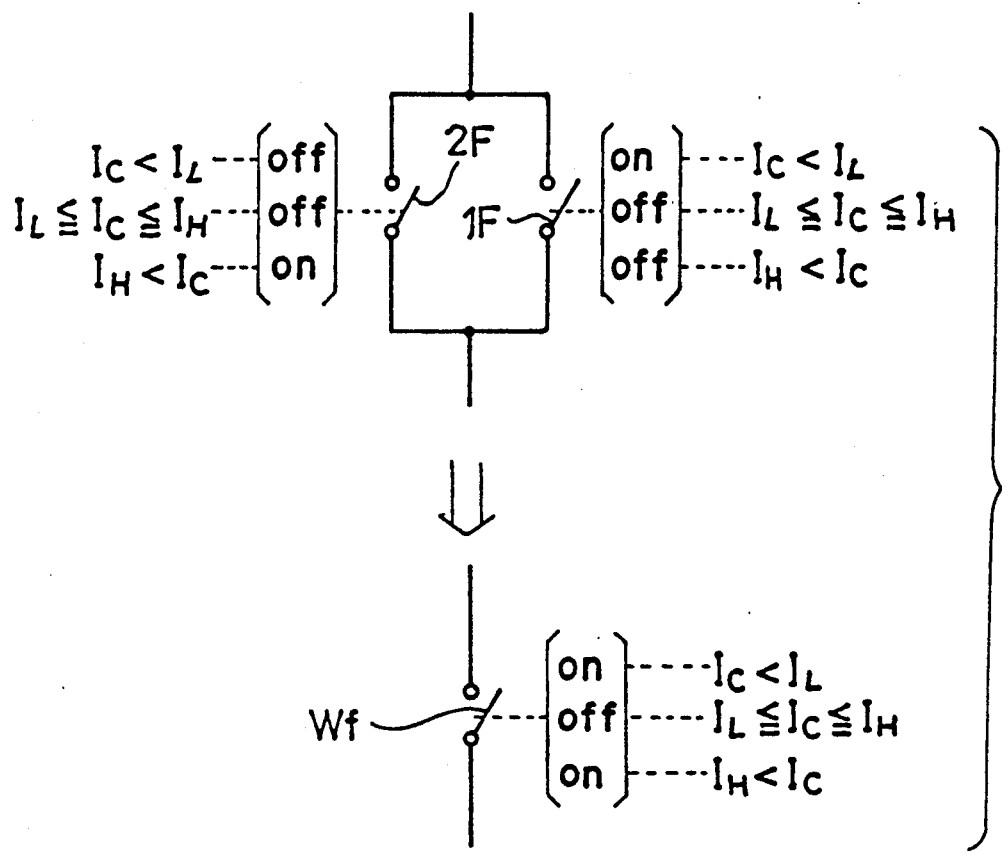
FIG. 25 is an explanatory view showing the manner in which a window-OFF switch is realized by connecting two floating switches in parallel.

FIG. 25 illustrates the manner in which a window-OFF switch $W_f$ having the foregoing function is realized by connecting the two floating threshold switches 1F, 2F in parallel. The floating switch 1F is held in the on state when $I_C < I_L$ holds and turns off when the condition $I_L \leq I_C$ is established. The floating switch 2F turns off when $I_C \leq I_H$ holds and turns on when the condition $I_H \leq I_C$ is established. A window-OFF switch $W_f$ which turns off only when $I_L \leq I_C \leq I_H$ holds is realized by connecting the switches 1F, 2F in parallel, that is, by adopting a connection for OR logic.

FIG. 26 illustrates floating window-OFF switching circuits of various forms.

FIG. 26(A) illustrates a circuit in which N-MOSFETs are used as the two floating switches 1F, 2F constructing the window-OFF switch $W_f$. The floating switches 1F, 2F are connected in parallel and the resulting parallel circuit is connected between the current source 2 and output terminal 4. The floating switch 1F is controlled by the current comparator $C_1$ and the floating switch 2F is controlled by the current comparator $C_2$. The currents outputted by the non-linear current sources 211, 212 and 221, 222 in the current comparators $C_1$ and $C_2$, respectively, are indicated by $I_C$, $I_L$, $I_H$ alongside the corresponding current sources.

The potential at the node 215 in the current comparator $C_1$ attains the high level and the floating switch 1F turns on only when $I_L \leq I_C$ holds. In the current comparator $C_2$, the potential at the node 225 attains the high level and the floating switch 2F turns on only when $I_H \leq I_C$ holds. Accordingly, the window-OFF switch $W_n$ turns on when $I_C \leq I_L$ or $I_H < I_C$ holds, so that the current J generated by the current source 2 appears at the output terminal 4 as the output current $I_0$. The switch $W_n$ is held in the off state when $I_L \leq I_C \leq I_H$ holds.

FIG. 26(B) illustrates an embodiment in which P-MOSFETs are used as the two floating switches 1F, 2F constructing the window-OFF switch $W_f$. It will be understood that the function of the window-OFF switch shown in FIG. 24 is implemented by the circuit of FIG. 26(B).

FIGS. 26(C) and 26(D) illustrate floating window-OFF switching circuits in which the window-OFF switch $W_f$ is constituted by C-MOSFETs. Comparing these circuits with the circuits of FIGS. 26(A) and 26(B) will make it apparent that they implement the desired function.

In the circuits of FIGS. 23 and 26, a voltage source (including the output side of the circuit constituting the preceding stage can be provided instead of the current source 2 and a voltage signal from the voltage source can be turned on and off by the window switch.

Several applications of floating window switching circuits will now be described.

(10) Literal circuits and closed interval circuits

The operation of a literal circuit in analog and multivalued logic of radix or base r is expressed by the following:

$$\begin{array}{l}{}^{a}x^{b} = \begin{cases} r - 1 & (a \leq x \leq b) \\ 0 & \text{(otherwise)} \end{cases}}\\{\phantom{{}^{a}x^{b}} = \begin{cases} r - 1 & (a - 0.5 \leq x \leq b + 0.5) \\ 0 & \text{(otherwise)} \end{cases}}\end{array} \quad \begin{array}{c}(9\text{-}1)\\ \\ \\ (9\text{-}2)\end{array}$$

In the above, a and b are any positive value less than the radix r, and a<b. Also, (9-1) is a general expression commonly used in both analog operations and multivalued logic operations, and (9-2) is an expression for a case where a noise margin of ±0.5 is taken into account in multivalued logic.

Figure 27:
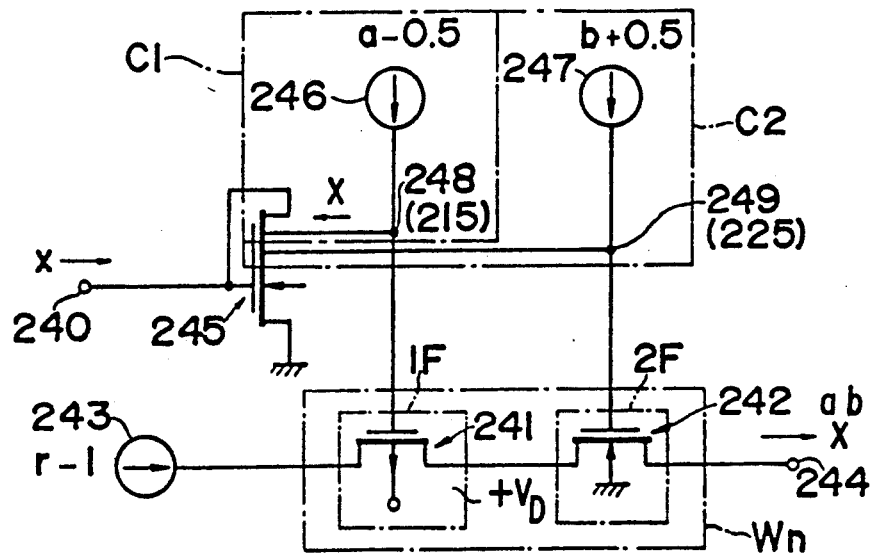
FIG. 27 is a circuit diagram illustrating an embodiment of a literal circuit.

An embodiment of a literal circuit in which the noise margin expressed by (9-2) is taken into account is illustrated in FIG. 27. Among the floating window-ON switching circuits mentioned above, the literal circuit of FIG. 27 utilizes the switching circuit having the form shown in FIG. 23(C).

Two floating switches 241, 242 constituting the window-ON switch $W_n$ are connected in series between a current source 243, which applies an in-flow input current representing a value of r−1, and an output terminal 244. The switches 241, 242 are C-MOSFETs.

The input x is applied to the input terminal 240 as an in-flow input current representing the value x. The input terminal 240 is connected to the gate of a two-output current mirror (or current distributor) 245 comprising a MOSFET. The two output drains of the two-output current mirror 245 each produce an in-flow current of value x.

One output drain of the two-output current mirror 245 is connected to a current source 246, which provides an in-flow input current of value (a−0.5), at a node 248, the latter being connected to the gate of the floating switch 241. A portion of the two-output current mirror 245, the current source 246 and the node 248 construct the current comparator $C_1$. The node 248 corresponds to the node 215 in FIG. 23(C). Further, the current source 246 corresponds to the current source 211 that applies the lower threshold current $I_L$, and a portion of the two-output current mirror 245 corresponds to the current source 212 that supplies the control current $I_C$.

Likewise, the other output drain of the two-output current mirror 245 is connected to a current source 247, which provides an in-flow input current of value (b+0.5), at a node 249, the latter being connected to the gate of the other floating switch 242. A portion of the two-output current mirror 245, the current source 247 and the node 249 construct the other current comparator $C_2$. It will be understood that the current source 247 corresponds to the current source 221 [FIG. 23(C)] that applies the higher threshold current $I_H$.

Accordingly, the window-ON switch $W_n$ turns on only when the relation (a−0.5)≤x≤(b+0.5) holds, so that a current from the current source 243 and representing the value of (r−1) flows out of the output terminal 244 as an output current representing $^{a}x^{b}$. Otherwise the output current is 0.

Figure 28:
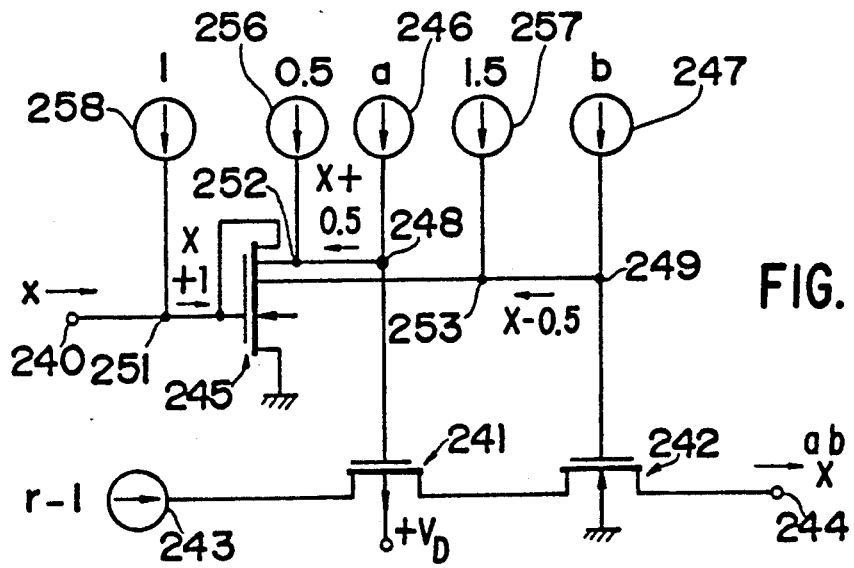
FIG. 28 is a circuit diagram illustrating an embodiment of an improved literal circuit.

The circuit of FIG. 27 is not applicable in a case where a <0.5 holds. A circuit improved so as to be applicable to any value of a is illustrated in FIG. 28, in which portions the same as those shown in FIG. 27 are designated by like reference characters.

A current source 258 supplying a current representing a value of logic 1 is connected to the input side of the two-output current mirror 245 at a node 251, where the current representing the value of logic 1 is added to the current representing the input x. A current representing the value of x+1 is applied to the two-output current mirror 245, the two output drains of which each deliver an in-flow output current of value x+1.

The current source 246 here is altered into a current source for applying an input current representing the value of a. Provided between one output drain of the two-output current mirror 245 and the node 248 is a node 252 into which a current representing a value of 0.5 flows from a current source 256. Accordingly, a current representing a value of x+0.5 flows from the node 248 to the node 252. Since the potential at the node 248 falls to the low level when (x+0.5)≥a holds, the floating switch 241 turns on at this time. Note that (x+0.5)≥a can be rewritten x≥(a−0.5).

The current source 247 is altered into one for supplying an input current representing the value of b. Provided between the other output drain of the two-output current mirror 245 and the node 249 is a node 253 into which a current representing a value of 1.5 flows from a current source 257. Accordingly, a current representing a value of x−0.5 flows from the node 249 to the node 253. Since the potential at the node 249 attains the high level when b≥(x−0.5) holds, the floating switch 242 turns on at this time. Note that b≥(x−0.5) can be rewritten (b+0.5)≥x.

Accordingly, the window-ON switch $W_n$ comprising the floating switches 241, 242 turns on when x≥(a−0.5) and (b+0.5)≥x hold, so that the operation of (9-2) is performed.

If the value of r−1 that determines the value of the output current from the current source 243 is made variable, then the circuits of FIGS. 27 and 28 can be applied to multivalued logic having any radix. Further, if the output currents from the current sources 246, 247 in the circuit of FIG. 27 are assumed to be currents representing the values of a and b, respectively, then the circuit will be a literal circuit in which noise margin is not taken into account.

It is also permissible to adopt a voltage source instead of the current source 243 in the circuits of FIGS. 27 and 28.

Figure 29:
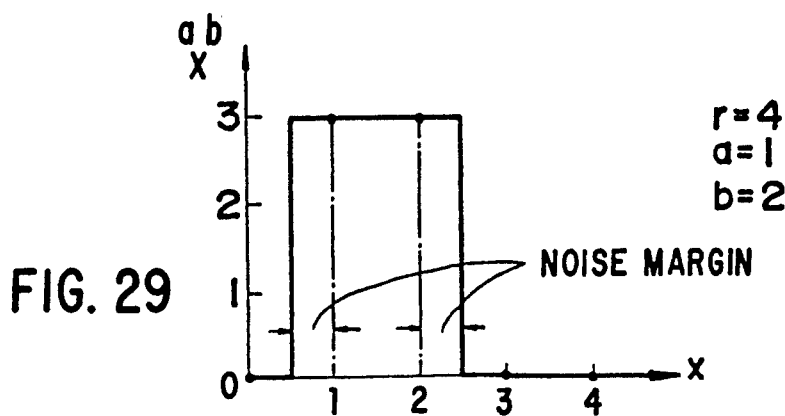
FIG. 29 is a graph showing an input/output characteristic of these circuits.

FIG. 29 illustrates an input/output characteristic of a literal circuit, in which a noise margin of ±0.5 is taken into account, for a case where r=4, a=1, b=2.

If the output current for the current source 243 is assumed to represent a value of 1 in FIGS. 27 and 28, these circuits will be closed interval circuits. The operation of a closed interval circuit is expressed by the following:

$$\begin{matrix}[a\ b]\\x\end{matrix} = \begin{cases} 1 & (a \leq x \leq b) \\ 0 & \text{(otherwise)} \end{cases} \qquad (10\text{-}1)$$

$$= \begin{cases} 1 & (a - 0.5 \leq x \leq b + 0.5) \\ 0 & \text{(otherwise)} \end{cases} \qquad (10\text{-}2)$$

(11) Equivalence (delta literal J-function) circuits and delta interval circuits Equivalence is also referred to as a "delta literal J function" and is expressed as follows:

$$\begin{matrix}k\\x\end{matrix} = J_k(x)$$

$$= \begin{cases} r - 1 & (x = k) \\ 0 & (x \neq k) \end{cases} \qquad (11\text{-}1)$$

$$= \begin{cases} r - 1 & (k - 0.5 \leq x \leq k + 0.5) \\ 0 & \text{(otherwise)} \end{cases} \qquad (11\text{-}2)$$

Figure 30:
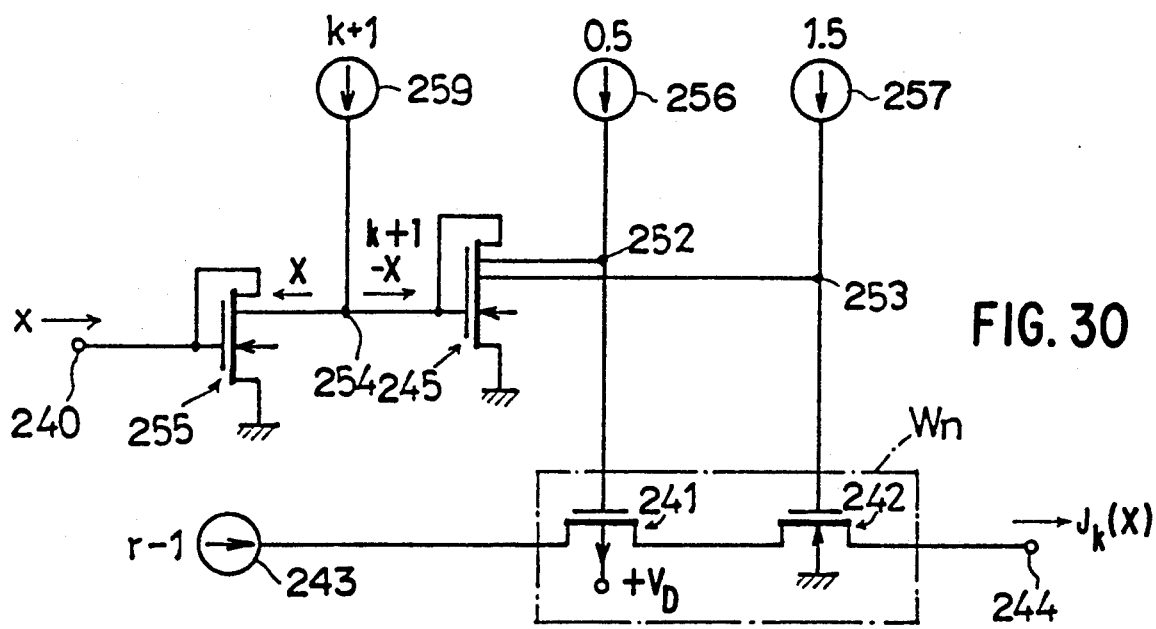
FIG. 30 is a circuit diagram illustrating an embodiment of an equivalence circuit.

FIG. 30 illustrates an embodiment of an equivalence circuit taking into account a noise margin of ±0.5 expressed by (11-2). The circuit closely resembles the literal circuit shown in FIG. 28. Portions in FIG. 30 the same as those shown in FIG. 28 are designated by like reference characters.

An input current flowing into the input terminal 240 and representing the value of x is reversed in direction by a current mirror 255. Provided between the current mirror 255 and the two-output current mirror 245 is a node 254 into which a current representing a value of $k+1$ flows from a current source 259. Accordingly, the operation $k+1-x$ is performed at the node 254 and a current representing this value flows from the node 254 to the gate of the two-output current mirror 245. Since the current mirror 245 acts as a reverse current preventing diode when the relation $(k+1-x)<0$ holds, no current flows from the current mirror 245 to the node 254.

An in-flow output current of value $k+1-x$ appears at each of the two output drains of the two-output current mirror 245. The current source 256, a portion of the two-output current mirror 245 and the node 252 construct a current comparator for controlling the floating switch 241. Likewise, the current source 257, a portion of the two-output current mirror 245 and the node 253 construct a current comparator for controlling the floating switch 242. Accordingly, the window-ON switch $W_n$ comprising the two floating switches 241, 242 turns on only when $0.5 \leq (k+1-x) \leq 1.5$, namely when $(k-0.5) \leq x \leq (k+0.5)$; holds, so that a current representing the value of $r-1$ produced by the current source 243 appears at the output terminal 244 through the window-ON switch $W_n$ when this switch is in the on state. The function expressed by (11-2) is thus implemented.

If the inequality $(k+1-x)<0$ holds, $(k+1)<x$ will hold and x will not fall in the range $(k-0.5) \leq x \leq (k+0.5)$. At this time the output current from the two-output current mirror 245 will be 0 and the node 252 will be at the low level, so that the floating switch 241 will be held in the off state.

Figure 31:
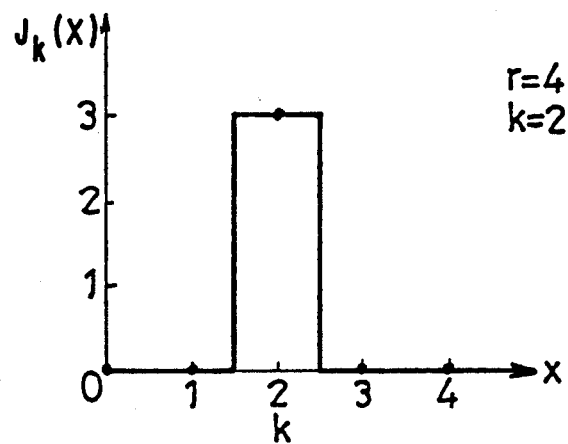
FIG. 31 is a graph illustrating input/output characteristics of the equivalence circuit.

FIG. 31 illustrates the input/output characteristic of the equivalence circuit shown in FIG. 30 for a case where r=4, k=2.

It goes without saying that the value of r of current source 243 and the value of k of current source 259 in FIG. 30 can be set at will. The function expressed by (11-1) can be implemented by making the output currents of the current sources 256, 257 sufficiently close to 1.

Further, with regard to FIG. 30, the current source 259 may be deleted, the input current of value x may be applied directly to the two-output current mirror 245, and the output currents of the current sources 256, 257 may be made values representing $k-0.5$ and $k+0.5$, respectively. In addition, the current source 243 may be replaced by a voltage source.

If the output current of the current source 243 in FIG. 30 represents a value of 1, this circuit will serve as a delta interval circuit. The operation of a delta interval circuit is expressed as follows:

$$\begin{matrix}[kk]\\x\end{matrix} \equiv \begin{cases} 1 & (x = k) \\ 0 & (x \neq k) \end{cases} \qquad (12\text{-}1)$$

$$= \begin{cases} 1 & (k - 0.5 \leq x \leq k + 0.5) \\ 0 & \text{(otherwise)} \end{cases} \qquad (12\text{-}2)$$

(12) Bilateral T-gates

A T-gate is a very useful circuit in a multivalued logic circuit system because it is functionally complete in multivalued logic. More specifically, the importance of the T-gate is that all multivalued logic functions can be realized by a combination of T-gates.

A T-gate circuit constituted by 26 transistors, 23 diodes and 22 resistors has been presented in a paper entitled "Static-Hazard-Free T-Gate for Ternary Memory Element and Its Application to Ternary Counters" by Tatsuo Higuchi and Michitaka Kameyama in the *IEEE Transactions on Computers*, vol. C-26, No. 12, pp. 1212–1221 (December, 1977). Also, an I²L T-gate of simple construction is described in the above-mentioned paper by T. Tich Dao.

However, the input and output terminals of these conventional T-gates are decided permanently in advance and signals can flow in only one direction. Bidirectional T-gates have yet to be realized.

A novel bilateral T-gate (bidirectional T-gate) that permits bidirectional flow of voltage or current signals will be described hereinbelow. The T-gate has a wide variety of applications by virtue of its bidirectional nature.

Figure 32:
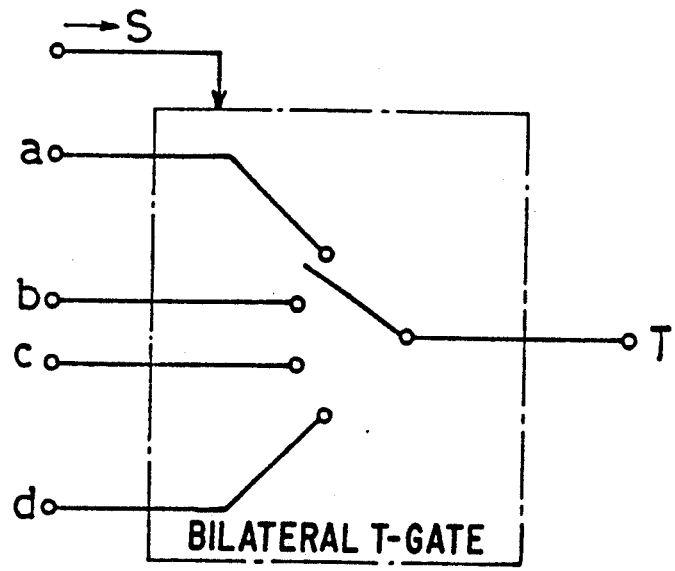
FIG. 32 is an equivalent circuit illustrating the function of a bilateral T-gate.

FIG. 32 illustrates a typical function of the bilateral T-gate. The radix r is set to 4 and the function of the T-gate is equivalent to that of a changeover switch. Any one of four terminals a, b, c and d is connected to another terminal T in dependence upon the value of a select current S applied to a select terminal. If one of the terminals a through d is adopted as an input terminal, the terminal T serves as an output terminal. Conversely, if one of the terminals a through d is adopted as an output terminal, the terminal T serves as an input terminal. A signal may flow from the any of the terminals a through d to the terminal T or in the opposite direction in either the current or voltage mode.

Figure 33:
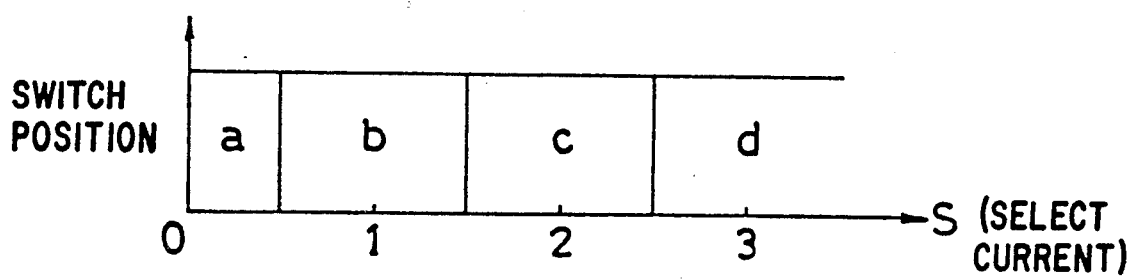
FIG. 33 is a graph illustrating the operation of a bilateral T-gate.

FIG. 33 illustrates the relation between the select current S and the terminals a through d selected thereby.

Terminal a is selected when $S<0.5$ holds, terminal b when $0.5<S<1.5$ holds, terminal c when $1.5<S<2.5$ holds, and terminal d when $2.5<S$ holds, wherein 0.5, 1.5 and 2.5 are threshold values in multivalued logic.

Figure 34:
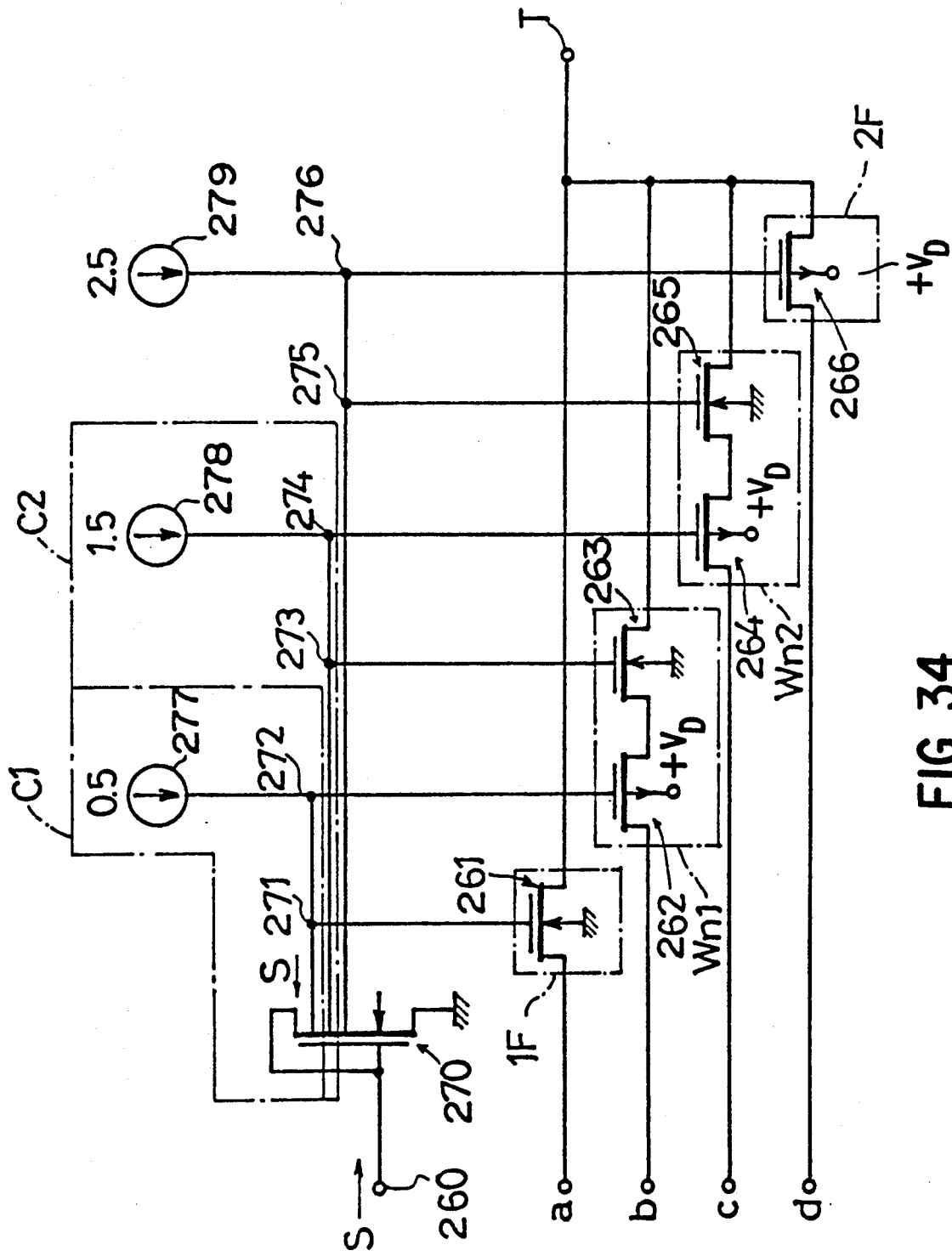
FIG. 34 is a circuit diagram illustrating an example of a bilateral T-gate.

An embodiment of a bilateral T-gate having this function is illustrated in FIG. 34. The circuit utilizes the floating threshold switch shown in FIG. 4 and the window-ON switch illustrated in FIG. 23(C).

An N-MOSFET (floating switch) 261 constituting a first floating switch 1F is connected between the terminal a and the terminal T, and two floating switches 262, 263 constituting a first window-ON switch $W_{n1}$ are serially connected between the terminal b and the terminal T. The switches 262, 263 are C-MOSFETs. Likewise, two floating switches 264, 265 constituting a second window-ON switch $W_{n2}$ are serially connected between the terminal c and the terminal T, and a second floating switch 266 (2F) is connected between the terminal d and the terminal T.

A select current S is applied to an input terminal 260 as an in-flow current. The input terminal 260 is connected to the gate of a three-output current mirror (or current distributor) 270. An in-flow current of value S is outputted from each of the three output drains of the three-output current mirror 270.

The first output drain of three-output current mirror 270 is connected to a current source 277 which applies an in-flow input current of value 0.5, and two nodes 271, 272 are provided between the current mirror 270 and the current source 277. The node 271 is connected to the gate of the floating switch 261, and the node 272 is connected to the gate of the floating switch 262. A portion of the three-output current mirror 270, the current source 277 and the node 271 or 272 constitute the current comparator $C_1$. The current comparator $C_1$ controls the first floating switch 261 (1F) and is also used to control one of the floating switches, namely the switch 262, of the first window-ON switch $W_{n1}$. Since a floating switch is controlled by a voltage signal, it is possible to thus control two or more floating switches simultaneously by the output of a single current comparator, as set forth earlier.

If the inequality $S<0.5$ holds, the high-level potential prevails at the nodes 271, 272, as a result of which the floating switch 261 (1F) is in the on state, thereby connecting the terminal a and the terminal T at this time. Further, if $S<0.5$ holds, the other window-ON switches $W_{n1}$, $W_{n2}$ and floating switch 266 (2F) are in the off state, as will be understood later, so that the other terminals b through d are not connected to the terminal T.

When the relation $S>0.5$ is established, the nodes 271, 272 attain the high-level potential and, hence, the floating switch 261 turns off to isolate the terminal a from the terminal T. Further, when $S\geq 0.5$ is established, the floating switch 262 constituting the first window-ON switch $W_{n1}$ turns on.

The second output drain of the three-output current mirror 270 is connected to a current source 278 which applies an in-flow input current of value 1.5, and two nodes 273, 274 are provided between the current mirror 270 and the current source 278. The node 273 is connected to the gate of the floating switch 263, and the node 274 is connected to the gate of the floating switch 264. A portion of the three-output current mirror 270, the current source 278 and the node 273 or 274 constitute the current comparator $C_2$.

The window-ON switch $W_{n1}$ and the current comparators $C_1$, $C_2$ correspond to the floating window-ON switching circuit shown in FIG. 23(C). The current source 277 corresponds to current source 211 providing the current $I_L$ of the lower threshold value, the current source 278 corresponds to current source 221 providing the current $I_H$ of the higher threshold value, and the current mirror 270 corresponds to the current sources 212,222 supplying the control current $I_C$. Accordingly, the window-ON switch $W_{n1}$ turns on only when the relation $0.5<S<1.5$ holds, thereby connecting the terminal b to the terminal T.

The third output drain of the three-output current mirror 270 is connected to a current source 279 which applies an in-flow input current of value 2.5, and two nodes 275, 276 are provided between the current mirror 270 and the current source 279. The node 275 is connected to the gate of the floating switch 265, and the node 276 is connected to the gate of the floating switch 266.

It will readily be understood that the second window-ON switch $W_{n2}$ turns on only when the relation $1.5\leq S<2.5$ holds, thereby connecting the terminal c to the terminal T.

Further, the node 276 assumes the low level when $2.5\leq S$ holds, so that the second floating switch 266 turns on to connect the terminal d to the terminal T.

Thus, the function of a bidirectional T-gate for $r=4$ is implemented.

It goes without saying that the threshold values for changing over the terminals a through d can be set at will by changing the values of the currents produced by the current sources 277 through 279. In addition, connecting window-ON switches between the terminals a, T and d, T in place of the floating switches 261, 262, respectively, will also make it possible to set the lower limit of the select current for connecting the terminal a to the terminal T as well as the upper limit of the select current for connecting the terminal d to the terminal T.

It is obvious that this bilateral T-gate can be expanded so as to be applicable to any radix r of 4 or more.

(13) Complement literal circuits

The operation of a complement literal circuit in analog and multivalued logic of radix r is expressed by the following:

$$\overline{\overset{a\ b}{x}} = \begin{cases} 0 & (a \leq x \leq b) \\ r-1 & \text{(otherwise)} \end{cases} \quad (13\text{-}1)$$

$$= \begin{cases} 0 & (a - 0.5 \leq x \leq b + 0.5) \\ r-1 & \text{(otherwise)} \end{cases} \quad (13\text{-}2)$$

In the above, a and b are any positive values less than the radix r, and $a<b$. Also, (13-1) is a general expression commonly used in both analog operations and multivalued logic operations, and (13-2) is an expression for a case where a noise margin of ±0.5 is taken into account in multivalued logic.

Figure 35:
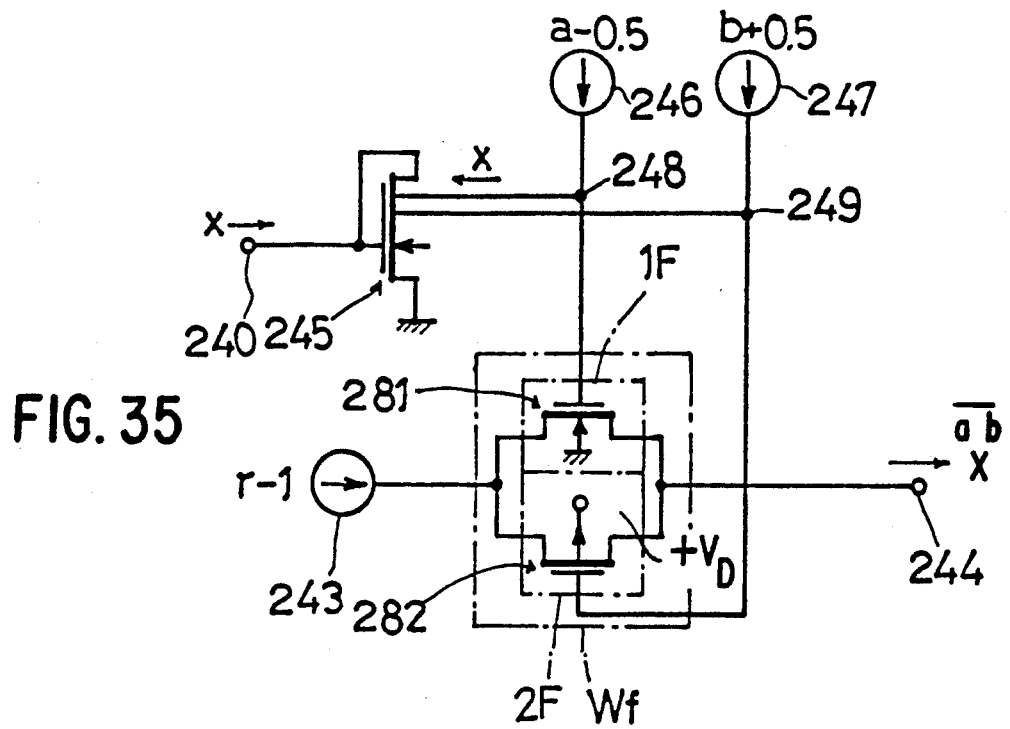
FIG. 35 is a circuit diagram showing an embodiment of a complement literal circuit.

An embodiment of a complement literal circuit in which the noise margin expressed by (13-2) is taken into account is illustrated in FIG. 35. As will be understood by comparing the complement literal circuit of FIG. 35 and the literal circuit of FIG. 27, the complement literal circuit is realized by substituting a window-OFF switch $W_f$ for the window-ON switch $W_n$ in the literal circuit. The window-OFF switch $W_f$ shown in FIG. 35 is a modification of that depicted in FIG. 26(C) and is constituted by C-MOSFETs. These are indicated at numbers 281, 282 and are connected in parallel. Portions the same as those shown in FIG. 27 are designated by like reference characters.

When $(a-0.5) \leq x \leq (b+0.5)$ holds, the window-OFF switch $W_f$ turns off and the output current from the output terminal 244 becomes 0. When $x < (a-0.5)$ or $x > (b+0.5)$ holds, the window-OFF switch $W_f$ turns on and a current representing a value of $(r-1)$ from the current source 243 flows out of the output terminal 244 as an output current representing a value $^ax^b$.

Figure 36:
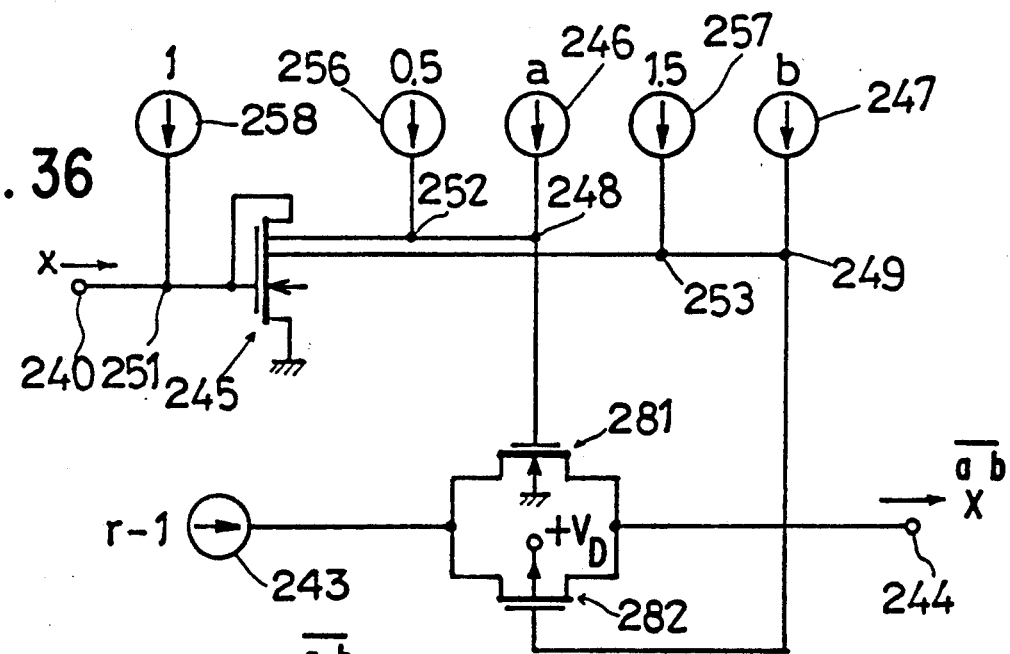
FIG. 36 is a circuit diagram showing an embodiment of an improved complement literal circuit.

The circuit of FIG. 35 cannot be applied in a case where the inequality $a < 0.5$ holds, just as in the circuit of FIG. 27. A circuit improved so as to be applicable to any value of a is illustrated in FIG. 36. The complement literal circuit of FIG. 36 is constructed by substituting a window-OFF switch for the window-ON switch in the literal circuit of FIG. 28. It will be understood that this circuit implements the function expressed by (13-2) above.

It goes without saying that if the value of $r-1$ that determines the value of the output current from the current source 243 is made variable, then the circuits of FIGS. 35 and 36 can be applied to multivalued logic having any radix. Further, if the output currents from the current sources 246, 247 in the circuit of FIG. 35 are assumed to be currents representing the values of a and b, respectively, then the circuit will be a complement literal circuit in which noise margin is not taken into account.

It is also permissible to adopt a voltage source instead of the current source 243.

Figure 37:
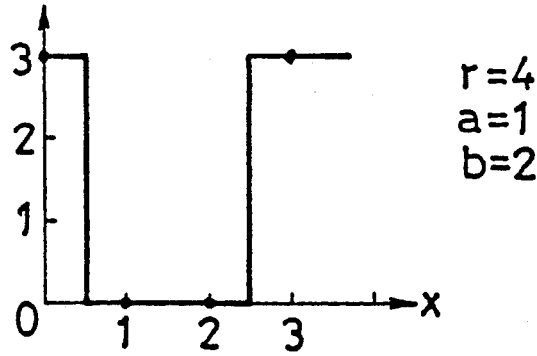
FIG. 37 is a graph showing an input/output characteristic of these circuits.

FIG. 37 illustrates an input/output characteristic of a complement literal circuit, in which a noise margin of ±0.5 is taken into account, for a case where $r=4$, $a=1$, $b=2$.

(14) h-Operator circuits

The operation of an h-operator circuit is expressed as follows:

$$h_k(x) = \begin{cases} 0 & (x = k) \\ r - 1 & (x \neq k) \end{cases} \quad (14\text{-}1)$$

$$= \begin{cases} 0 & (k - 0.5 \leq x \leq k + 0.5) \\ r - 1 & (\text{otherwise}) \end{cases} \quad (14\text{-}2)$$

Figure 38:
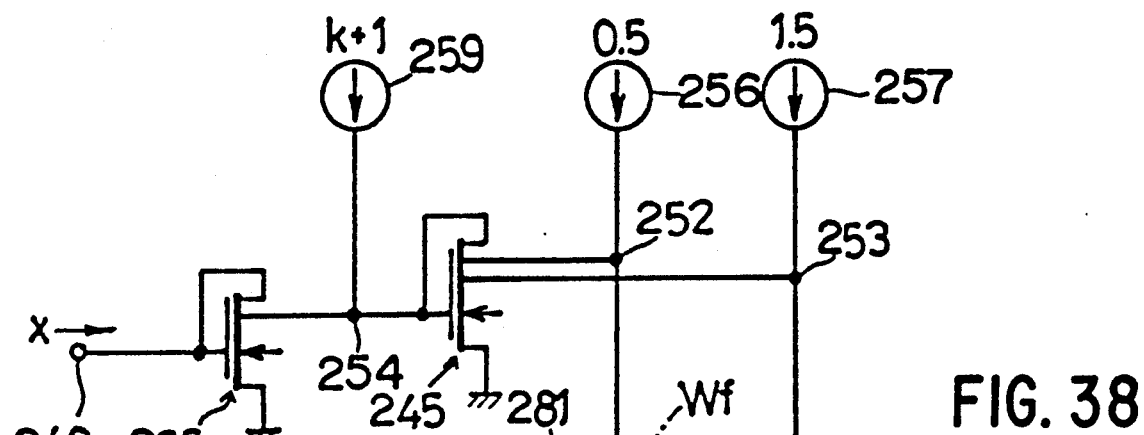
FIG. 38 is a circuit diagram illustrating an h-operator circuit.

FIG. 38 illustrates an embodiment of an h-operator circuit taking into account a noise margin of ±0.5 expressed by (14-2). As will be understood from a comparison with FIG. 30, the h-operator circuit is realized by substituting the window-OFF switch $W_f$ for the window-ON switch $W_n$ in the equivalence circuit of FIG. 30. Portions in FIG. 38 the same as those shown in FIG. 30 are designated by like reference characters.

The window-OFF switch $W_f$ turns off when the relation $(k-0.5) \leq x \leq (k+0.5)$ holds, whereby the output current at the output terminal 244 becomes 0. In other cases, namely when $x < (k-0.5)$ or $x > (k+0.5)$ holds, the current outputted by the current source 243 and representing the value of $r-1$ appears at the output terminal 244 via the window-OFF switch $W_f$ in the on state.

Figure 39:
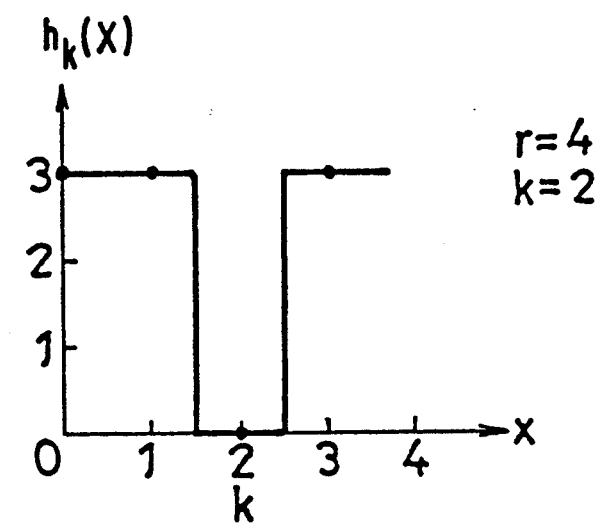
FIG. 39 is a graph showing an input/output characteristic of an h-operator circuit.

FIG. 39 illustrates the input/output characteristic of the h-operator circuit shown in FIG. 38 for a case where $r=4$, $k=2$.

It goes without saying that the value of r of current source 243 and the value of k of current source 259 in FIG. 38 can be set at will. The function expressed by (14-1) can be implemented by making the output currents of the current sources 256, 257 infinitely close to 1.

Further, with regard to FIG. 38, the current source 259 may be deleted, the input current of value x may be applied directly to the two-output current mirror 245, and the output currents of the current sources 256, 257 may be made values representing $k-0.5$ and $k+0.5$, respectively. In addition, the current source 243 may be replaced by a voltage source.

Figure 40:
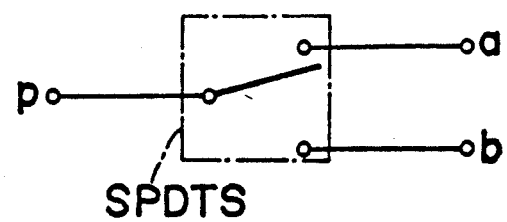
FIG. 40 is a view showing a typical function of an SPDT switch.

(15) Threshold (floating) single-pole, dual-throw (herafter referred to as "SPDT") switching circuits FIG. 40 illustrates a typical function of an SPDT switch (hereafter referred to as an "SPDTS"). One terminal is indicated at p, and two other terminals to be connected to terminal p via an SPDTS are designated a and b. An SPDTS is, as it were, a changeover switch in which the terminal p is changed over to either the terminal a or b to effect a connection that is held at all times. The SPDTS enables a signal to flow from terminal p to terminal a or b and, conversely, enables a signal to be transmitted from terminal a or b to terminal p. Thus, the SPDTS is bidirectional. Both voltage and current signals can be transmitted. The SPDTS can also be referred to as a two-valued bilateral (bidirectional) T-gate.

Figure 41:
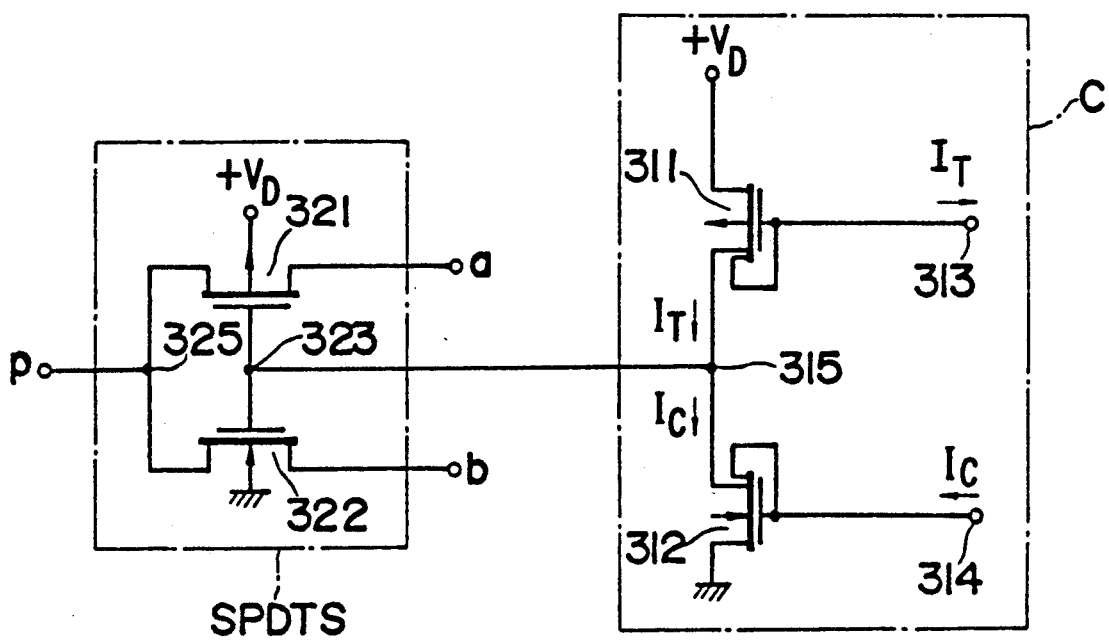
FIG. 41 is a circuit diagram showing a threshold SPDT switching circuit.

FIG. 41 illustrates a threshold SPDT switching circuit.

The SPDTS is constituted by two FETs 321, 322, which are of the C-MOS type. One terminal (source or drain) of the FET 321 is connected to the like terminal of the FET 322 at a node 325, which is connected in turn to one terminal p. Another terminal (source or drain) of FET 321 is connected to the terminal a, and another terminal (source or drain) of FET 322 is connected to the terminal b. The gates of FETs 321, 322 are connected to each other at a node 323. A control voltage produced by the current comparator C is applied to the node 323 to control the on/off action of the FETs 321, 322. Though it is preferred that the threshold voltages of the control voltage applied to the gates for switching the FETs from the on to the off state or from the off to the on state be set equal to each other at the FETs, this is not strictly necessary provided that the control voltage is two-valued.

The current comparator C is the same as that shown in FIG. 3. A threshold current $I_T$ is applied to an input terminal 313 instead of the current $I_1$, and a control current $I_C$ is applied to an input terminal 314 instead of the current $I_2$.

If the control current $I_C$ is smaller in magnitude than the threshold current $I_T$ (i.e., $I_C < I_T$, the potential at a node 315 attains the high level. This high-level voltage is applied to the gates of FETs 321, 322 through the node 323, so that FET 322 turns on and FET 321 turns off. As a result, terminal p and terminal b are connected to each other.

Conversely, if the control current $I_C$ is larger in magnitude than the threshold current $I_T$ (i.e., $I_C > I_T$), the potential at node 315 assumes the low level so that FET 321 turns on and FET 322 turns off. As a result, terminal p and terminal a are connected to each other.

It will be understood that terminals a and b are switched between depending upon whether the control current $I_C$ is larger or smaller than the threshold current $I_T$.

Figure 42:
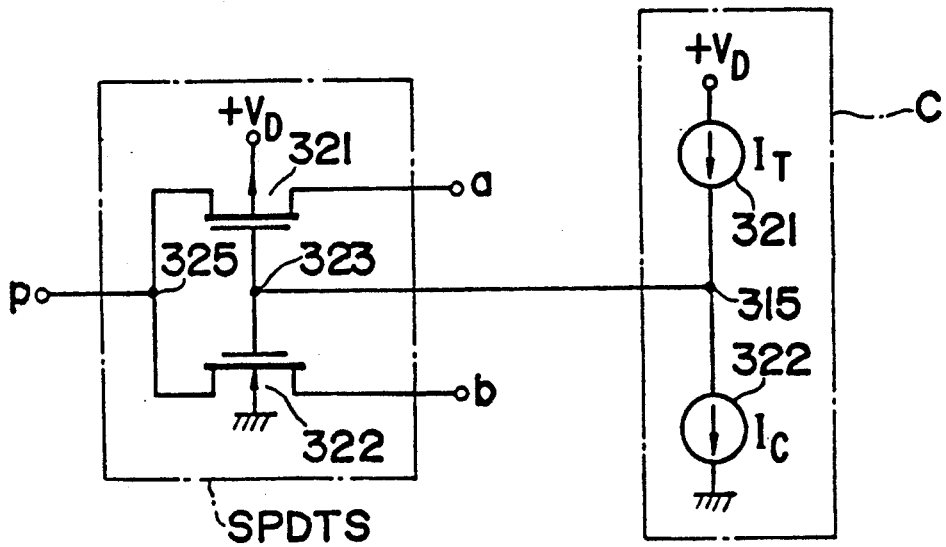
FIG. 42 is a circuit diagram illustrating a threshold SPDT switching circuit in model form.

FIG. 42 illustrates the current comparator C in model form, which comparator is the same as that shown in FIG. 4(A).

It will be understood that the SPDTS shown in FIG. 42 will operate in a manner which is the opposite of that described above if the current sources 321, 322 are interchanged. Likewise, the SPDTS will operate in a manner which is the opposite of that described above if the currents $I_T$, $I_C$ applied to the terminals 313, 314 are interchanged.

(16) Decoders

A decoder is for converting a current signal representing a logical value in multivalued logic or a current signal representing an analog quantity into a two-valued plural bit voltage signal corresponding to these values. A decoder is capable of performing a multiple value (analog)/binary conversion.

Let us begin by describing the simplest conversion, namely a conversion from four values to two values of two bits each.

Figures 43, 44:
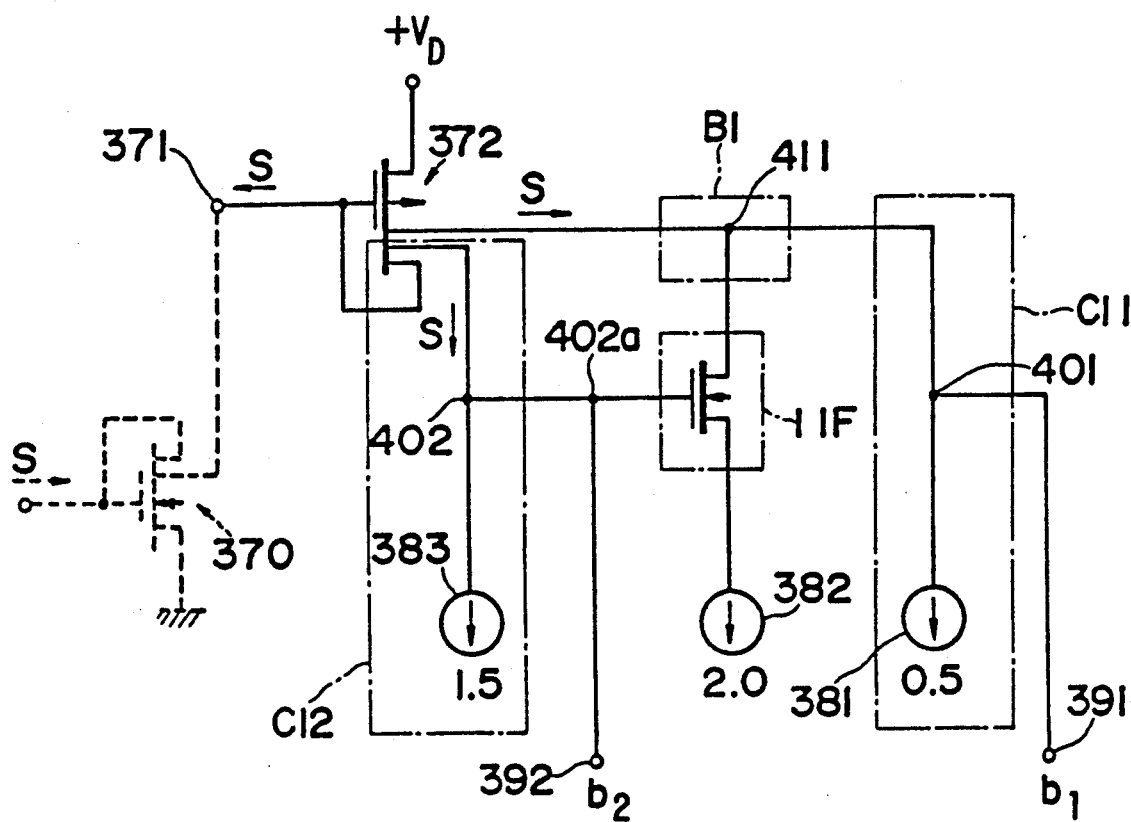
FIG. 43 is a view showing the principle of a quaternary/two-bit binary conversion.
FIG. 44 is a circuit diagram illustrating an embodiment of a quaternary/binary converter (decoder) circuit.

FIG. 43 is a view useful in describing the principle of such a quaternary/two-bit binary conversion. A quaternary signal is represented by S, and the bits of a two-bit binary signal are represented by $b_1$ and $b_2$. The quaternary signal S takes on values of 0, 1, 2 and 3. The bits $b_1$, $b_2$ of the binary signal take on two values represented by H (high level or 1) and L (low level or 0).

Let a second threshold value (the first threshold value will be described below) be 1.5, in which case the four logical values of the quaternary signal S can be divided into two groups depending upon this threshold value and the two groups can be made to correspond to the logical values H, L of bit $b_2$ of the binary signal. More specifically, among the logical values of the quaternary signal S, the logical values 2, 3 larger than the threshold value 1.5 are made to correspond to the logical value H of bit $b_2$, and the logical values 0, 1 smaller than 1.5 are made to correspond to the logical value L of bit $b_2$.

Let the first threshold value be 0.5. Now the logical values 0 and 1 of the quaternary signal S can be differentiated from each other by the threshold value 0.5, whereby the logical values 0 and 1 can be made to correspond to L and H, respectively, of bit $b_1$ of the binary signal. Further, if 2 is subtracted from each of the logical values 2 and 3 of the quaternary signal S, then these logical values will become 0 and 1, respectively. Therefore, by using the first threshold value 0.5 in the above fashion, the logical values 2 and 3 can be made to correspond to L and H, respectively, of bit $b_1$ of the binary signal; i.e., $b_1 = L$, $b_1 = H$.

Thus, the logical values 0, 1, 2 and 3 of the quaternary signal S are converted into logical values LL, LH, HL, HH of the respective bits $b_2 b_1$ of the binary signal by using the two threshold values 0.5 and 1.5.

FIG. 44 illustrates an embodiment of a decoder for performing the above-described quaternary/binary conversion.

The quaternary signal S is applied to an input terminal 371 as an out-flow input current representing the particular logical value. The input terminal 371 is connected to the gate of a two-output current mirror (current distributor) 372 comprising a P-MOSFET. Accordingly, an out-flow current the same as that of the quaternary signal S is outputted by each of the two output drains of the two-output current mirror 372.

The first output drain of the two-output current mirror 372 is connected via nodes 411, 401 to a current source 381 which generates an out-flow input current equivalent to the threshold value 0.5. The node 401 is connected to an output terminal 391, which is for the bit $b_1$ of the binary signal. The second output drain of the two-output current mirror 372 is connected via a node 402 to a current source 383 for applying an out-flow input current equivalent to the threshold value 1.5. The node 402 is connected to an output terminal 392, which is for the bit $b_2$ of the binary signal.

Also provided is a current source 382 for generating an minuend. The current source 382 is connected to a floating switch 11F comprising an N-MOSFET. The switch 11F is controlled by the potential at the node 402. A node 411 constitutes a subtractor B1.

A portion which includes the second output drain of the two-output current mirror 372 the current source 383 and the node 402 constitute a second current comparator $C_{12}$ (the first current comparator will be described below). The circuit comprising the current comparator $C_{12}$ and the floating switch 11F corresponds to the floating threshold switching circuit shown in FIG. 3 or FIG. 4(A).

If the logical value (which will be represented by S for convenience) of the quaternary signal S is greater than 1.5, the potential at the node 402 will attain the high level and, hence, the bit $b_2$ of the binary signal will be H. The floating switch 11F turns on at this time. Conversely, if $S < 1.5$ holds, the condition $b_2 = L$ is established and the switch 11F turns off.

A portion including the first output drain of the two-output current mirror 372, the current source 381 and the node 401 constitute a first comparator $C_{11}$.

When $S > 1.5$ holds, the floating switch 11F turns on, as mentioned above, so that an out-flow input current of 2.0 is applied to the node 411 by the current source 382. Accordingly, the operation $S - 2.0$ is performed at the node 411 and a current representing the result of the subtraction $S - 2.0$ flows in from the node 411. If $(S - 2.0) > 0.5$ holds in the first current comparator $C_{11}$, the potential at node 401 attains the high level and the condition $b_1 = H$ is established. Conversely, when $(S - 2.0) < 0.5$ holds, the condition $b_1 = L$ is established.

When $S < 1.5$ holds, the floating switch 11F turns off, so that a current representative of S flows in from the two-output current mirror 372. Accordingly, $b_1 = H$ holds at $S > 0.5$, and $b_1 = L$ at $S < 0.5$.

The quaternary/binary conversion shown in FIG. 43 is thus achieved.

In a case where the quaternary signal S is applied in the form of an in-flow input current, it will suffice if a current mirror 370 for reversing the direction of the current is connected to an earlier stage of the two-output current mirror 372, as shown by the dashed line in FIG. 44. Further, by constructing the two-output current mirror 372 of an N-MOSFET and the floating switch 11F of a P-MOSFET, and by slightly modifying the circuit of FIG. 44, as by reversing the direction of the current generated by the current source, it will be possible to deal with the in-flow input current S.

Expanding upon the foregoing approach to a quaternary/binary conversion will make it possible to convert a multivalued signal of value $2^N$ (where N is an integer of two or more) into an N-bit binary signal. Let us now describe such a conversion for N=3, namely an eight value/binary conversion.

FIG. 45 illustrates the principle of an eight value/binary conversion. An eight-value signal S takes on values of 0, 1, 2, 3, 4, 5, 6 and 7, and the binary signal is make up of the three bits $b_3$, $b_2$, $b_1$. A third threshold value 3.5 is provided, and the bit $b_3$ of the binary signal is obtained by discriminating the eight-value signal S on the basis of this threshold value. The other bits $b_2$, $b_1$ of the binary signal for the values 1 through 3 of signal S can be found through the method employed in the above-described quaternary/binary conversion. For the values 4 through 7 of signal S, these values will become 0 through 3 is 4 is subtracted from the signal S. Therefore, the binary signal bits $b_2$, $b_1$ can be found through the foregoing method.

Figure 46:
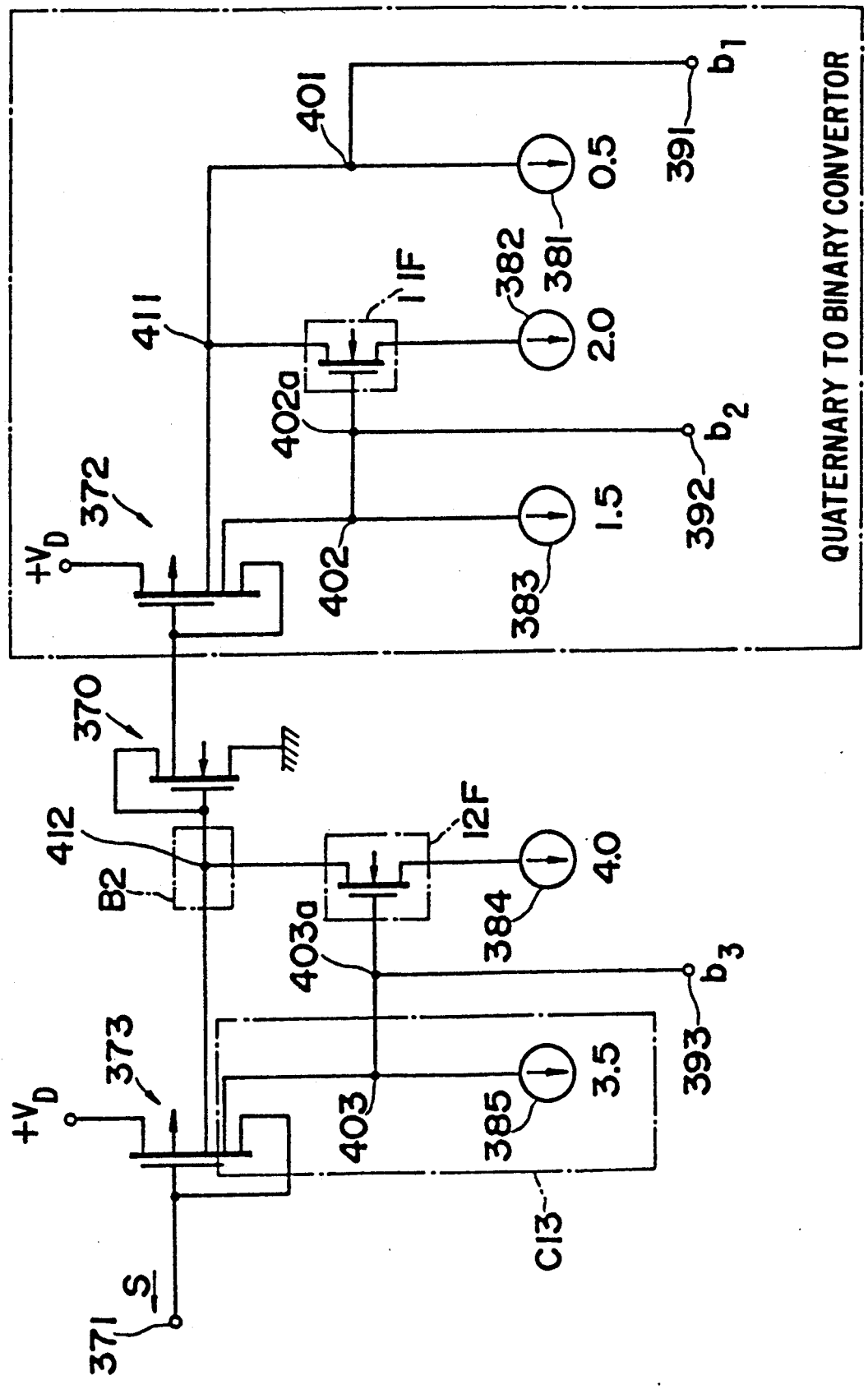
FIG. 46 is a circuit diagram illustrating an embodiment of an eight-value/binary converter (decoder) circuit.

FIG. 46 illustrates an embodiment of an eight value/three-bit binary converter.

Since the input terminal 371 is connected to the two-output current mirror 373, a current the value of which is the same as that of the eight-value signal S flows out from each of the two output drains of the current mirror 373. The first output drain of the two-output current mirror 373 is connected to the two-output current mirror 373 via a node 412 and the current mirror 370. The second output drain of the current mirror 373 is connected by a node 403 to a current source 385 considered to apply an out-flow input current equivalent to the threshold value 3.5. This second output drain, node 403 and current source 385 constitute a current comparator $C_1$. The potential at the node 403 appears at the output terminal 403 via a node 403a as the bit $b_3$ of the binary signal. Connected between a node 412 and a current source 384 for applying an out-flow input current of value 4.0 is a floating switch 12F controlled by the potential at the node 403. The node 412 constitutes a second subtractor $B_2$.

When S>3.5 holds, the potential at node 403 attains the high level, so that the condition $b_3 = H$ holds and the switch 12F turns on. The subtraction operation S−4.0 is performed at the node 412, a current of value S−4.0 is applied to the current mirror 372 through the current mirror 370 and a quaternary/binary conversion for $b_2$, $b_1$ is performed.

When S<3.5 holds, the potential at node 403 drops to the low level and the condition $b_3 = L$ is established. Since the switch 12F is in the off state, a current equivalent to the value of S flows into the quaternary/binary converter to effect the conversion into the bits $b_2$, $b_1$.

Figure 47:
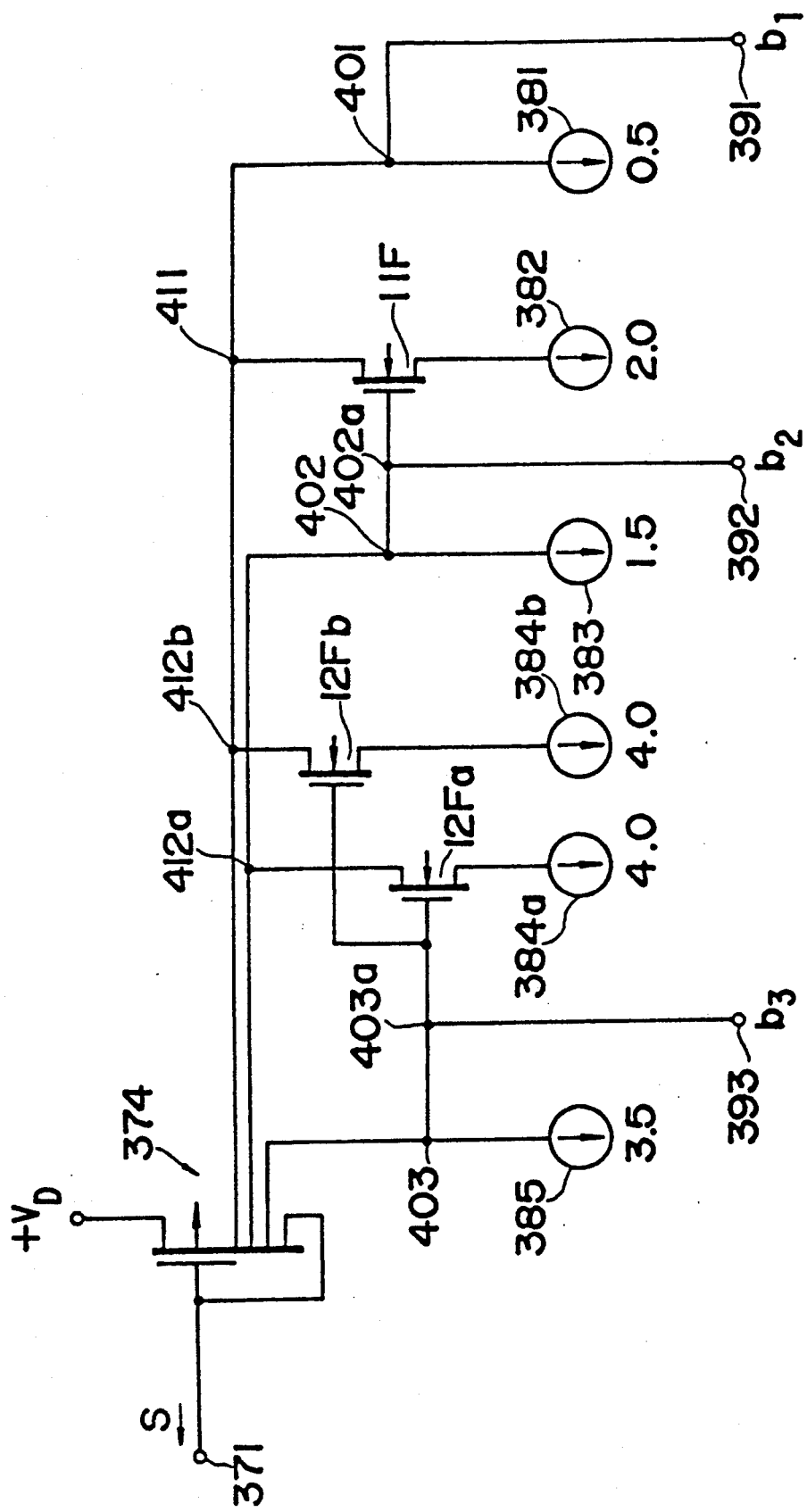
FIG. 47 is a circuit diagram illustrating another embodiment of this circuit.

FIG. 47 illustrates the circuit of FIG. 46 in simpler form. Here a three-output current mirror 374 is provided in place of the two-output current mirror 373. The current mirrors 370, 372 are deleted and are replaced by two nodes 412a, 412b for subtraction. Two current sources 384a, 384b each for generating a current of value 4.0 are provided, and floating switches 12Fa, 12Fb are connected between the current source 384a and the node 412a and between the current source 384b and the node 412b. These floating switches 12Fa, 12Fb are so controlled by the potential at the node 403 as to turn on or off simultaneously. It will readily be understood that the circuit of FIG. 47 operates in the same manner as the circuit of FIG. 46.

Though values of 0.5, 1.5 and 3.5 are employed as the threshold values in the foregoing description, it goes without saying that any value between 0 and 1, between 1 and 2 and between 3 and 4 can be employed as these threshold values. Furthermore, it will readily be understood that the foregoing approach can be expanded to cover a case where the input signal is an analog signal.

(17) Multivalued logic circuits

Embodiments of circuits for realizing the operation of several multivalued logic functions will now be described. These will serve as a premise for describing circuits that apply the foregoing decoder. All of the multivalued logic circuits described hereinbelow operate in the current mode and utilize multi-output current mirrors each of which comprises a MOSFET. A MOS multi-output current mirror is almost entirely free of error and is capable of constructing circuits for multivalued logic functions of ten values or more. Let r represent the radix or base.

(17.1) $\overline{MAX}$ circuit

A multivalued logic function $\overline{MAX}$ is also referred to as a multivalued NOR and is expressed by the following:

$$\overline{MAX}(x,y) = \begin{cases} \bar{x} & (x \geq y) \\ \bar{y} & (x < y) \end{cases} \tag{15}$$

where $$\bar{x} = r - 1 - x \tag{15-1}$$

$$\bar{y} = r - 1 - y \tag{15-2}$$

Figure 48:
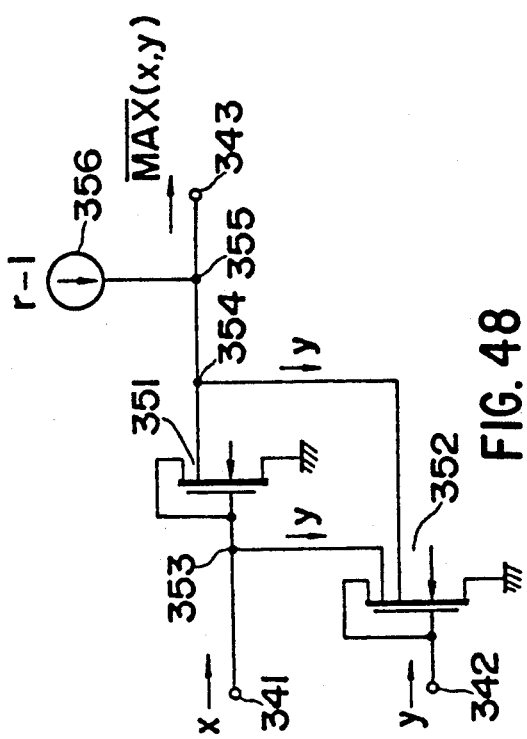

An embodiment of a circuit for implementing the multivalued logic function $\overline{MAX}$ is illustrated in FIG. 48.

In FIG. 48, currents representing inputs x and y are applied to respective input terminals 341, 342 as in-flow input currents. The input terminal 341 is connected to the gate of a current mirror 351 comprising an N-MOSFET, and the output drain of the current mirror 351 is connected to an output terminal 343. The input terminal 342 is connected to the gate of a two-output current mirror 352 comprising an N-MOSFET. Accordingly, an in-flow output current representing the value of y is generated by each of the two output drains of the current mirror 352. The first output drain of the two-output current mirror 352 is connected between the input terminal 341 and the input side of the current mirror 351 at a node 353, at which the subtraction operation x−y is performed. The second output drain of the two-output current mirror 252 is connected between the the output drain of the current mirror 351 and the output terminal 343 at a node 354. Provided between the node 354 and the output terminal 343 is a node 355, into which a current from a current source 356 and representing the value of r−1 flows.

If x<y holds, the result x−y of the subtraction performed at the node 353 becomes a negative value but, since the current mirror 351 acts as a diode for preventing a reverse current, the input current that flows into the current mirror 351 is 0. Accordingly, the output current from the current source 351 is 0. Since the out-flow input current of value y is applied to the node 354 from the second output drain of the two-output current mirror 352, a current equivalent to the value y flows from the node 355 to the node 354. Accordingly, the operation $(r-1)-y$ is performed at the node 355 and a current equivalent to the value $r-1-y=\bar{y}$ flows out of the output terminal 343.

If $x \geq y$ holds, the input current applied to the current mirror 351 becomes $x-y$ and the output current of current mirror 351 likewise becomes $x-y$. The operation $(x-y)+y$ is performed at the node 354 and a current equivalent to the value x flows from node 355 to node 354. Accordingly, the operation $(r-1)-x$ is performed at the node 355 and a current equivalent to the value $r-1-x=\bar{x}$ flows out of the output terminal 343.

Thus, an output representing the value of $\overline{MAX}$ expressed by (15) above is obtained as an out-flow output current.

(17.2) MAX circuit

A multivalued logic function MAX is defined by the following:

$$MAX(x,y) = \begin{cases} x & (x \geq y) \\ y & (x < y) \end{cases} \qquad (16)$$

Figure 49:
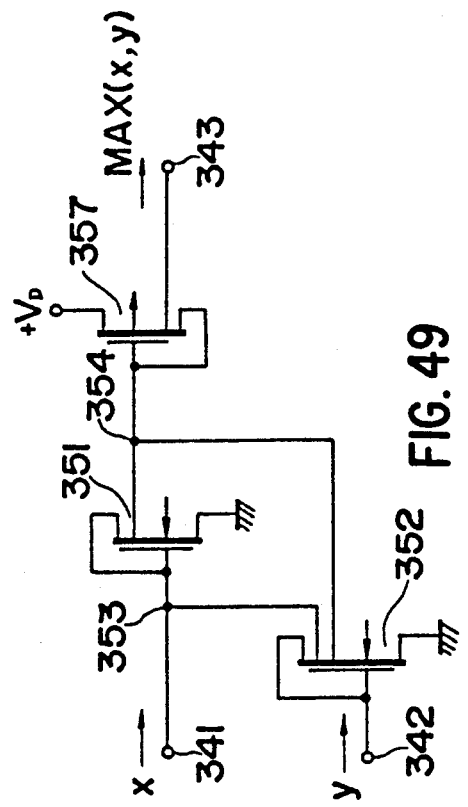
FIGS. 48, 49, 50 and 51 are circuit diagrams illustrating a $\overline{\text{MAX}}$ circuit, MAX circuit, $\overline{\text{MIN}}$ circuit and MIN circuit, respectively.

An embodiment of a MAX circuit is illustrated in FIG. 49.

This MAX circuit closely resembles the $\overline{MAX}$ circuit of FIG. 48, with the only difference being that the node 355 and current source 356 of FIG. 48 are replaced by a current mirror 357. Portions in FIG. 49 the same as those shown in FIG. 48 are designated by like reference characters.

If $x \geq$ holds, the operation $(x-y)+y=x$ is performed at the node 354, as set forth above, and a current equivalent to the value x is applied to the current mirror 357 as an out-flow input current. Accordingly, a current of value x flows out of the current mirror 357, namely out of the output terminal 343.

If $x<y$ holds, the output current of the current mirror is 0, so that an in-flow output current (of value y) from the second output drain of the two-output current mirror 352 drives the current mirror 357 directly. The output of the current mirror 357, namely the output from the output terminal 343, becomes an out-flow current representing the value of y.

The function of MAX expressed by (16) above is thus implemented.

(17.3) $\overline{MIN}$ circuit

A multivalued logic function $\overline{MIN}$, which is also referred to as a multivalued NAND, is defined by the following:

$$\overline{MIN}(x,y) = \begin{cases} \bar{x} & (x \geq y) \\ \bar{y} & (x < y) \end{cases} \qquad (17)$$

Figure 50:
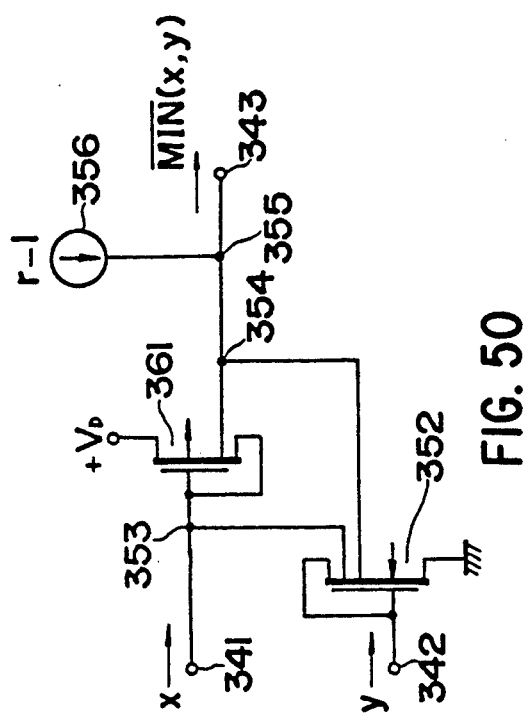

An embodiment of a $\overline{MIN}$ circuit is illustrated in FIG. 50.

This $\overline{MIN}$ circuit closely resembles the $\overline{MAX}$ circuit of FIG. 48. Specifically, the $\overline{MIN}$ circuit is realized by substituting a current mirror 361 comprising a P-MOSFET for the current mirror 351 (FIG. 48) comprising the N-MOSFET. Whereas the current mirror 351 acts as a diode for blocking an out-flow input current, the current mirror 361 acts as a diode for blocking an in-flow input current.

Accordingly, when $x \geq y$ holds, a current which attempts to flow into the current mirror 361 from the node 353 is bloced by the current mirror 361, so that the output of the current mirror 361 at this time is 0. A current representative of value y from the second output drain of the current mirror 352 is applied as an out-flow input to the node 355 via the node 354. The operation $(r-1)-y=\bar{y}$ is performed at the node 355, and a current of value $\bar{y}$ flows out of the output terminal 343.

When $x<y$ holds, the out-flow input current of current mirror 361 becomes $x-y$ and a current equivalent to this value flows out of the current mirror 361. Consequently, the operation $[(r-1)+(y-x)-y]=(r-1-x)=\bar{x}$ is performed at the nodes 354, 355 and a current of value flows out of the output terminal 343.

(17.4) MIN circuit

A multivalued logic function MIN is defined by the following:

$$MIN(x,y) = \begin{cases} x & (x \geq y) \\ y & (x < y) \end{cases} \qquad (18)$$

Figure 51:
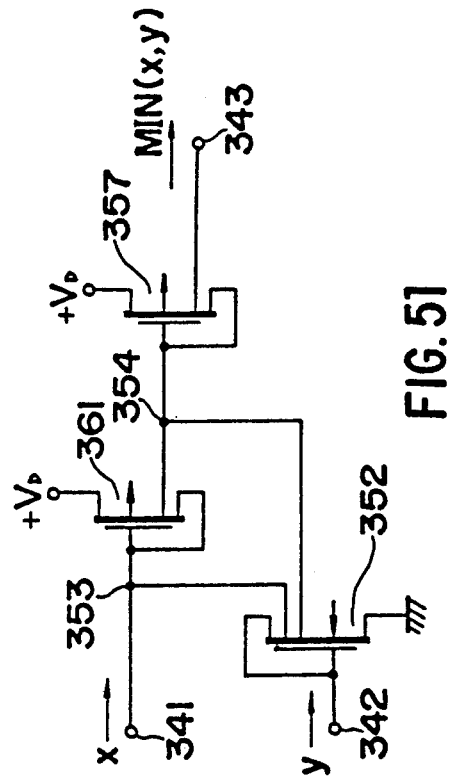

An embodiment of a MIN circuit is illustrated in FIG. 51.

The circuit of FIG. 51 is obtained by substituting the current mirror 357 in the MAX circuit of FIG. 49 for the node 355 and the current source 356 in the $\overline{MIN}$ circuit of FIG. 50. It will readily be understood from the description of the operation of the aforementioned MIN and MAX circuits that the circuit of FIG. 51 performs the operation $\overline{MIN}(x,y)$ expressed by (18) above.

Figure 52:
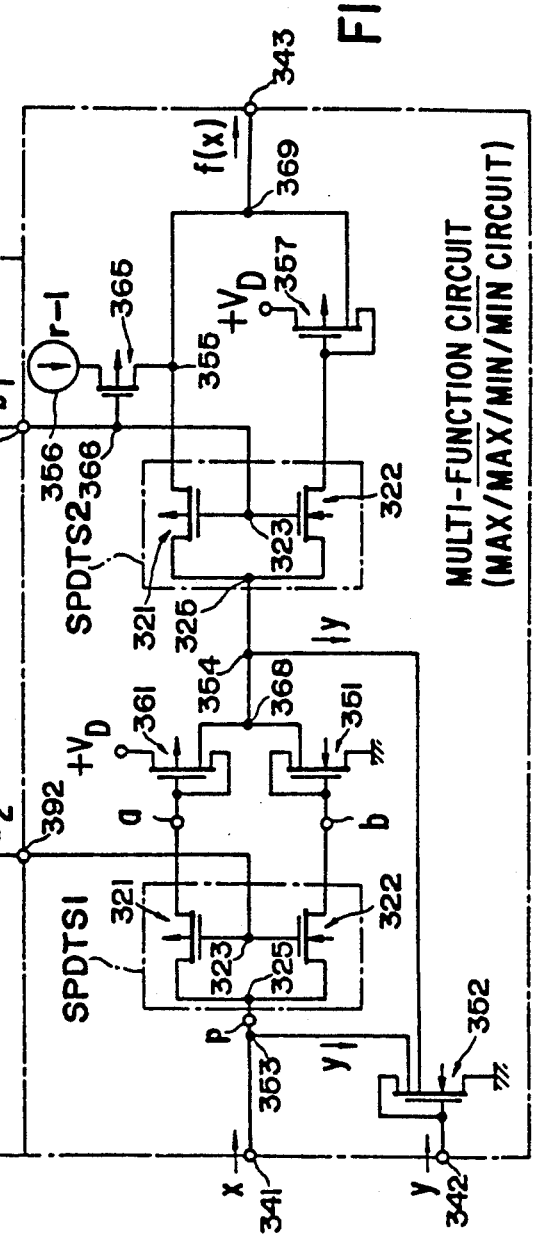
FIG. 52 is a circuit diagram illustrating an embodiment in which a decoder is applied to a multi-function circuit.

(18) Examples of decoder applications to multivalued logic multi-function circuits FIG. 52 illustrates a multivalued logic multi-function circuit and a decoder applied thereto. The multi-function circuit is a MAX/$\overline{MAX}$/MIN/$\overline{MIN}$ circuit, in which the four functions are selected by a signal decoded by a decoder. This multi-function circuit also represents an application of the above-described SPDTS.

As set forth above, the $\overline{MAX}$ circuit (FIG. 48) and $\overline{MIN}$ circuit (FIG. 50) differ only in the current mirrors 351 and 361 and are identical in terms of the other constituent elements. Likewise, the only difference between the MAX circuit (FIG. 49) and MIN circuit (FIG. 51) is the current mirrors 351 and 361. Furthermore, the difference between the $\overline{MAX}$ circuit and the MAX circuit is the current source 356 and node 355 in the former and the current mirror 357 in the latter. The $\overline{MIN}$ circuit and MIN circuit differ from each other in the same way.

The multi-function circuit illustrated in FIG. 52 shares the constituent elements common to these four circuits and effects a changeover to different constituent elements by SPDT switches. Portions the same as those shown in FIGS. 48 through 51 are designated by like reference characters.

A first SPDT switch, which will be designated SPDTS$_1$, is connected between the output side of the node 353 (corresponding to terminal p) and the input sides of the two current mirrors 351, 361 (corresponding to terminals a, b). The SPDTS$_1$ is the same as the SPDTS illustrated in FIGS. 41 and 42. A decoded voltage signal b$_2$ is applied to the node 323 of the SPDTS$_1$. The output sides of the current mirrors 351, 361 are led out to the node 354 via a node 368.

A second SPDT switch, which will be designated SPDTS$_2$, is connected between the output side of the node 354 and the node 355 and input side of current mirror 357. The output sides of the node 355 and current mirror 357 are led out to the output terminal 343 via a node 369. A decoded voltage signal b$_1$ is applied to the node 323 of the SPDTS$_2$.

The current source 356 is applied to the node 355 via a FET 365. The gate of the FET 365 is supplied by the node 366 with a voltage the same as that at the node 323. The FET 365 is controlled to turn on and off at the same time as the FET 321.

When the signals b$_2$, b$_1$ are both at the H level, the FETs 321 of both SPDTS$_1$ and SPDTS$_2$ turn off and the FETs 322 thereof turn on, so that the current mirrors 351, 357 are selected. As a result, the multi-function circuit operates as a MAX circuit and the output terminal 343 outputs a current representing the results of the operation MAX as an output current f(x).

When the signals b$_2$, b$_1$ are both at the L level, the FETs 321 of both SPDTS$_1$ and SPDTS$_2$ turn on and the FETs 322 thereof turn off, at which time the FET 365 turns on. Accordingly, the current mirror 361, node 355 and current source 356 are selected, so that the operation $\overline{\text{MIN}}$ is performed.

In a case where signal b$_2$ is at the H level and signal b$_1$ is at the L level, the current mirror 351, node 355 and current source 356 are selected and the multi-function circuit operates as a $\overline{\text{MAX}}$ circuit. If signal b$_2$ is at the L level and signal b$_1$ is at the H level, the current mirrors 361 and 357 are selected and operation MIN is performed.

Figure 53:
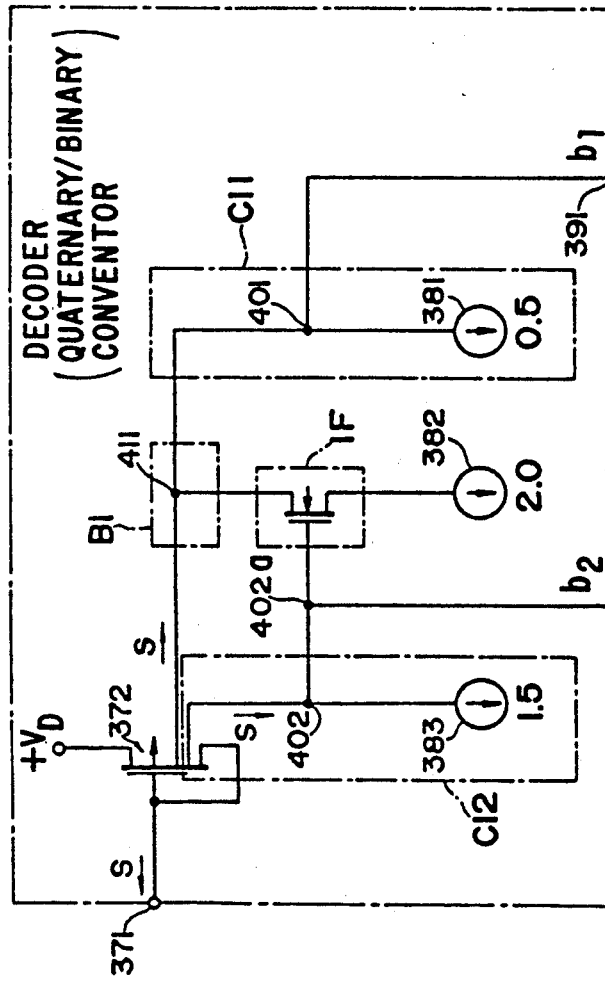
FIG. 53 is a view illustrating decoder function and function selected by a decoded signal.

The relationship between the levels of signals b$_2$, b$_1$ and the selected function is illustrated in FIG. 53, which also shows the level of the select signal S applied to the decoder. The select signal S is the quaternary signal S depicted in FIG. 44, and the decoder shown in FIG. 52 is exactly the same as that shown in FIG. 44.

Thus, any one of the functions MAX, $\overline{\text{MAX}}$, MIN, $\overline{\text{MIN}}$ is selected by the binary signals b$_2$, b$_1$, which have been decoded by the decoder, in dependence upon the logic value of the quaternary signal S.

(19) Switched current mirrors

Figure 54A:
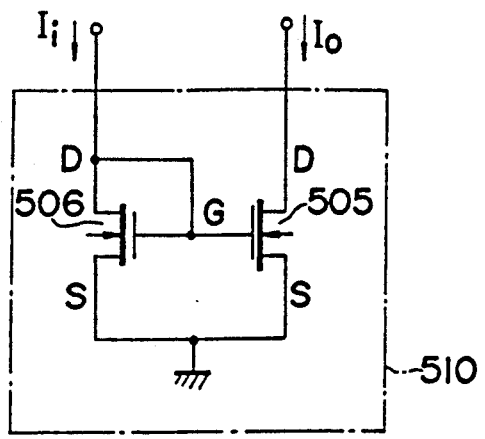
FIG. 54 is a circuit diagram showing a current mirror.
Figure 54B:
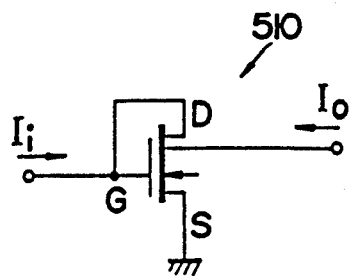

FIG. 54(A) illustrates the specific construction of a current mirror 510 comprising two N-MOSFETs 505, 506, and FIG. 54(B) depicts the symbol of a current mirror 510 equivalent to that shown in (A).

In FIG. 54(A), the sources S of the two FETs 505, 506 are grounded, their gates G are connected to each other and to the drain D of the FET 506. When the drain D of the other FET 506 is provided with an in-flow input current I$_i$, an in-flow output current I$_0$ (I$_i$=I$_0$) is obtained from the drain D of the other FET 05. The reason for this is that a gate voltage (a voltage across the gate and source) is applied in such a manner that the drain current of the FET 506 becomes equivalent to the current I$_i$, and the gate voltage also acts upon the other FET 505 to also render the drain current of this FET equivalent to the current I$_i$. Note that this will hold on the condition that the two FETs 506, 507 are of the same structure and have the same physical properties at the Si-SiO$_2$ interface. No current flows in the short circuit between the gate G and the drain of FET 506. The fact that an output current I$_0$ equivalent to the input current I$_i$ is obtained regardless of the magnitude of the input current if the two FETs are identical in terms of structure and in terms of the physical properties of the Si-SiO$_2$ interface is a major feature of a current mirror which uses FETs. With a current mirror that relies upon a bipolar element such as an ordinary junction transistor, the relation I$_i$=I$_0$ holds only when the current amplification factor $\beta$ is very large. When the input current I$_i$ becomes small, the current amplification factor $\beta$ also diminishes so that the foregoing equality no longer holds.

Such a current mirror can be fabricated by the integration of two FETS on a single substrate.

FIG. 55 illustrates several forms of switched current mirror having a switch or switches connected thereto. Though a switch 507 is indicated by the symbol of a contact switch, a contactless switch such as a FET is employed in actual practice.

Figure 55A:
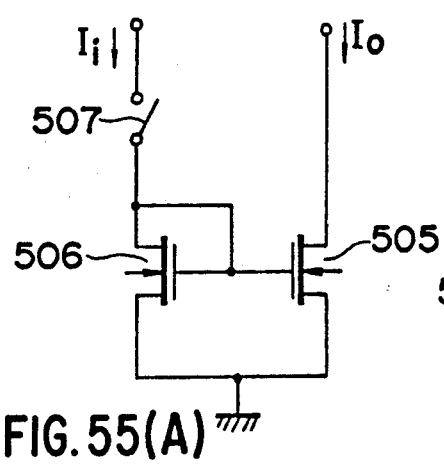
FIGS. 55(A) through 55(D) are circuit diagrams showing several forms of switched current mirror.

FIG. 55(A) illustrates a form in which the switch 507 is connected between an input terminal to which the input current I$_i$ is applied and the gate of the FET 506. If the switch 507 is in the on state, the input current I$_i$ flows into the drain of the FET 506, so that the output current I$_0$ is equal to the input current I$_i$. If the switch 507 is in the off state, the input current I$_i$ does not flow into the FET 506, so that the output current I$_0$ is 0. The switch 507 is a floating switch because it floats free of ground.

Figure 55B:
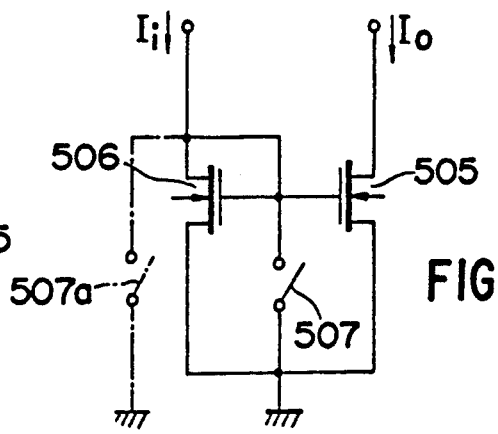

FIG. 55(B) illustrates a form in which a grounded switch, namely a switch having one terminal connected to ground (or to a power supply), is used as the switch 507. The latter is connected between ground and the gates of the FETs 506, 505. If the switch 507 is in the off state, the current mirror operates in the usual manner, namely such that the output current I$_0$ becomes equivalent to the input current I$_i$. When the switch 507 turns on, both of the FETs 506, 505 turn off and the input current I$_i$ flows to ground through the switch 507, whereby the output current I$_0$ becomes 0. It goes without saying that the same results will be obtained if the grounded switch is connected between the drain of the FET 506 and ground.

Figure 55C:
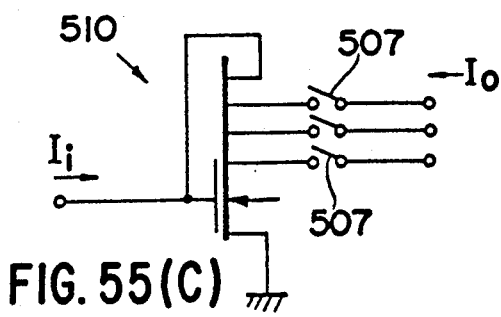

FIG. 55(C) depicts a multi-output current mirror. A multi-output current mirror has its gate and source tied together and is provided with three or more drains. One drain is short circuited to the gate and all of the remaining drains are connected to respective output terminals to produce output signals. The switch 507 of floating type is connected between each of these output drains and its corresponding output terminal. The equality I$_0$=I$_i$ holds when the switch 507 is in the on state, with the output current I$_0$ becoming 0 when the switch 507 turns off.

The advantage of thus connecting the switch 507 to each output drain of this multi-output current mirror is that a plurality of the output currents I$_0$ can be controlled individually. In a case where a plurality of the output currents I$_0$ are desired to be controlled simultaneously, on the other hand, it will suffice to utilize the switch connection configurations of FIGS. 55(A) and (B).

Figure 55D:
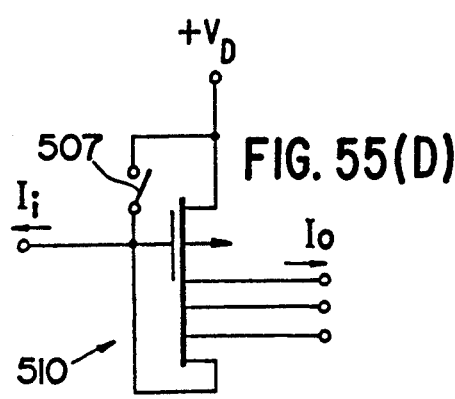

All of the above-described current mirrors comprise N-MOSFETs. FIG. 55(D) shows a multi-output current mirror comprising a P-MOSFET. The switch 507 of grounded type is connected between the gate and source of the P-MOSFET. When the switch 507 is in the off state, the multi-output current mirror operates in the usual manner; when the switch 507 turns on, all output current $I_0$ of the current mirror become 0.

An example of one application of such a switched current mirror, namely a quantizer/bilateral T-gate, will now be described.

(20) Quantizer/bilateral T-gate

A quantizer/bilateral T-gate is a circuit possessing the functions of both the aforementioned quantizer (FIG. 8) and bilateral T-gate (FIG. 34) and is realized by coupling these two circuits together through use of the above-described switched current mirror and SPDT switches.

Figure 56:
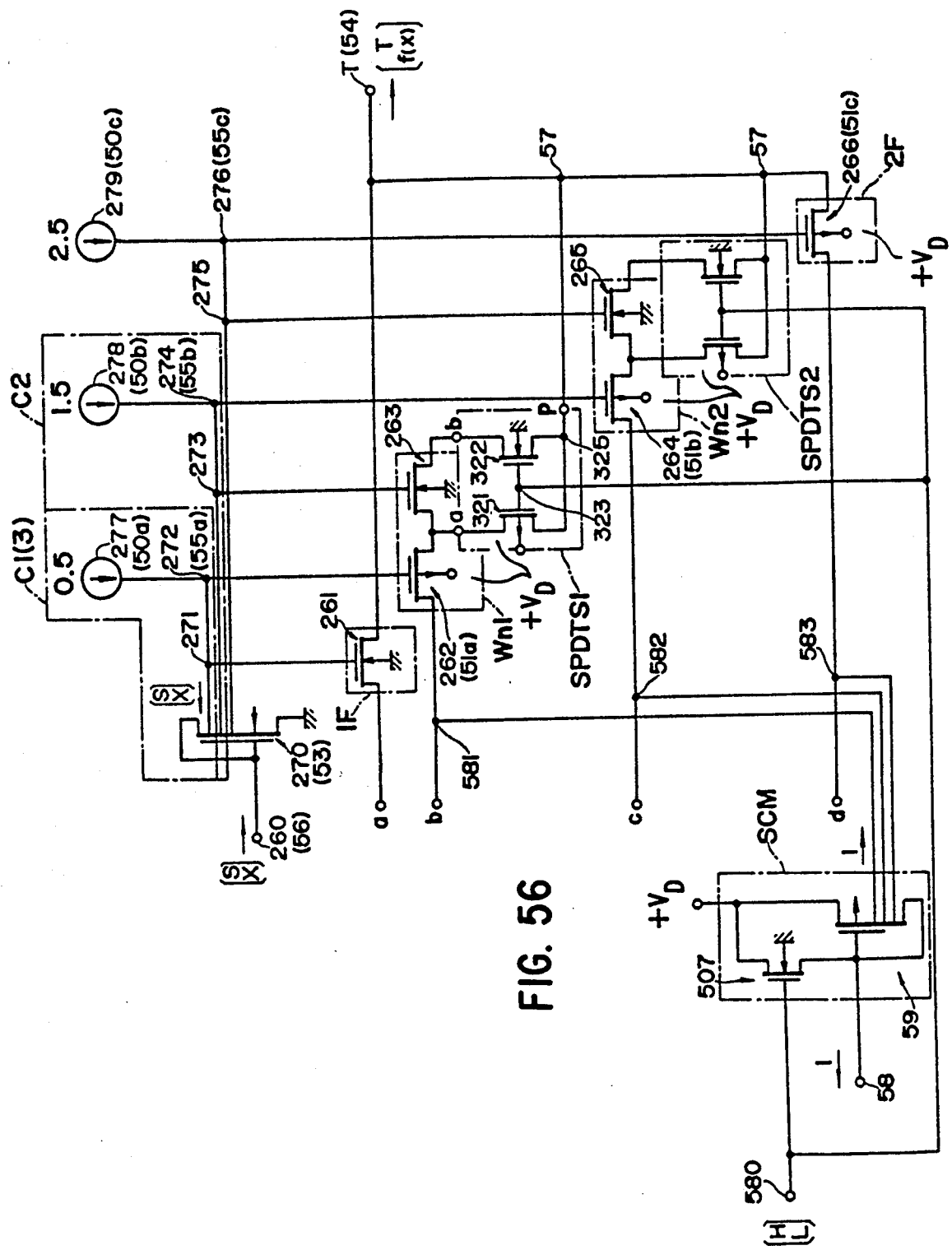
FIG. 56 is a circuit diagram illustrating an embodiment of a quantizer/bilateral T-gate.

An embodiment of a quantizer/bilateral T-gate is illustrated in FIG. 56, in which portions identical with the constituent elements of the circuit shown in FIG. 34 are designated by like reference characters. Further, portions identical with the constituent components that appear in FIG. 8 as well as in FIG. 34 are designated by like reference characters enclosed in parentheses. Portions the same as those that appear solely in FIG. 8, such as the node 57, are designated by like reference characters without parentheses. The select current S (bilateral T-gate) or the input current x (quantizer) is applied to the input terminal 260 [or (56)] and, correspondingly, the output of the T-gate or the output f(x) of the quantizer appears at the output terminal T [or (54)]. Whether the circuit functions as the bilateral T-gate or the quantizer is decided by a control voltage signal applied to a control input terminal 508. The circuit of FIG. 56 functions as the bilateral T-gate if the control signal is at the high (H) level and as the quantizer if the control signal is at the low (L) level.

The switch 507 comprising the N-MOSFET is connected between the gate and source of the three-output current mirror 59, with these elements constructing a switched current mirror (hereafter referred to as an "SCM") [see FIG. 55(D)]. The switch 507 is controlled by the control voltage signal applied to the terminal 508. The three output drains of the three-output current mirror are connected to terminals b, c, d by nodes 581, 582, 583, respectively.

The control signal at the control input terminal 580 is used to control two SPDT switches, here indicated at SPDTS$_1$ and SPDTS$_2$. The SPDTS$_1$ is for selectively connecting the output sides of the switches 262, 263, which constitute the first window-ON switch W$_{n1}$, to the node 57 [or output terminal T or (54)]. Likewise, the SPDTS$_2$ acts to changeover the connection between the node 57 and the output side of switch 264 or 265 in the second window-ON switch W$_{n2}$.

If the circuit is to function as the bilateral T-gate, the select current S is applied to the input terminal 260 and an H-level voltage is impressed upon the control terminal 580. Accordingly, the switch 507 of the SCM turns on and the output current of the current mirror 59 becomes 0. The nodes 581 through 583 have no influence whatsoever on the terminals b through c. Further, since the switches 321, 322 of the SPDTS$_1$ turn off and on, respectively, the output side of the switch 263 is connected to the output terminal T. Thus, the arrangement becomes one in which the first window-ON switch W$_{n1}$ is connected between the terminals b and T. Likewise, the second window-ON switch W$_n$ is connected between the terminals c and T by the SPDTS$_2$. The bilateral T-gate is thus formed, with one of the terminals a through d being connected to the terminal T, this being decided by the value of the select current S.

If the circuit is to function as the quantizer, the terminals a through d are opened, a current of value x is applied to the input terminal 260, and an L-level control signal is applied to the control terminal 580. Accordingly, the switch 507 of the SCM turns off and the three-output current mirror 59 operates in the normal manner. As a result, a current of value 1 flows out of each output drain of the current mirror and into each of the nodes 581 through 583. Further, since the switches 321, 322 of the SPDTS$_1$ turn on and off, respectively, the switch 262 is connected to the node 57. Thus, the arrangement becomes one in which the switch 262 is cut off from the circuit, so that the first window-ON switch W$_{n1}$ merely acts as a single floating switch. This floating switch corresponds to the switch 51a in FIG. 8. At the same time, the switch 265 is cut off from the circuit by the SPDTS$_2$, so that the arrangement becomes one in which only the switch 264 is connected between the node 582 and node 57.

Thus, the quantizer is formed so that a current having a value obtained by quantizing the input current x is delivered from the output terminal T [i.e., (54)].

As many apparently widely different embodiments of the present invention can be made without departing from the spirit and scope thereof, it is to be understood that the invention is not limited to the specific embodiments thereof except as defined in the appended claims.

What is claimed is:

1. A successor comprising:
   a first source means for providing a current representing a logical value 1;
   a second source means for providing an input current representing a variable x;
   a third source means for providing a current representing a value equivalent to r−1, which is obtained by subtracting logical value 1 from a radix r;
   an adder, connected to said first source means and said second source means, for adding said current representing a logical value 1 to said input current representing a variable x to provide an output current representing a value x+1;
   a floating switch comprising a MOSFET connected to an output side of said adder to receive said output current representing a value x+1; and
   a comparator, connected to said second source means and said third source means, which compares said input current representing the variable x and said current representing a value equivalent to r−1, which is obtained by subtracting the logical value 1 from a radix r, for generating a control signal which is provided to said floating switch to turn on said floating switch when said input current representing the variable x is smaller than said current representing a value equivalent to r−1.

2. The successor according to claim 1, wherein the current representing the value equivalent to r−1 contains a noise margin.

* * * * *